(12) United States Patent
Nakamoto et al.

(10) Patent No.: US 12,126,927 B2
(45) Date of Patent: Oct. 22, 2024

(54) IMAGING DEVICE AND ELECTRONIC DEVICE

(71) Applicant: SONY SEMICONDUCTOR SOLUTIONS CORPORATION, Kanagawa (JP)

(72) Inventors: Eiichi Nakamoto, Kanagawa (JP); Daisuke Nakagawa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 18/002,444

(22) PCT Filed: Jun. 17, 2021

(86) PCT No.: PCT/JP2021/022996
§ 371 (c)(1),
(2) Date: Dec. 19, 2022

(87) PCT Pub. No.: WO2021/261367
PCT Pub. Date: Dec. 30, 2021

(65) Prior Publication Data
US 2023/0247328 A1 Aug. 3, 2023

(30) Foreign Application Priority Data

Jun. 25, 2020 (JP) .................................. 2020-109367
Mar. 11, 2021 (JP) .................................. 2021-039087

(51) Int. Cl.
| | |
|---|---|
| H04N 25/772 | (2023.01) |
| H03M 1/38 | (2006.01) |
| H04N 25/709 | (2023.01) |
| H04N 25/778 | (2023.01) |

(52) U.S. Cl.
CPC ............ *H04N 25/772* (2023.01); *H03M 1/38* (2013.01); *H04N 25/709* (2023.01); *H04N 25/778* (2023.01)

(58) Field of Classification Search
None
See application file for complete search history.

(56) References Cited

FOREIGN PATENT DOCUMENTS

| | | |
|---|---|---|
| JP | 2008-206971 A | 9/2008 |
| JP | 2019-012933 A | 1/2019 |
| JP | 2019-092143 A | 6/2019 |

OTHER PUBLICATIONS

International Search Report and Written Opinion of PCT Application No. PCT/JP2021/022996, issued on Aug. 10, 2021, 08 pages of ISRWO.

*Primary Examiner* — Mark T Monk
(74) *Attorney, Agent, or Firm* — CHIP LAW GROUP

(57) ABSTRACT

There is provided a column signal processing system including a successive approximation register analog-to-digital converter and an imaging device. The imaging device includes a pixel array unit including a plurality of pixels each including a photoelectric conversion element, a column amplifier unit that obtains a difference between a reset component and a signal component input from each pixel of the pixel array unit via a signal line, and outputs the difference as a pixel signal, a capacitance unit that holds the pixel signal input from the column amplifier unit, and a successive approximation register analog-to-digital conversion unit that converts an analog pixel signal input from the capacitance unit into a digital signal, in which the capacitance unit differentiates a single-phase pixel signal input from the column amplifier unit using a reference voltage that defines a zero voltage of the pixel signal.

20 Claims, 35 Drawing Sheets

IMAGING DEVICE AND ELECTRONIC DEVICE

CROSS REFERENCE TO RELATED APPLICATIONS

This application is a U.S. National Phase of International Patent Application No. PCT/JP2021/022996 filed on Jun. 17, 2021, which claims priority benefit of Japanese Patent Application No. JP 2020-109367 filed in the Japan Patent Office on Jun. 25, 2020, which claims priority benefit of Japanese Patent Application No. JP 2021-039087 filed in the Japan Patent Office on Mar. 11, 2021. Each of the above-referenced applications is hereby incorporated herein by reference in its entirety.

TECHNICAL FIELD

The present disclosure relates to an imaging device and an electronic device.

BACKGROUND ART

An analog-to-digital converter that converts an analog signal (pixel signal) output from a pixel into a digital signal is mounted on an imaging device, and a successive approximation register (SAR) analog-to-digital converter is used as the analog-to-digital converter (refer to, for example, Patent Document 1).

CITATION LIST

Patent Document

Patent Document 1: Japanese Patent Application Laid-Open No. 2019-092143

SUMMARY OF THE INVENTION

Problems to be Solved by the Invention

A successive approximation register analog-to-digital converter is excellent in that an operation at higher speed and with lower power consumption as compared with that of a so-called single-slope analog-to-digital converter is possible. A column signal processing system including this successive approximation register analog-to-digital converter is desired to operate at further higher speed and with further lower power consumption.

Therefore, an object of the present disclosure is to provide an imaging device capable of operating at further higher speed and with further lower power and an electronic device including the imaging device regarding the column signal processing system including the successive approximation register analog-to-digital converter.

Solutions to Problems

According to the present disclosure, provided is an imaging device provided with:
  a pixel array unit including a plurality of pixels each including a photoelectric conversion element;
  a column amplifier unit that obtains a difference between a reset component and a signal component input from each pixel of the pixel array unit via a signal line, and outputs the difference as a pixel signal;
  a capacitance unit that holds the pixel signal input from the column amplifier unit; and
  a successive approximation register analog-to-digital conversion unit that converts an analog pixel signal input from the capacitance unit into a digital signal, in which
  the capacitance unit differentiates a single-phase pixel signal input from the column amplifier unit using a reference voltage that defines a zero voltage of the pixel signal.

The column amplifier unit may include:
an amplifier to a non-inverting input terminal of which a potential of the signal line is input;
a first switch one end of which is connected to an output terminal of the amplifier and another end of which is connected to an inverting input terminal of the amplifier;
a second switch one end of which is connected to the output terminal of the amplifier;
a first capacitance element one end of which is connected to another end of the second switch and another end of which is connected to the another end of the first switch and the inverting input terminal of the amplifier;
a second capacitance element connected between the another end of the first capacitance element and the inverting input terminal of the amplifier, and a reference potential node; and
a third switch one end of which is connected to the another end of the second switch and one end of the first capacitance element, the third switch to another end of which the reference voltage is applied.

The column amplifier unit
may put the first switch into a closed state and charge the first capacitance element and the second capacitance element with the reset component when the reset component is input, and put the third switch into a closed state and apply the reference voltage to the another end of the second switch and the one end of the first capacitance element,
then, put the first switch and the third switch into an opened state and put the second switch into a closed state, and form a non-inverting amplification circuit using the first capacitance element, the second capacitance element, and the amplifier, and
feed back so that a voltage of a common connection node of the first capacitance element and the second capacitance element becomes a same voltage as the signal component when the signal component is input.

The Capacitance Unit
may have a configuration of a differential circuit including a positive-side capacitance element charged with the pixel signal input from the column amplifier unit, and a negative-side capacitance element charged with the reference voltage, and
include a fourth switch that selectively short-circuits input ends of the positive-side capacitance element and the negative-side capacitance element.

The fourth switch may short-circuit the input ends of the positive-side capacitance element and the negative-side capacitance element when the pixel signal with which the positive-side capacitance element is charged and the reference voltage with which the negative-side capacitance element is charged are transmitted to the successive approximation register analog-to-digital conversion unit.

The capacitance unit may hold the pixel signal input from the column amplifier unit by sampling by a switched capacitor.

It is possible to multiplex and process each potential of a plurality of signal lines via a plurality of column amplifiers and capacitance units corresponding to the plurality of signal lines for one successive approximation register analog-to-digital converter of the successive approximation register analog-to-digital conversion unit.

The capacitance unit may be provided with:
- a first node to which the pixel signal input from the column amplifier unit is supplied;
- a second node to which the reference voltage is supplied;
- a positive-side capacitance element and a negative-side capacitance element connected in series between the first node and the second node;
- a fourth switch that selectively short-circuits the first node and the second node;
- a fifth switch that selectively applies a common mode reference voltage of the successive approximation register analog-to-digital conversion unit to a common connection node of the positive-side capacitance element and the negative-side capacitance element;
- a sixth switch that selectively connects the second node and a first input end of the successive approximation register analog-to-digital conversion unit; and
- a seventh switch that selectively connects the first node and a second input end of the successive approximation register analog-to-digital conversion unit.

The fourth switch may be temporarily put into a closed state immediately before the capacitance unit starts holding the pixel signal, and short-circuit input ends of the positive-side capacitance element and the negative-side capacitance element, and
- the fifth switch may be temporarily put into a closed state immediately before the capacitance unit starts holding the pixel signal and in a period in which the pixel signal held by the capacitance unit is transferred to the successive approximation register analog-to-digital conversion unit, and apply the common mode reference voltage of the successive approximation register analog-to-digital conversion unit to the common connection node of the positive-side capacitance element and the negative-side capacitance element.

The capacitance unit may be provided with:
- a first node to which the pixel signal input from the column amplifier unit is supplied;
- a second node to which the reference voltage is supplied;
- a positive-side capacitance element and a negative-side capacitance element connectable in series between the first node and the second node;
- a 4a switch and a 4b switch connected in series between the first node and the second node;
- a 5a switch, the positive-side capacitance element, the negative-side capacitance element, and a 5b switch connected in series between the first node and the second node;
- a 5c switch that selectively applies a common mode reference voltage of the successive approximation register analog-to-digital conversion unit to a common connection node of the positive-side capacitance element and the negative-side capacitance element;
- a sixth switch that selectively connects the second node and a first input end of the successive approximation register analog-to-digital conversion unit; and
- a seventh switch that selectively connects the first node and a second input end of the successive approximation register analog-to-digital conversion unit.

The 4a switch and the 4b switch may be temporarily put into a closed state immediately before the capacitance unit starts holding the pixel signal and immediately before the pixel signal held by the capacitance unit is transferred to the successive approximation register analog-to-digital conversion unit, and apply the common mode reference voltage of the successive approximation register analog-to-digital conversion unit to the first node and the second node,
- the 5a switch and the 5b switch may be temporarily put into an opened state immediately before the pixel signal held by the capacitance unit is transferred to the successive approximation register analog-to-digital conversion unit, and block the connection between the first node and the positive-side capacitance element and block the connection between the second node and the negative-side capacitance element, and
- the 5c switch may be temporarily put into a closed state immediately before the capacitance unit starts holding the pixel signal and in a period in which the pixel signal held by the capacitance unit is transferred to the successive approximation register analog-to-digital conversion unit, and apply the common mode reference voltage of the successive approximation register analog-to-digital conversion unit to the common connection node of the positive-side capacitance element and the negative-side capacitance element.

The capacitance unit may be provided with:
- a first node to which the pixel signal input from the column amplifier unit is supplied;
- a second node to which the reference voltage is supplied;
- a 4a switch and a 4b switch connected in series between the first node and the second node;
- a positive-side capacitance element, a 5a switch, a 5b switch, and a negative-side capacitance element connected in series between the first node and the second node;
- a 5c switch that selectively applies a common mode reference voltage of the successive approximation register analog-to-digital conversion unit to a common connection node of the 5a switch and the 5b switch;
- a sixth switch that selectively connects the second node and a first input end of the successive approximation register analog-to-digital conversion unit; and
- a seventh switch that selectively connects the first node and a second input end of the successive approximation register analog-to-digital conversion unit.

The 4a switch and the 4b switch may be temporarily put into a closed state immediately before the capacitance unit starts holding the pixel signal and immediately before the pixel signal held by the capacitance unit is transferred to the successive approximation register analog-to-digital conversion unit, and apply the common mode reference voltage of the successive approximation register analog-to-digital conversion unit to the first node and the second node,
- the 5c switch may be temporarily put into a closed state immediately before the capacitance unit starts holding the pixel signal and in a period in which the pixel signal held by the capacitance unit is transferred to the successive approximation register analog-to-digital conversion unit, and apply the common mode reference voltage of the successive approximation register analog-to-digital conversion unit to a common connection node of the positive-side capacitance element and the negative-side capacitance element, and
- the 5a switch and the 5b switch may be temporarily put into an opened state immediately before the pixel signal held by the capacitance unit is transferred to the successive approximation register analog-to-digital conversion unit, and block the connection between the positive-side capacitance element and the negative-side capacitance element.

The capacitance unit may be provided with:
a first node to which the pixel signal input from the column amplifier unit is supplied;
a second node to which the reference voltage is supplied;
a positive-side capacitance element one end of which is connected to the first node;
a third node to which another end of the positive-side capacitance element is connected;
a negative-side capacitance element one end of which is connected to the second node;
a fourth node to which another end of the negative-side capacitance element is connected;
a 4a switch and a 4b switch connected in series between the first node and the second node;
a 4c switch connected between the first node and the second node;
a 5a switch connected between the third node and the fourth node;
a 5b switch and a 5c switch connected in series between the third node and the fourth node;
a sixth switch that selectively connects the third node and a first input end of the successive approximation register analog-to-digital conversion unit; and
a seventh switch that selectively connects the fourth node and a second input end of the successive approximation register analog-to-digital conversion unit.

The 4a switch and the 4b switch may be temporarily put into a closed state in a period in which the pixel signal held by the capacitance unit is transferred to the successive approximation register analog-to-digital conversion unit, and apply a common mode reference voltage of the successive approximation register analog-to-digital conversion unit to the first node and the second node,
the 4c switch may be put into a closed state immediately before the capacitance unit starts holding the pixel signal, and short-circuit the first node and the second node,
the 5a switch may short-circuit the third node and the fourth node in a period in which the capacitance unit holds the pixel signal, and
the 5b switch and the 5c switch may be put into a closed state immediately before the capacitance unit starts holding the pixel signal, and apply the reference voltage to the third node and the fourth node.

The capacitance unit may be provided with:
a first node to which the pixel signal input from the column amplifier unit is supplied;
a second node to which the reference voltage is supplied;
a positive-side capacitance element one end of which is connected to the first node;
a third node to which another end of the positive-side capacitance element is connected;
a negative-side capacitance element one end of which is connected to the second node;
a fourth node to which another end of the negative-side capacitance element is connected;
a fourth switch connected between the first node and the second node;
a 5a switch and a 5b switch connected in series between the third node and the fourth node;
a 5c switch that selectively applies a common mode reference voltage of the successive approximation register analog-to-digital conversion unit to a common connection node of the 5a switch and the 5b switch;
a sixth switch that selectively connects the third node and a first input end of the successive approximation register analog-to-digital conversion unit; and
a seventh switch that selectively connects the fourth node and a second input end of the successive approximation register analog-to-digital conversion unit.

The fourth switch may be put into a closed state immediately before the capacitance unit starts holding the pixel signal and in a period in which the pixel signal held by the capacitance unit is transferred to the successive approximation register analog-to-digital conversion unit, and short-circuit the first node and the second node,
the 5a switch and the 5b switch may be put into a closed state immediately before a period in which the capacitance unit holds the pixel signal until the holding period ends, and short-circuit the third node and the fourth node; and
the 5c switch may be put into a closed state immediately before the capacitance unit starts holding the pixel signal, and selectively apply the common mode reference voltage of the successive approximation register analog-to-digital conversion unit to the common connection node of the 5a switch and the 5b switch.

The capacitance unit may be provided with:
a first node to which the pixel signal input from the column amplifier unit is supplied;
a second node to which the reference voltage is supplied;
a positive-side capacitance element one end of which is connected to the first node;
a third node to which another end of the positive-side capacitance element is connected;
a negative-side capacitance element one end of which is connected to the second node;
a fourth node to which another end of the negative-side capacitance element is connected;
a 4a switch and a 4b switch connected in series between the first node and the second node;
a 4c switch that selectively applies the reference voltage to a common connection node of the 4a switch and the 4b switch;
a 5a switch and a 5b switch connected in series between the third node and the fourth node;
a 5c switch that selectively applies a common mode reference voltage of the successive approximation register analog-to-digital conversion unit to a common connection node of the 5a switch and the 5b switch;
a sixth switch that selectively connects the third node and a first input end of the successive approximation register analog-to-digital conversion unit; and
a seventh switch that selectively connects the fourth node and a second input end of the successive approximation register analog-to-digital conversion unit.

The 4a switch and the 4b switch may be temporarily put into a closed state immediately before the capacitance unit starts holding the pixel signal, immediately before a period in which the pixel signal held by the capacitance unit is transferred to the successive approximation register analog-to-digital conversion unit, and the transferring period, and short-circuit the first node and the second node,
the 4c switch may be temporarily put into a closed state immediately before the capacitance unit starts holding the pixel signal and immediately before a period in which the pixel signal held by the capacitance unit is transferred to the successive approximation register analog-to-digital conversion unit, and apply the reference voltage to the common connection node of the 4a switch and the 4b switch, the 5a switch and the 5b switch may be temporarily put into a closed state immediately before the capacitance unit starts holding the pixel signal and in a period in which the capacitance unit holds the pixel signal, and short-circuit the third node and the fourth node, and the 5c switch may be temporarily put into a closed state immediately before the capacitance unit starts holding the pixel signal, and apply the common mode reference voltage of the successive approximation register analog-to-digital conversion unit to the common connection node of the 5a switch and the 5b switch.

According to the present disclosure, provided is an electronic device provided with:

an imaging device that outputs a photoelectrically converted digital signal; and a signal processing unit that performs signal processing on the basis of the digital signal, in which the imaging device is provided with:

a pixel array unit including a plurality of pixels each including a photoelectric conversion element;

a column amplifier unit that obtains a difference between a reset component and a signal component input from each pixel of the pixel array unit via a signal line, and outputs the difference as a pixel signal;

a capacitance unit that holds the pixel signal input from the column amplifier unit; and a successive approximation register analog-to-digital conversion unit that converts an analog signal input from the capacitance unit into a digital signal, and the capacitance unit differentiates a single-phase pixel signal input from the column amplifier unit using a reference voltage that defines a zero voltage of the pixel signal.

MODE FOR CARRYING OUT THE INVENTION

Figure 1:
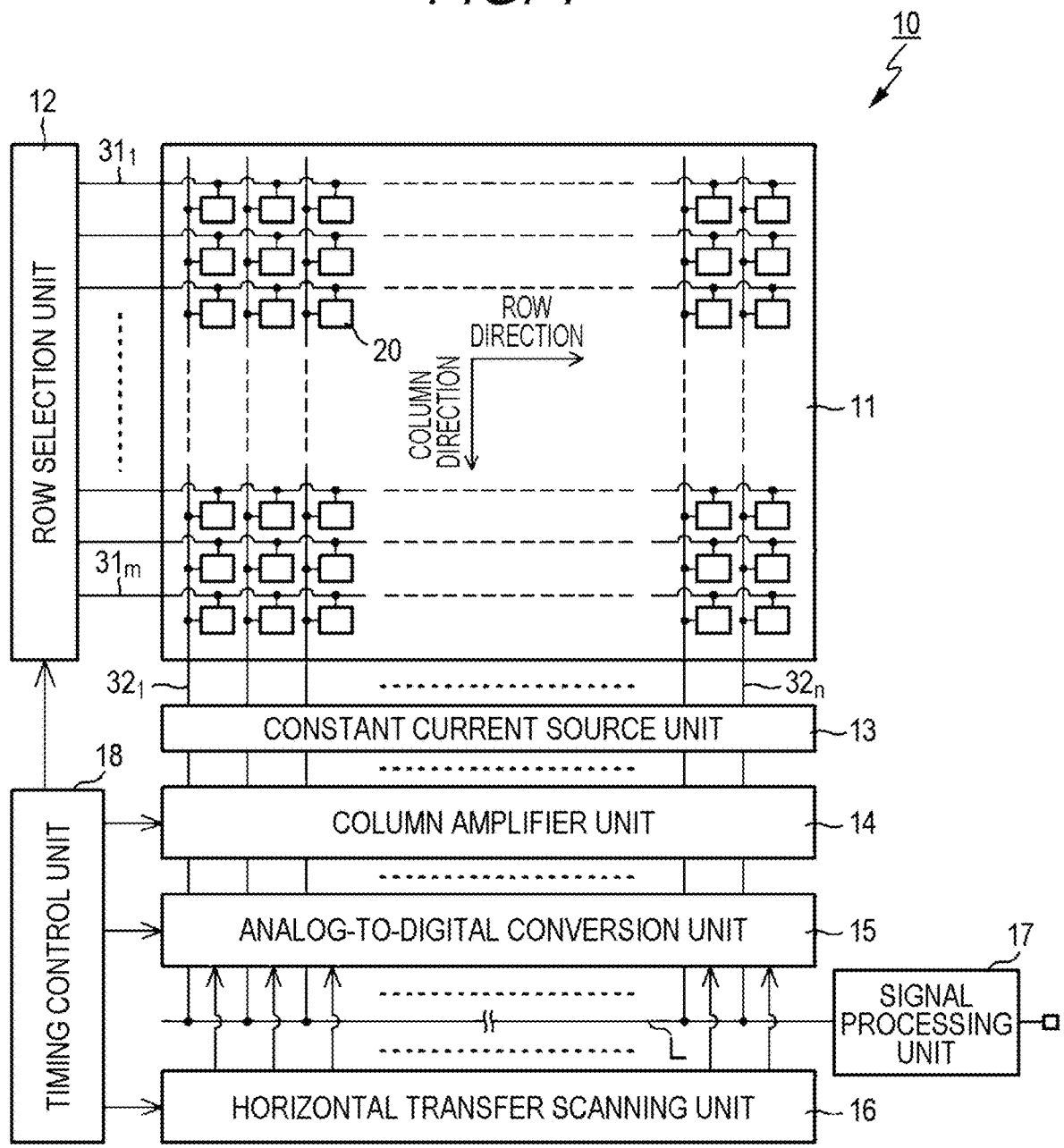
FIG. 1 is a block diagram illustrating an outline of a basic configuration of a CMOS image sensor, which is an example of an imaging device to which the technology according to the present disclosure is applied.

Hereinafter, a mode for carrying out the technology according to the present disclosure (hereinafter, referred to as an "embodiment") is described in detail with reference to the drawings. The technology according to the present disclosure is not limited to the embodiment, and various numerical values in the embodiment are examples. In the following description, the same reference sign is used for the same elements or elements having the same function, and the description is not repeated. Note that, the description is given in the following order.

1. Description regarding Imaging Device and Electronic Device of Present Disclosure in General
2. Imaging Device to Which Technology according to Present Disclosure Is Applied
2-1. Configuration Example of CMOS Image Sensor
2-2. Circuit Configuration Example of Pixel
2-3. Semiconductor Chip Structure
2-3-1. Flat Semiconductor Chip Structure
2-3-2. Stacked Semiconductor Chip Structure
2-4. Regarding Single-Slope Analog-to-Digital Converter
3. First Embodiment of Present Disclosure (Example of CMOS Image Sensor)
3-1. First Embodiment (Example in Which Circuit Configuration of Capacitance Unit and after This Is Made Configuration of Differential Circuit)
3-1-1. Configuration Example of Column Amplifier
3-1-2. Configuration Example of Capacitance Multiplexer
3-1-3. Configuration Example of Successive Approximation Register Analog-to-Digital Converter
3-1-4. Circuit Operation of Column Signal Processing System
3-2. Example 2 (Implementation Example of Column Signal Processing System)
3-2-1. Power Supply Voltage and Used Transistor
3-2-2. Regarding Level Diagram
3-2-3. Regarding Timing
3-2-4. Configuration Example of Column Amplifier
3-2-5. Configuration Example of Successive Approximation Register Analog-to-Digital Converter
4. Second Embodiment of Present Disclosure (Example of Indirect TOF Distance Image Sensor)
4-1. System Configuration Example
4-2. Circuit Configuration Example of Pixel
5. Variation
6. Application Example
7. Application Example of Technology according to Present Disclosure
7-1. Electronic Device of Present Disclosure (Example of Imaging Device)
7-2. Application Example to Mobile Body
8. Configuration that Present Disclosure may Take <Description Regarding Imaging Device and Electronic Device of Present Disclosure in General>

In an imaging device and an electronic device of the present disclosure, a column amplifier unit may include an amplifier to a non-inverting input terminal of which a potential of a signal line is input, a first switch one end of which is connected to an output terminal of the amplifier and another end of which is connected to an inverting input terminal of the amplifier, a second switch one end of which is connected to the output terminal of the amplifier, a first capacitance element one end of which is connected to another end of the second switch and another end of which is connected to the another end of the first switch and the inverting input terminal of the amplifier, a second capacitance element connected between the another end of the first capacitance element and the inverting input terminal of the amplifier, and a reference potential node, and a third switch one end of which is connected to the another end of the second switch and one end of the first capacitance element, the third switch to another end of which the reference voltage is applied.

In the imaging device and the electronic device of the present disclosure including the preferred configuration described above, the column amplifier unit may put the first switch into a closed state and charge the first capacitance element and the second capacitance element with a reset component when the reset component is input, and put the third switch into a closed state and take in the reference voltage, then, put the first switch and the third switch into an opened state and put the second switch into a closed state, and form a non-inverting amplification circuit using the first capacitance element, the second capacitance element, and the amplifier, and feed back so that a voltage of a common connection node of the first capacitance element and the second capacitance element becomes a same voltage as a signal component when the signal component is input.

Furthermore, in the imaging device and the electronic device of the present disclosure including the preferred configuration described above, a capacitance unit may have a configuration of a differential circuit including a positive-side capacitance element charged with the pixel signal input from the column amplifier unit and a negative-side capacitance element charged with the reference voltage, and include an inter-differential short-circuit switch (fourth switch) that selectively short-circuits input ends of the positive-side capacitance element and the negative-side capacitance element.

Furthermore, in the imaging device and the electronic device of the present disclosure including the preferred configuration described above, the inter-differential short-circuit switch (fourth switch) may short-circuit the input ends of the positive-side capacitance element and the negative-side capacitance element when the pixel signal with which the positive-side capacitance element is charged and the reference voltage with which the negative-side capacitance element is charged are transmitted to the successive approximation register analog-to-digital conversion unit. Furthermore, the capacitance unit may hold the pixel signal input from the column amplifier unit by sampling by a switched capacitor.

Furthermore, in the imaging device and the electronic device of the present disclosure including the preferred configuration described above, it is possible to multiplex and process each potential of a plurality of signal lines via a plurality of column amplifiers and capacitance units corresponding to the plurality of signal lines for one successive approximation register analog-to-digital converter of the successive approximation register analog-to-digital conversion unit.

<Imaging Device to which Technology According to Present Disclosure is Applied>

First, a basic configuration of an imaging device to which the technology according to the present disclosure is applied is described. Here, a complementary metal oxide semiconductor (CMOS) image sensor, which is a type of an X-Y address system imaging device, is described as an example of the imaging device. The CMOS image sensor is an image sensor fabricated by applying or partially using a CMOS process.

[Configuration Example of CMOS Image Sensor]

FIG. 1 is a block diagram illustrating an outline of a basic configuration of the CMOS image sensor, which is an example of the imaging device to which the technology according to the present disclosure is applied.

A CMOS image sensor 10 according to this example includes a pixel array unit 11 and a peripheral circuit unit of the pixel array unit 11. The pixel array unit 11 is obtained by two-dimensionally arranging pixels (pixel circuits) 20 each including a photoelectric conversion element in a row direction and a column direction, that is, in a matrix. Here, the row direction refers to an array direction of the pixels 20 of a pixel row, and the column direction refers to an array direction of the pixels 20 of a pixel column. The pixel 20 performs photoelectric conversion to generate a photocharge according to an amount of received light to accumulate.

The peripheral circuit unit of the pixel array unit 11 includes, for example, a row selection unit 12, a constant current source unit 13, a column amplifier unit 14, an analog-to-digital conversion unit 15, a horizontal transfer scanning unit 16, a signal processing unit 17, a timing control unit 18 and the like.

In the pixel array unit 11, a pixel control line 31 ($31_1$ to $31_m$) is wired in the row direction for each pixel row for the matrix-shaped pixel array. Furthermore, a signal line 32 ($32_1$ to $32_n$) is wired in the column direction for each pixel column. The pixel control line 31 transmits a drive signal for driving when reading a signal from the pixel 20. In FIG. 1, the pixel control line 31 is illustrated as one wire, but the number thereof is not limited to one. One end of the pixel control line 31 is connected to an output end corresponding to each row of the row selection unit 12.

Respective components of the peripheral circuit unit of the pixel array unit 11, that is, the row selection unit 12, the constant current source unit 13, the column amplifier unit 14, the analog-to-digital conversion unit 15, the horizontal transfer scanning unit 16, the signal processing unit 17, and the timing control unit 18 are hereinafter described.

The row selection unit 12 includes a shift register, an address decoder and the like, and controls scanning of the pixel row and an address of the pixel row when selecting each pixel 20 of the pixel array unit 11. Although a specific configuration of the row selection unit 12 is not illustrated, this generally includes two scanning systems, which are a read scanning system and a sweep scanning system.

The read scanning system sequentially selectively scans the pixels 20 in the pixel array unit 11 in units of row in order to read a pixel signal from the pixel 20. The pixel signal read from the pixel 20 is an analog signal. The sweep scanning system performs, on a read row on which the read scanning is performed by the read scanning system, sweep scanning prior to the read scanning by time corresponding to a shutter speed.

By the sweep scanning by the sweep scanning system, an unnecessary charge is swept out of the photoelectric conversion element of the pixel 20 of the read row, so that the photoelectric conversion element is reset. Then, a so-called electronic shutter operation is performed by sweeping the unnecessary charge (resetting) by the sweep scanning system. Here, the electronic shutter operation is intended to mean an operation of discharging the photocharge of the photoelectric conversion element and newly starting exposure (starting accumulating the photocharge).

The constant current source unit 13 is provided with a plurality of load current sources I (refer to FIG. 2) each including, for example, a MOS transistor, connected to the signal lines $32_1$ to $32_n$, respectively, for respective pixel columns, and supplies a bias current to each pixel 20 of the pixel row selectively scanned by the row selection unit 12 via each of the signal lines $32_1$ to $32_n$.

The column amplifier unit 14 includes a set of column amplifiers provided corresponding to the signal lines $32_1$ to $32_n$, respectively, for respective pixel columns. Then, each column amplifier of the column amplifier unit 14 amplifies the pixel signal read from each pixel 20 of the pixel array unit 11 and supplied via each of the signal lines $32_1$ to $32_n$, and supplies the same to the analog-to-digital conversion unit 15.

The analog-to-digital conversion unit 15 is a column-parallel analog-to-digital conversion unit including a set of a plurality of analog-to-digital converters provided corresponding to the pixel columns of the pixel array unit 11, respectively (for example, provided for each pixel column). The analog-to-digital conversion unit 15 converts an analog pixel signal output via each of the signal lines $32_1$ to $32_n$ for each pixel column and amplified by the column amplifier unit 14 into a digital pixel signal.

The horizontal transfer scanning unit 16 includes a shift register, an address decoder and the like, and controls scanning of the pixel column and an address of the pixel column when reading the signal of each pixel 20 of the pixel array unit 11. Under the control of the horizontal transfer scanning unit 16, the pixel signals converted into the digital signals by the analog-to-digital conversion unit 15 are read to a horizontal transfer line L in units of pixel column.

The signal processing unit 17 performs predetermined signal processing on the digital pixel signal supplied via the horizontal transfer line L to generate two-dimensional image data. For example, the signal processing unit 17 performs digital signal processing such as correction of a vertical line defect or a point defect, parallel-to-serial conversion, compression, encoding, addition, averaging, and an intermittent operation. The signal processing unit 17 outputs the generated image data to a subsequent device as an output signal of this CMOS image sensor 10.

The timing control unit 18 generates various timing signals, clock signals, control signals and the like, and performs drive control of the row selection unit 12, the constant current source unit 13, the column amplifier unit 14, the analog-to-digital conversion unit 15, the horizontal transfer scanning unit 16, the signal processing unit 17 and the like on the basis of the generated signals.

[Circuit Configuration Example of Pixel]

Figure 2:
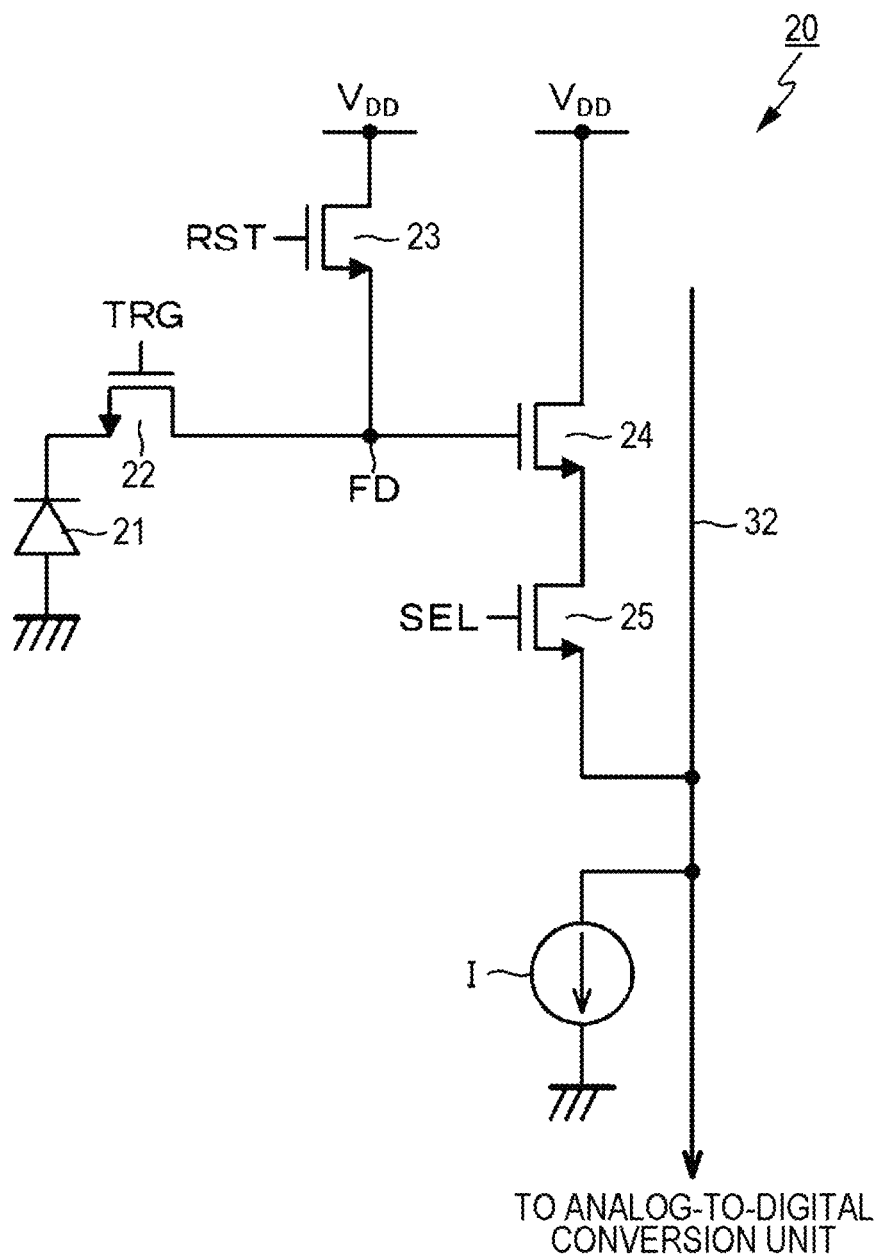
FIG. 2 is a circuit diagram illustrating an example of a circuit configuration of a pixel.

FIG. 2 is a circuit diagram illustrating an example of a configuration of the pixel (pixel circuit) 20. The pixel 20 includes, for example, a photodiode 21 as the photoelectric conversion element. The pixel 20 includes, in addition to the photodiode 21, a transfer transistor 22, a reset transistor 23, an amplification transistor 24, and a selection transistor 25.

As the four transistors of the transfer transistor 22, the reset transistor 23, the amplification transistor 24, and the selection transistor 25, an N-channel MOS field effect transistor (FET) is used, for example. However, a combination of conductivity types of the four transistors 22 to 25 herein illustrated is merely an example, and the combination is not limited thereto.

For the pixel 20, as the pixel control line 31 described above, a plurality of pixel control lines is wired in common to the respective pixels 20 of the same pixel row. The plurality of pixel control lines is connected to the output end corresponding to each pixel row of the row selection unit 12 in units of pixel row. The row selection unit 12 appropriately outputs a transfer signal TRG, a reset signal RST, and a selection signal SEL to the plurality of pixel control lines.

The photodiode 21, an anode electrode of which is connected to a low potential side power supply (for example, ground), photoelectrically converts received light into a photocharge (herein, photoelectron) of a charge amount corresponding to an amount of the light and accumulates the photocharge. A cathode electrode of the photodiode 21 is electrically connected to a gate of the amplification transistor 24 via the transfer transistor 22. Here, a region to which the gate of the amplification transistor 24 is electrically connected is a floating diffusion (floating diffusion region/impurity diffusion region) FD. The floating diffusion FD is a charge-to-voltage conversion unit that converts the charge into a voltage.

The transfer signal TRG, a high level (for example, $V_{DD}$ level) of which is active, is applied from the row selection unit 12 to a gate of the transfer transistor 22. The transfer transistor 22 becomes conductive in response to the transfer signal TRG, thereby transferring the photocharge photoelectrically converted by the photodiode 21 and accumulated in the photodiode 21 to the floating diffusion FD.

The reset transistor 23 is connected between a node of a high potential side power supply voltage $V_{DD}$ and the floating diffusion FD. The reset signal RST, a high level of which is active, is applied from the row selection unit 12 to a gate of the reset transistor 23. The reset transistor 23 becomes conductive in response to the reset signal RST, and resets the floating diffusion FD by discharging the charge of the floating diffusion FD to the node of the voltage $V_{DD}$.

The gate and a drain of the amplification transistor 24 are connected to the floating diffusion FD and the node of the high potential side power supply voltage $V_{DD}$, respectively. The amplification transistor 24 serves as an input unit of a source follower that reads a signal obtained by photoelectric conversion by the photodiode 21. That is, a source of the amplification transistor 24 is connected to the signal line 32 via the selection transistor 25. Then, the amplification transistor 24 and the load current source I connected to one end of the signal line 32 form a source follower that converts the voltage of the floating diffusion FD into a potential of the signal line 32.

A drain and a source of the selection transistor 25 are connected to the source of the amplification transistor 24 and the signal line 32, respectively. The selection signal SEL, a high level of which is active, is applied from the row selection unit 12 to a gate of the selection transistor 25. When the selection transistor 25 becomes conductive in response to the selection signal SEL, this puts the pixel 20 into a selected state and transmits the signal output from the amplification transistor 24 to the signal line 32.

Note that, in the circuit example described above, as a circuit configuration of the pixel 20, a 4Tr configuration including the transfer transistor 22, the reset transistor 23, the amplification transistor 24, and the selection transistor 25, that is, the four transistors (Tr) is described as an example, but the circuit configuration is not limited thereto. For example, a 3Tr configuration in which the selection transistor 25 is omitted and the amplification transistor 24 is allowed to have a function of the selection transistor 25 is also possible, or the circuit configuration of 5Tr or more in which the number of transistors is increased as necessary is also possible.

[Semiconductor Chip Structure]

As a semiconductor chip structure of the CMOS image sensor 10 having the configuration described above, a flat semiconductor chip structure and a stacked semiconductor chip structure may be illustrated. In any CMOS image sensor 10 having the flat semiconductor chip structure or the stacked semiconductor chip structure, when a substrate surface on a side on which a wiring layer is arranged of the pixel 20 is set to a front surface (front surface), the pixel 20 may have a back-illuminated pixel structure that captures light applied from a back surface side on the opposite side, or may have a front-illuminated pixel structure that captures light applied from the front surface side. Hereinafter, the flat semiconductor chip structure and the stacked semiconductor chip structure are described.

(Flat Semiconductor Chip Structure)

Figure 3:
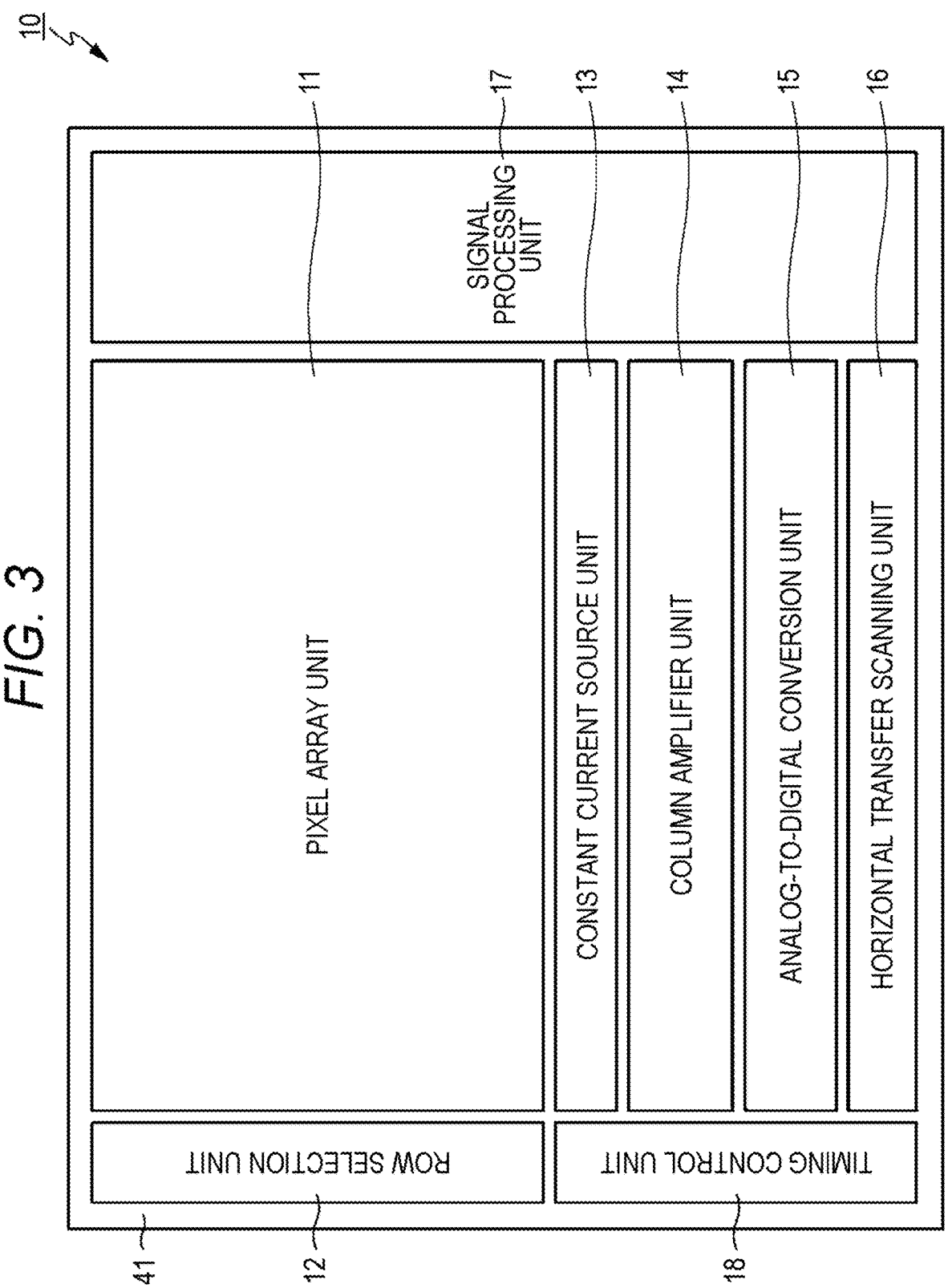
FIG. 3 is a plan view schematically illustrating an outline of a flat semiconductor chip structure of the CMOS image sensor.

FIG. 3 is a plan view schematically illustrating an outline of the flat semiconductor chip structure of the CMOS image sensor 10. As illustrated in FIG. 3, the flat semiconductor chip structure is a structure in which a circuit portion around the pixel array unit 11 is formed on the same semiconductor chip (semiconductor substrate) 41 as that of the pixel array unit 11 in which the pixels 20 are arranged in a matrix. Specifically, the row selection unit 12, the constant current source unit 13, the column amplifier unit 14, the analog-to-digital conversion unit 15, the horizontal transfer scanning unit 16, the signal processing unit 17, the timing control unit 18 and the like are formed on the same semiconductor chip 41 as that of the pixel array unit 11.

(Stacked Semiconductor Chip Structure)

Figure 4:
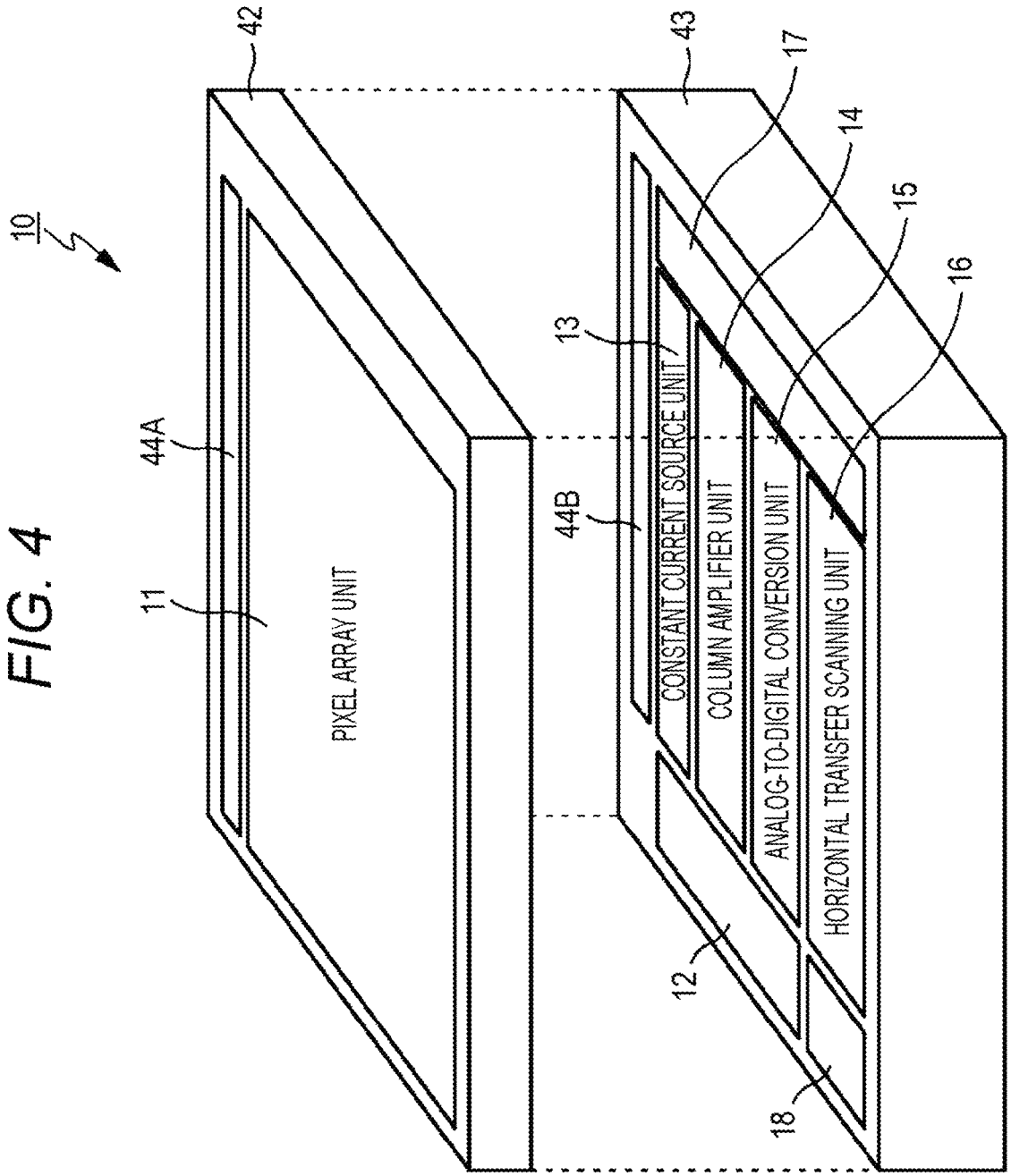
FIG. 4 is an exploded perspective view schematically illustrating an outline of a stacked semiconductor chip structure of the CMOS image sensor.

FIG. 4 is an exploded perspective view schematically illustrating an outline of the stacked chip structure of the CMOS image sensor 10. As illustrated in FIG. 4, the stacked semiconductor chip structure is a structure in which at least two semiconductor chips (semiconductor substrates) of a first-layer semiconductor chip 42 and a second-layer semiconductor chip 43 are stacked. In this stacked structure, the pixel array unit 11 is formed on the first-layer semiconductor chip 42. Furthermore, the circuit portion such as the row selection unit 12, the constant current source unit 13, the column amplifier unit 14, the analog-to-digital conversion unit 15, the horizontal transfer scanning unit 16, the signal processing unit 17, and the timing control unit 18 is formed on the second-layer semiconductor chip 43. Then, the first-layer semiconductor chip 42 and the second-layer semiconductor chip 43 are electrically connected to each other via connections (VIAs) 44A and 44B such as Cu—Cu connection.

According to the CMOS image sensor 10 having the stacked structure, the first-layer semiconductor chip 42 is only required to have a size (area) enough for forming the pixel array unit 11, so that the size (area) of the first-layer semiconductor chip 42 and eventually a size of an entire chip may be reduced. Moreover, since a process suitable for fabricating the pixel 20 may be applied to the first-layer semiconductor chip 42 and a process suitable for fabricating the circuit portion may be applied to the second-layer semiconductor chip 43, there also is an advantage that a process may be optimized when manufacturing the CMOS image sensor 10. In particular, an advanced process may be applied when fabricating the circuit portion.

Note that, here, the stacked structure of the two-layer structure formed by stacking the first-layer semiconductor chip 42 and the second-layer semiconductor chip 43 is illustrated, but the stacked structure is not limited to the two-layer structure, and may be a structure of three or more layers. Then, in a case of the stacked structure of three or more layers, the circuit portion such as the row selection unit 12, the constant current source unit 13, the column amplifier unit 14, the analog-to-digital conversion unit 15, the horizontal transfer scanning unit 16, the signal processing unit 17, and the timing control unit 18 may be formed in a dispersed manner on the semiconductor chip of the second and subsequent layers.

[Regarding Single-Slope Analog-to-Digital Converter]

In the CMOS image sensor 10 having the configuration described above, for example, a single-slope analog-to-digital converter has been generally used as the analog-to-digital converter in the analog-to-digital conversion unit 15. Here, the single-slope analog-to-digital converter is described.

In the single-slope analog-to-digital converter, a signal of an inclined waveform (ramp wave) that linearly changes with a certain inclination is used as a reference signal. The single-slope analog-to-digital converter compares the analog pixel signal read from the pixel 20 with the reference signal of the ramp wave, amplifies and clips a difference therebetween, thereby modulating the same to a phase signal, and then performs sampling to convert the same into a digital signal. This single-slope analog-to-digital converter has the following problems.

Problem 1

An offset occurs due to a delay at the time of modulation to the phase signal. Therefore, digital correlated double sampling (CDS) for removing fixed pattern noise of the pixel 20 is indispensable, so that additional time for two analog-to-digital conversions and auto-zero is required.

Problem 2

When the pixel signal crosses the reference signal of the ramp wave, a through current or kickback occurs. Furthermore, crossing time depends on a pixel signal level, and causes interference of other pixel columns with the analog-to-digital converter.

Problem 3

Since the amplification transistor 24 of the pixel 20 is used to hold the voltage at the time of analog-to-digital conversion, conversion time limits a reading speed of the pixel signal.

Regarding problem 1, in the single-slope analog-to-digital converter, auto-zero (offset cancellation by input/output short-circuit) of an input amplifier is performed to prevent the offset. Therefore, a DC offset may be removed. However, since the reference signal of the ramp wave changes temporally, an AC offset due to a delay cannot be removed. The delay may be reduced by widening a band, but output phase noise increases.

Problem 2 is known as a mechanism of an interference phenomenon (streaking) from a bright portion to a dark portion. In the single-slope analog-to-digital converter, when a plurality of pixel columns has the same brightness, switching occurs all at once, so that an influence of interference increases.

Problem 3 is a problem caused when sampling of the potential of the signal line 32 is not performed. In the amplification transistor 24 of the pixel 20, relatively large power is consumed to drive the signal line 32 having a large load capacity. Therefore, it is not advisable to use the amplification transistor 24 only to hold the voltage at the time of the analog-to-digital conversion.

First Embodiment of Present Disclosure

In an imaging device (CMOS image sensor as an example) according to a first embodiment of the present disclosure, a successive approximation register (SAR) analog-to-digital converter is used as each analog-to-digital converter of an analog-to-digital conversion unit 15. The successive approximation register analog-to-digital converter may operate at higher speed and with lower power consumption as compared with a single-slope analog-to-digital converter having the various problems described above. In this embodiment, a column signal processing system including the successive approximation register analog-to-digital converter may operate at further higher speed and with further lower power consumption.

Figure 5:
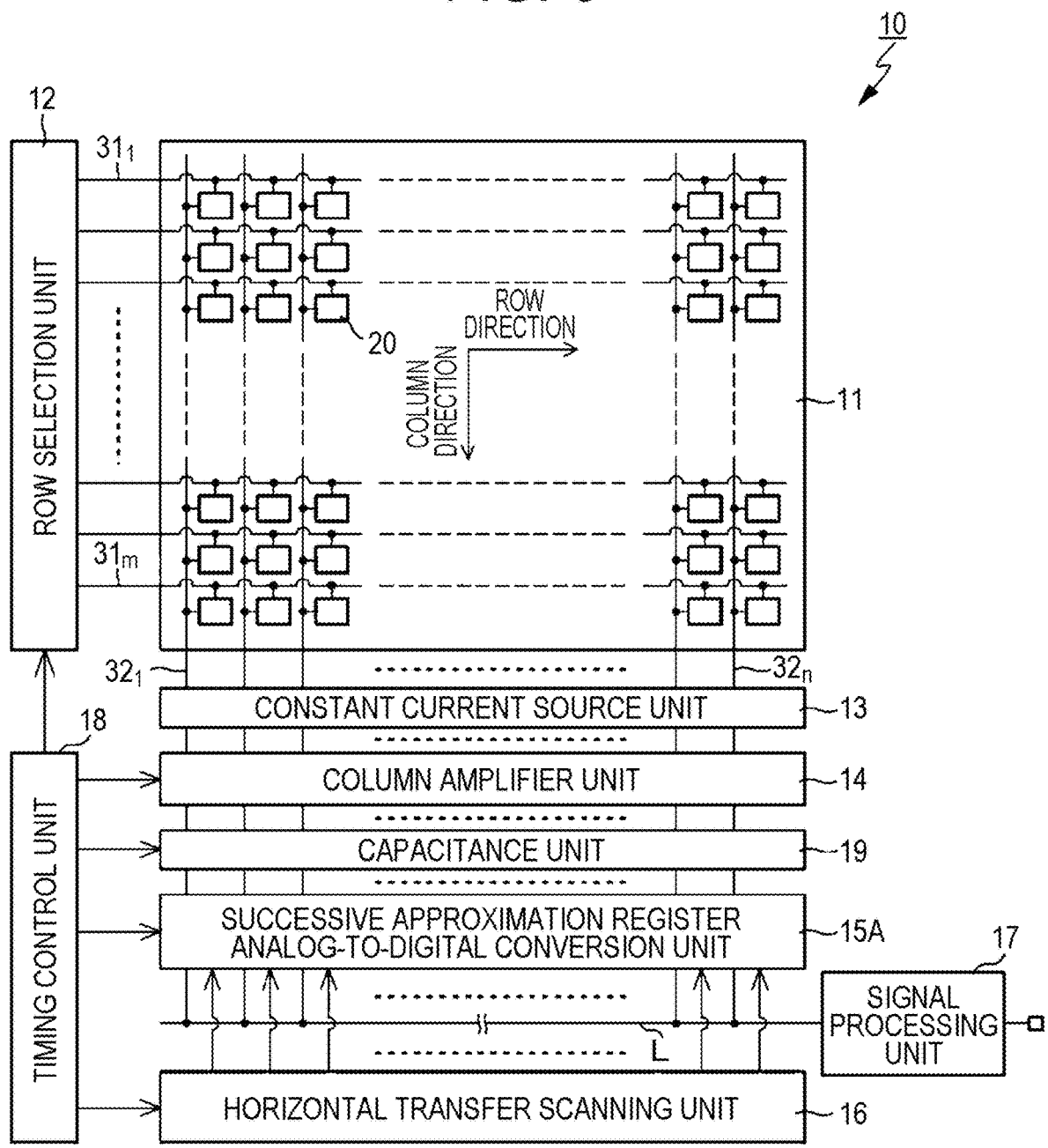
FIG. 5 is a block diagram illustrating an outline of a configuration of a CMOS image sensor, which is an example of an imaging device according to a first embodiment of the present disclosure.

FIG. 5 is a block diagram illustrating an outline of a configuration of the CMOS image sensor, which is an example of the imaging device according to the first embodiment of the present disclosure.

In a CMOS image sensor 10 according to this embodiment, a column amplifier unit 14 performs processing (CDS processing) of obtaining a difference between a signal component (so-called D-phase voltage) and a reset component (so-called P-phase voltage) as a luminance component input from each pixel 20 of a pixel array unit 11 via a signal line 32 using a reference voltage that defines an auto-zero voltage, and outputs the difference as a pixel signal. A capacitance unit 19 is provided subsequent to the column amplifier unit 14.

The capacitance unit 19 differentiates a single-phase signal output from the column amplifier unit 14 using the reference voltage that defines a zero voltage of an output of the column amplifier unit 14. Then, the capacitance unit 19 holds the pixel signal input from the column amplifier unit 14 by, for example, sampling by a switched capacitor. A successive approximation register analog-to-digital conversion unit 15A is provided subsequent to the capacitance unit 19. The successive approximation register analog-to-digital conversion unit 15A includes a plurality of successive approximation register (SAR) analog-to-digital converters capable of operating at higher speed and with lower power consumption as compared with the single-slope analog-to-digital converter, and converts an analog pixel signal input from the capacitance unit 19 into a digital pixel signal.

According to the CMOS image sensor 10 according to this embodiment, each successive approximation register analog-to-digital converter of the successive approximation register analog-to-digital conversion unit 15A performs a binary search, so that this is more efficient in principle than the single slope analog-to-digital converter that performs sweep as seen alone. Furthermore, the number of times of analog-to-digital conversions may be halved by performing the CDS processing conventionally performed by the two analog-to-digital conversions in the analog-to-digital converter by the column amplifier unit 14 of an analog circuit system. Moreover, by introducing the sampling by the switched capacitor, a potential VSL of the signal line does not need to stand by for the analog-to-digital conversion, and the sampling is always performed all at once regardless of the potential VSL of the signal line 32, so that an influence of interference due to the switching is also small.

Furthermore, by differentiating the single-phase signal output from the column amplifier unit 14 in the capacitance unit 19, the circuit configuration of the capacitance unit 19 and after the same may be made a configuration of a differential circuit. Therefore, in the CMOS image sensor 10 according to this embodiment, the column signal processing system excellent in circuit symmetry may be constructed.

Hereinafter, a specific example of the column signal processing system in the CMOS image sensor 10 according to the first embodiment, specifically, the column signal processing system including the column amplifier unit 14, the capacitance unit 19, and the analog-to-digital conversion unit 15 is described.

First Embodiment

Figure 6:
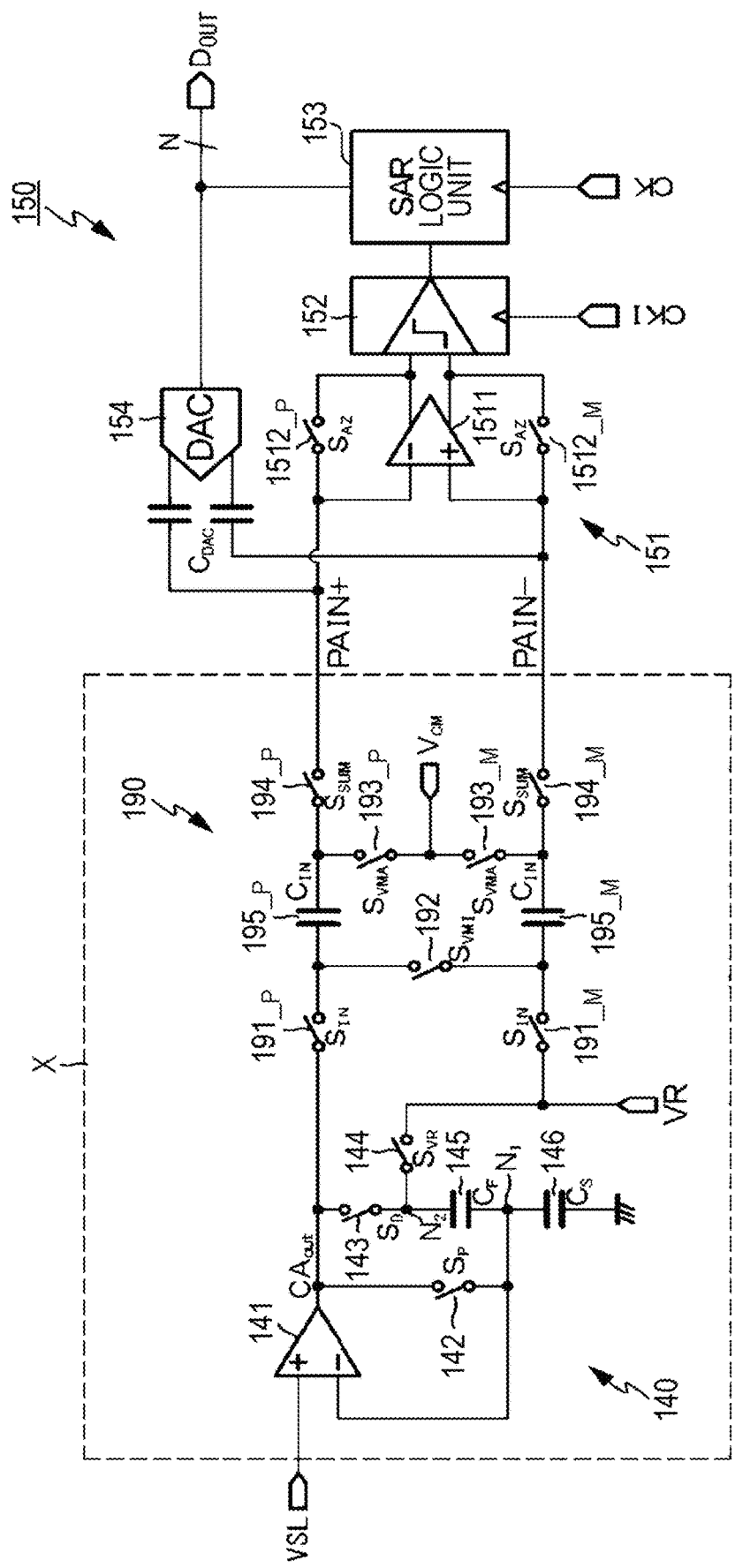
FIG. 6 is a circuit diagram illustrating an outline of a configuration of a column signal processing system according to the first embodiment.

A first embodiment is an example in which a circuit configuration of a capacitance unit and after the same is made a configuration of a differential circuit. FIG. 6 is a circuit diagram illustrating an outline of a configuration of a column signal processing system according to the first embodiment. A column amplifier unit 14 includes column amplifiers 140 as many as the number of pixel columns provided by the same number as that of the pixel columns, and a capacitance unit 19 includes capacitance multiplexers 190 as many as the number of pixel columns. Note that, a plurality of capacitance units 19 and a plurality of column amplifiers 140 are arranged for one analog-to-digital converter to operate as a multiplexer.

(Configuration Example of Column Amplifier)

The column amplifier 140 includes an amplifier 141, a first switch 142, a second switch 143, a third switch 144, a first capacitance element 145, and a second capacitance element 146. The first capacitance element 145 (hereinafter, simply referred to as the "capacitance element 145") has a capacitance value CF, and the second capacitance element 146 (hereinafter, simply referred to as the "capacitance element 146") has a capacitance value $C_S$.

The amplifier 141 uses a potential VSL ($VSL_0$ to $VSL_7$) of a signal line 32 as an input of a non-inverting (+) input terminal. The first switch 142 (hereinafter, simply referred to as the "switch 142"), one end and the other end of which are connected to an output terminal of the amplifier 141 and an inverting (−) input terminal of the amplifier 141, respectively, performs an on (close)/off (open) operation according to a polarity (high level/low level) of a switch control signal $S_P$.

One end of the second switch 143 (hereinafter, simply referred to as the "switch 143") is connected to the output terminal of the amplifier 141. One end of the capacitance element 145 is connected to the other end of the switch 143, and the other end of the capacitance element 145 is connected to the other end of the switch 142 and the inverting input terminal of the amplifier 141. The capacitance element 146 is connected between the other end of the capacitance element 145 and the output terminal of the amplifier 141, and a node of a reference potential (for example, ground). The switch 143 performs an on/off operation according to a polarity of a switch control signal $S_D$.

That is, the switch 143, the capacitance element 145, and the capacitance element 146 are connected in series in this order between the output terminal of the amplifier 141 and the node of the reference potential (for example, ground). Furthermore, a common connection node $N_1$ of the capacitance element 145 and the capacitance element 146 is electrically connected to the other end of the switch 142.

The third switch 144 (hereinafter, simply referred to as the "switch 144"), one end of which is connected to a common connection node N2 of the switch 143 and the capacitance element 145, performs an on/off operation according to a polarity of a switch control signal $S_{VR}$. A reference voltage VR that defines a zero voltage of an output of the column amplifier 140 is applied to the other end of the switch 144. That is, the switch 144 selectively applies the reference voltage VR to the common connection node N2 of the switch 143 and the capacitance element 145.

(Configuration Example of Capacitance Multiplexer)

The capacitance multiplexer 190 forming the capacitance unit 19 has a configuration of a differential circuit. A positive side of the differential circuit includes a switch $191_{-P}$, a capacitance element $195_{-P}$, a switch $193_{-P}$, and a switch $194_{-P}$. A negative side of the differential circuit includes a switch $191_{-M}$, a capacitance element $195_{-M}$, a switch $193_{-M}$, and a switch $194_{-M}$.

The switch $191_{-P}$ on the positive side performs an on (close)/off (open) operation according to a polarity (high level/low level) of a switch control signal S/N, and samples an output voltage $CA_{out}$ of the column amplifier 140 applied to one end when turned on. The switch $191_{-M}$ on the negative side performs an on/off operation according to the polarity of the switch control signal S/N, and samples the reference voltage VR applied to one end when turned on.

Here, the reference voltage VR sampled by the switch $191_{-M}$ on the negative side is used as a voltage on the negative side of the differential circuit. In this manner, in the capacitance multiplexer 190, the single-phase signal input from the column amplifier 140 may be differentiated by using the reference voltage VR sampled by the switch $191_{-M}$ on the negative side as a reference. As a result, the circuit configuration of the capacitance unit 19 and after the same may be made the configuration of the differential circuit.

On the positive side of the differential circuit, one end of the capacitance element $195_{-P}$ is connected to the other end of the switch $191_{-P}$, and one ends of the switch $193_{-P}$ and the switch $194_{-P}$ are connected to the other end of the capacitance element $195_{-P}$. The capacitance element $195_{-P}$ is charged with the output voltage $CA_{out}$ of the column amplifier 140 sampled by the switch $191_{-P}$. An output common mode reference voltage $V_{CM}$ of a preamplifier 151 in a successive approximation register analog-to-digital converter 150 to be described later is applied to the other end of the switch $193_{-P}$. The other end of the switch $194_{-P}$ serves as an output end on the positive side of the capacitance multiplexer 190.

On the negative side of the differential circuit, one end of the capacitance element $195_{-M}$ is connected to the other end of the switch $191_{-M}$, and one ends of the switch $193_{-M}$ and the switch $194_{-M}$ are connected to the other end of the capacitance element $195_{-M}$. The capacitance element $195_{-M}$ is charged with the reference voltage VR sampled by the switch $191_{-M}$. The output common mode reference voltage $V_{CM}$ is applied to the other end of the switch $193_{-M}$. The other end of the switch $194_{-M}$ serves as an output end on the negative side of the capacitance multiplexer 190.

An inter-differential short-circuit switch (fourth switch) 192 is connected between one ends of the capacitance element $195_{-P}$ on the positive side and the capacitance element $195_{-M}$ on the negative side. The inter-differential short-circuit switch 192 performs an on/off operation according to a polarity of a switch control signal $S_{VMI}$.

Specifically, when transferring the output voltage $CA_{out}$ of the column amplifier 140 held by the capacitance element 195$_{-P}$ and the reference voltage VR held by the capacitance element 195$_{-M}$ to the subsequent successive approximation register analog-to-digital converter 150 via the switch 194$_{-P}$ and the switch 194$_{-M}$, the inter-differential short-circuit switch 192 is turned on to short-circuit one end (input end) of the capacitance element 195$_{-P}$ and one end (input end) of the capacitance element 195$_{-M}$.

In this manner, by short-circuiting the input ends (differentials) of the capacitance element 195$_{-P}$ and the capacitance element 195$_{-M}$ by the inter-differential short-circuit switch 192, it is possible to prevent an influence of a voltage (in-phase component) on the column amplifier 140 side from reaching the circuit after the capacitance element 195$_{-P}$ and the capacitance element 195$_{-M}$. Incidentally, a relatively high voltage is used on the column amplifier 140 side. In contrast, the successive approximation register analog-to-digital converter 150 subsequent to the capacitance multiplexer 190 is required to operate at a low voltage and at a high speed. Therefore, in order to secure high-speed operation at a low voltage required for the successive approximation register analog-to-digital converter 150, it is important to prevent an influence of a relatively high voltage on the column amplifier 140 side from reaching the circuit after the capacitance element 195$_{-P}$ and the capacitance element 195$_{-M}$ by an action of the inter-differential short-circuit switch 192.

In the column signal processing system illustrated in FIG. 6, by the action of the inter-differential short-circuit switch 192, each switch of a circuit portion X including the column amplifier 140 and the capacitance multiplexer 190 may be formed using a thick-film high-voltage transistor having a relatively thick film, and each switch of the capacitance multiplexer 190 may be formed using a thin-film low-voltage transistor having a relatively thin film. However, since the influence of the relatively high voltage on the column amplifier 140 side does not reach the circuit after the capacitance element 195$_{-P}$ and the capacitance element 195$_{-M}$ due to the action of the inter-differential short-circuit switch 192, in principle, each switch after the capacitance element 195$_{-P}$ and the capacitance element 195$_{-M}$ of the capacitance multiplexer 190 may also be formed using a thin-film low-voltage transistor having a relatively thin film.

Furthermore, by shifting the voltage (in-phase component) on the column amplifier 140 side to a low voltage by the action of the inter-differential short-circuit switch 192, a comparator of a low breakdown voltage may be used in the successive approximation register analog-to-digital converter 150. Moreover, since a differential capacitance (capacitance array unit $C_{DAC}$) is separated from the column amplifier 140 and other reference voltages at the time of analog-to-digital conversion, a high-speed operation of the analog-to-digital conversion becomes possible.

(Configuration Example of Successive Approximation Register Analog-to-Digital Converter)

The successive approximation register analog-to-digital converter 150 includes the preamplifier 151, a comparator 152, a SAR logic unit 153, a digital-to-analog converter (DAC) 154, and the capacitance array unit $C_{DAC}$.

The preamplifier 151 includes an amplifier 1511 and switches 1512$_{-P}$ and 1512$_{-M}$. The amplifier 1511 uses an analog voltage PAIN+ (output voltage $CA_{out}$ of the column amplifier 140) supplied from the capacitance multiplexer 190 as an input of an inverting (−) input terminal, and uses an analog voltage PAIN− (reference voltage VR) as an input of a non-inverting (+) input terminal.

The switches 1512$_{-P}$ and 1512$_{-M}$ are switches of auto-zero (offset cancellation by input/output short-circuit), and perform an on/off operation according to a polarity of a switch control signal $S_{AZ}$. The switch 1512$_{-P}$ is connected between the inverting input terminal and an output terminal of the preamplifier 151. The switch 1512$_{-M}$ is connected between the non-inverting input terminal and the output terminal of the preamplifier 151.

The comparator 152 compares magnitude of the analog voltage supplied via the preamplifier 151 with magnitude of a comparison reference voltage in synchronization with a comparator clock CKI, and supplies a comparison result to the SAR logic unit 153.

The SAR logic unit 153 includes, for example, an N-bit successive approximation register, stores the comparison result of the comparator 152 for each bit in synchronization with a clock CK, and outputs the same as an N-bit digital value $D_{OUT}$ after the analog-to-digital conversion.

The digital-to-analog converter 154 and the capacitance array unit 155 form an N-bit capacitance digital-to-analog converter. Then, in the capacitance digital-to-analog converter, the N-bit digital value $D_{OUT}$ output from the SAR logic unit 153 is converted into an analog voltage and is applied to the inverting (−) input terminal of the amplifier 1511 as an input thereof.

(Circuit Operation of Column Signal Processing System)

Subsequently, a circuit operation of the column signal processing system according to the first embodiment including the column amplifier 140, the capacitance multiplexer 190, and the successive approximation register analog-to-digital converter 150 having the configuration described above is described with reference to a timing chart in FIG. 7.

Figure 7:
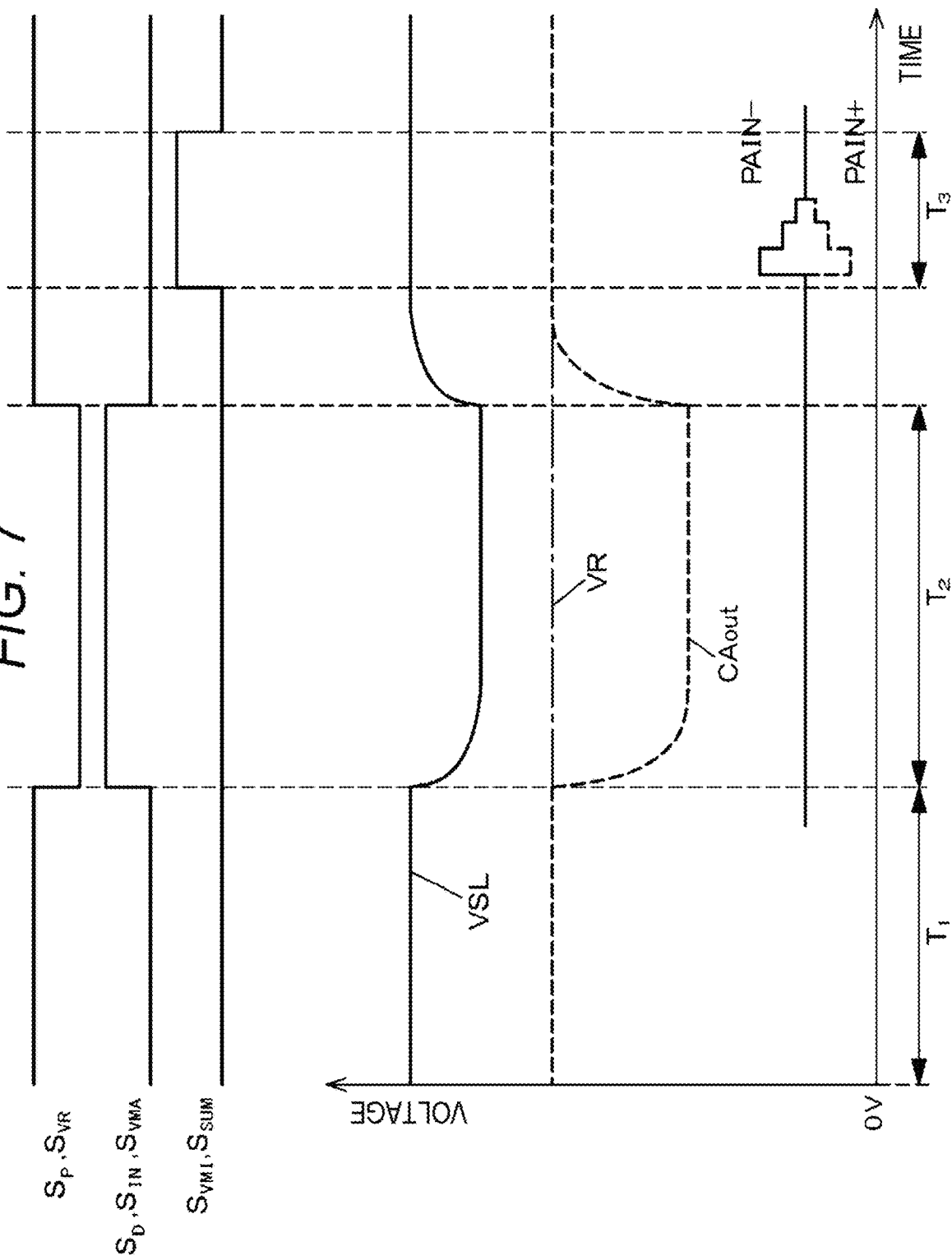
FIG. 7 is a timing chart for explaining a circuit operation of the column signal processing system according to the first embodiment.

The timing chart in FIG. 7 illustrates a timing relationship among the switch control signals $S_P$ and $S_{VR}$, the switch control signals $S_D$, $S_{IN}$, and $S_{VMA}$, and the switch control signals $S_{VMI}$ and $S_{SUM}$. The timing chart in FIG. 7 further illustrates waveform diagrams of the potential VSL of the signal line 32, the reference voltage VR, and the output voltage $CA_{out}$ of the column amplifier 140.

In a period $T_1$, the switch control signal $S_P$ and the switch control signal $S_{VR}$ are put into a high level in a state in which the potential VSL of the signal line 32 is a reset component (P-phase voltage), so that the switch 142 and the switch 144 are turned on (closed). Therefore, the capacitance element 145 and the capacitance element 146 are charged with the reset component (P-phase voltage). At that time, the voltage of the common connection node N2 of the switch 143 and the capacitance element 145 is the same voltage as the reference voltage VR. The reset component (P-phase voltage) greatly varies depending on the pixel 20 (with low accuracy), but since the reference voltage VR is generated on the column amplifier 140 side, variation is small (with high accuracy).

Next, in a period T2, the switch control signal $S_P$ and the switch control signal $S_{VR}$ are put into a low level, so that the switch 142 and the switch 144 are turned off (opened), and simultaneously, the switch control signal $S_D$ is put into a high level, so that the switch 143 is turned on (closed). At that time, a non-inverting amplifier circuit is formed using the capacitance element 145, the capacitance element 146, and the amplifier 141, and an output voltage $V_{out}$ of the column amplifier 140 is substantially the same voltage as the reference voltage VR.

When the potential VSL of the signal line 32 drops to a signal component (D-phase voltage), which is a luminance component, feedback is applied so that the voltage of the common connection node $N_1$ of the capacitance element 145 and the capacitance element 146 becomes the same voltage as the signal component (D-phase voltage).

By this series of operations, the CDS processing of obtaining a difference between the reset component (P-phase voltage) and the signal component (D-phase voltage) is performed, and the output voltage $V_{out}$ of the column amplifier 140 drops by a voltage obtained by amplifying the potential VSL of the signal line 32 by $(C_F+C_S)/C_F$. Since the variation in the reference voltage VR is small, a gain of the column amplifier 140 may be increased.

In the period $T_2$, the switch control signal $S_{IN}$ and the switch control signal $S_{VMA}$ are put into a high level simultaneously with the switch control signal $S_D$. Therefore, the switches $191\_P$ and $191\_M$ are turned on, the output voltage $V_{out}$ of the column amplifier 140 and the reference voltage VR are sampled as a differential voltage, and the capacitance elements $195\_P$ and $195\_M$ are charged with the same.

At the same time, the switches $193\_P$ and $193\_M$ are turned on to apply the output common mode reference voltage $V_CN$ to an output side (the successive approximation register analog-to-digital converter 150 side) of the capacitance elements $195\_P$ and $195\_M$. The output common mode reference voltage $V_{CM}$ is set to the same voltage as an in-phase voltage of the preamplifier 151 in the successive approximation register analog-to-digital converter 150.

Thereafter, in a period T3, the switch control signal $S_{VMI}$ and the switch control signal $S_{SUM}$ are put into a high level, so that the switch 192 and the switches $194\_P$ and $194\_M$ are turned on, and the differential voltage with which the capacitance elements $195\_P$ and $195\_M$ are charged is transferred to the successive approximation register analog-to-digital converter 150.

When the switch 192 is turned on, an input side of the capacitance elements $195\_P$ and $195\_M$ is subjected to differential short-circuit, but put into an open state in terms of the in-phase component. Therefore, the in-phase component of the input is not transmitted to the successive approximation register analog-to-digital converter 150. Therefore, the preamplifier 151 in the successive approximation register analog-to-digital converter 150 may be formed using a high-speed thin-film low-voltage transistor.

When the differential voltage with which the capacitance elements $195\_P$ and $195\_M$ are charged is transmitted to the successive approximation register analog-to-digital converter 150, the comparator clock CKI is input to the comparator 152 to start the comparison. The comparison result of the comparator 152 is fed back to the digital-to-analog converter 154 via the SAR logic unit 153, and is subjected to a binary search so that the input of the preamplifier 151 becomes 0 V. Finally, almost all the charges accumulated in the capacitance elements $195\_P$ and $195\_M$ of the capacitance multiplexer 190 are transferred to the capacitance array unit $C_{DAC}$, and the input of the digital-to-analog converter 154 at that time is obtained as an output code.

Example 2

Figure 8:
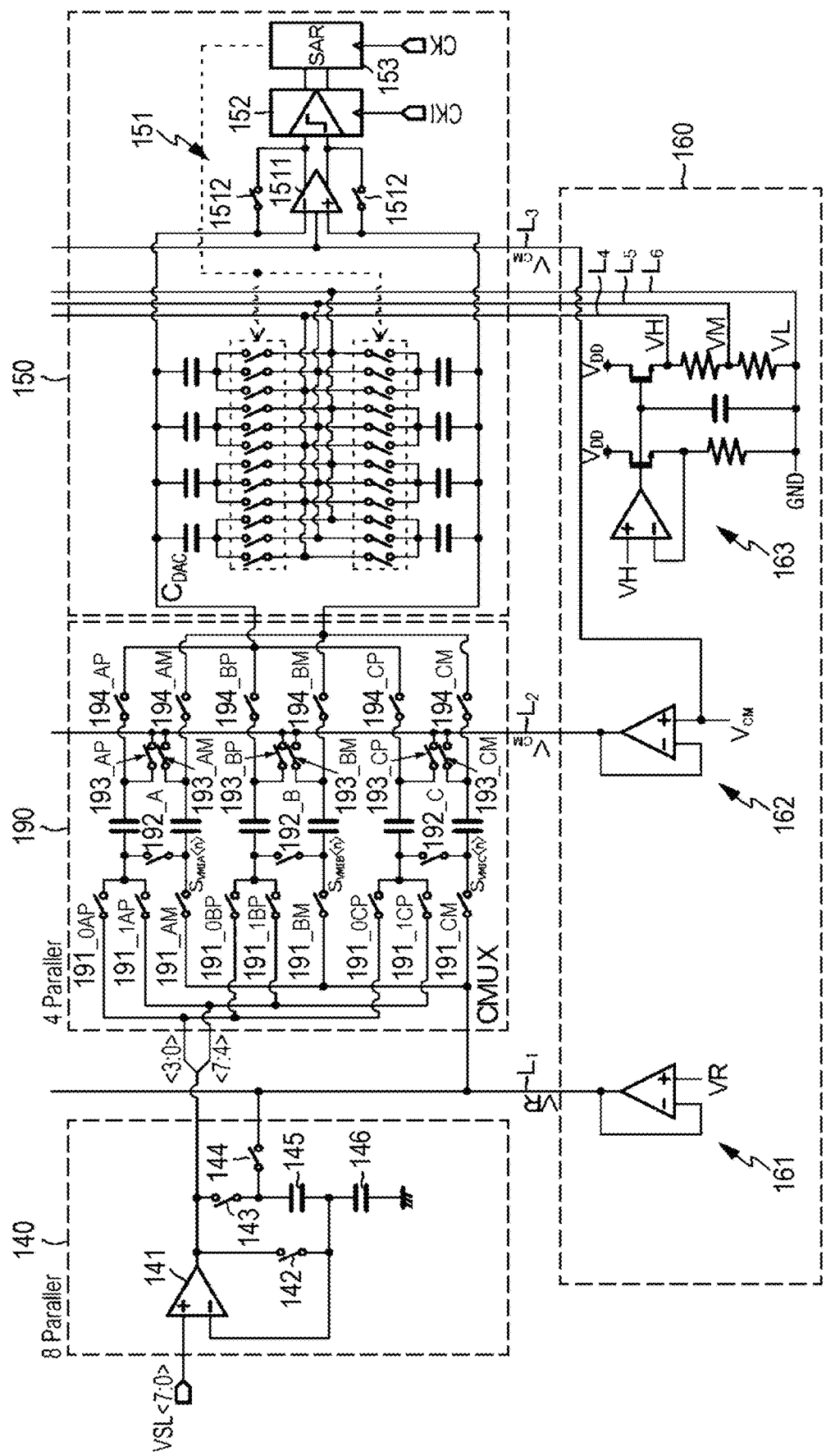
FIG. 8 is a circuit diagram illustrating an outline of a configuration of a column signal processing system according to Example 2.

Example 2 is an implementation example of a column signal processing system, and an example in which a capacitance unit 19 (capacitance multiplexer 190) and after the same form a configuration of a differential circuit. FIG. 8 is a circuit diagram illustrating an outline of a configuration of the column signal processing system according to Example 2.

In the column signal processing system according to Example 2, an example of a configuration of processing potentials $VSL_0$ to $VSL_7$ of a plurality of signal lines 32, for example, eight signal lines 32, respectively, by multiplying via eight column amplifiers 140 arranged in parallel corresponding to the eight signal lines 32 and four capacitance multiplexers 190 arranged in parallel for one successive approximation register analog-to-digital converter 150 of a successive approximation register analog-to-digital conversion unit 15A is described.

Furthermore, in the column signal processing system according to Example 2, the potentials $VSL_0$ to $VSL_7$ of the eight signal lines 32, respectively, are handled by being divided into the potentials $VSL_0$ to $VSL_3$ of the four signal lines 32 in a first half and the potentials $VSL_4$ to $VSL_7$ of the four signal lines 32 in a second half.

FIG. 8 illustrates a reference voltage generation unit 160 that generates a reference voltage used in the column amplifier 140, the capacitance multiplexer 190, and the successive approximation register analog-to-digital converter 150. The reference voltage generation unit 160 includes a first amplifier unit 161, a second amplifier unit 162, and a third amplifier unit 163. The column amplifier 140 outputs a signal in a D phase. Therefore, sampling by the three capacitance elements ($195\_A$, $195\_B$, and $195\_C$) is performed only in the D phase. In contrast, comparison by a comparator 152 is continuously performed in both a P phase and the D phase. The potentials $VSL_0$ to $VSL_3$ of the signal lines 32 are subjected to analog-to-digital conversion in the immediately subsequent P phase, and the potentials $VSL_4$ to $VSL_7$ of the signal lines 32 are subjected to analog-to-digital conversion in the second D phase. In the second D phase, since the capacitance element 195B is used for the analog-to-digital conversion, an output of the column amplifier 140 at that time is sampled by available capacitance element $195\_C$ and capacitance element $195\_A$. At that time, the potentials $VSL_4$ to $VSL_7$ of the signal lines 32 different from the previous one us sampled by the capacitance element $195\_A$. By repeating this operation, the same capacitance element is not used for the potential VSL of a specific signal line 32.

The first amplifier unit 161 generates the reference voltage VR that defines a zero voltage of the output of the column amplifier 140. The reference voltage VR is supplied to the column amplifier 140 via a voltage line $L_1$. The second amplifier unit 162 supplies an output common mode reference voltage $V_{CM}$ of a preamplifier 151 to the capacitance multiplexer 190 via a voltage line $L_2$. The output common mode reference voltage $V_{CM}$ is also supplied to the successive approximation register analog-to-digital converter 150 via a voltage line $L_3$. The third amplifier unit 163 generates a high voltage VH, a medium voltage VM, and a low voltage VL to be used by a capacitance array unit ($C_{DAC}$) 155. The high voltage VH, the medium voltage VM, and the low voltage VL are supplied to the capacitance array unit ($C_{DAC}$) 155 via voltage lines $L_4$, $L_5$, and $L_6$.

In the P phase, the capacitance element 145 of the column amplifier 140 is charged, and in the D phase, the charge with which the capacitance element 145 is charged is used as a signal input on a negative side of the capacitance multiplexer (CMUX) 190. The capacitance multiplexer 190 is configured by differential. Switches $192\_A$, $192\_B$, and $192\_C$ on the input side short-circuit the differentials at the time of comparison of the comparator 152, and are not connected to a common node. In this manner, an input side of the capacitance multiplexer 190 is completely separated at the time of comparison of the comparator 152, so that settling of the capacitance array unit ($C_{DAC}$) 155 in the successive approximation register analog-to-digital converter 150 may be accelerated.

Switches 193$_{AP}$ and 193$_{AM}$, switches 193$_{BP}$ and 193$_{BM}$, and switches 193$_{CP}$ and 193$_{CM}$ on an output side of the capacitance multiplexer 190 are connected to the voltage line $L_2$ that transmits the output common mode reference voltage $V_{CM}$, and are turned on at the time of sampling. The output common mode reference voltage $V_{CM}$ is the same voltage as an input operation potential of the preamplifier 151.

The high voltage VH, the medium voltage VM, and the low voltage VL generated by the third amplifier unit 163 are the reference voltages of the capacitance array unit ($C_{DAC}$) 155. Since the capacitance array unit ($C_{DAC}$) 155 operates at a high speed when the comparator 152 compares, the high voltage VH and the low voltage VL are required to be able to respond at a high speed and to have a low impedance.

(Power Supply Voltage and Used Transistor)

Here, for a specification of a power supply voltage, for example, 2.8 V ($V_{DD}$_H) and 0.8 V ($V_{DD}$_L) are assumed. Among them, 2.8 V is the same as the voltage used in a pixel 20, and is used for a circuit of a high breakdown voltage transistor. Furthermore, 0.8 V is assumed to be a voltage used in a logic circuit. Since the potential VSL of the signal line 32 is 2 V or larger at maximum, this cannot be handled by a low breakdown voltage transistor. Therefore, the column amplifier 140 needs to include a high breakdown voltage transistor. Since the successive approximation register analog-to-digital converter 150 requires a high-speed comparison operation, this desirably includes a low breakdown voltage transistor. However, it is necessary to pay attention to a large leakage current of the low breakdown voltage transistor.

In the preamplifier 151 of the successive approximation register analog-to-digital converter 150, since channel leakage of a switch 1512 of auto-zero (offset cancellation due to input/output short-circuit) affects linearity, it is necessary to take a measure such as increasing a channel length L. Since gate leakage of the input differential pair of the comparator 152 might also affect a characteristic, it is sometimes necessary to suppress the leakage using the high breakdown voltage transistor.

Furthermore, when a plurality of power supplies is involved between loops of the successive approximation register analog-to-digital converter 150, an operation margin for absorbing variations between different power supplies is required, so that it is important to form using a single power supply. The high voltage VH and the low voltage VL are set to 0.8 V ($V_{DD}$_L) and the same voltage as ground, respectively, in order to sufficiently apply a gate voltage to the switches forming the capacitance array unit ($C_{DAC}$) 155. Since the output of the column amplifier 140 has a high voltage, all the switches forming the capacitance multiplexer 190 are formed using high breakdown voltage transistors.

(Regarding Level Diagram)

Figure 9:
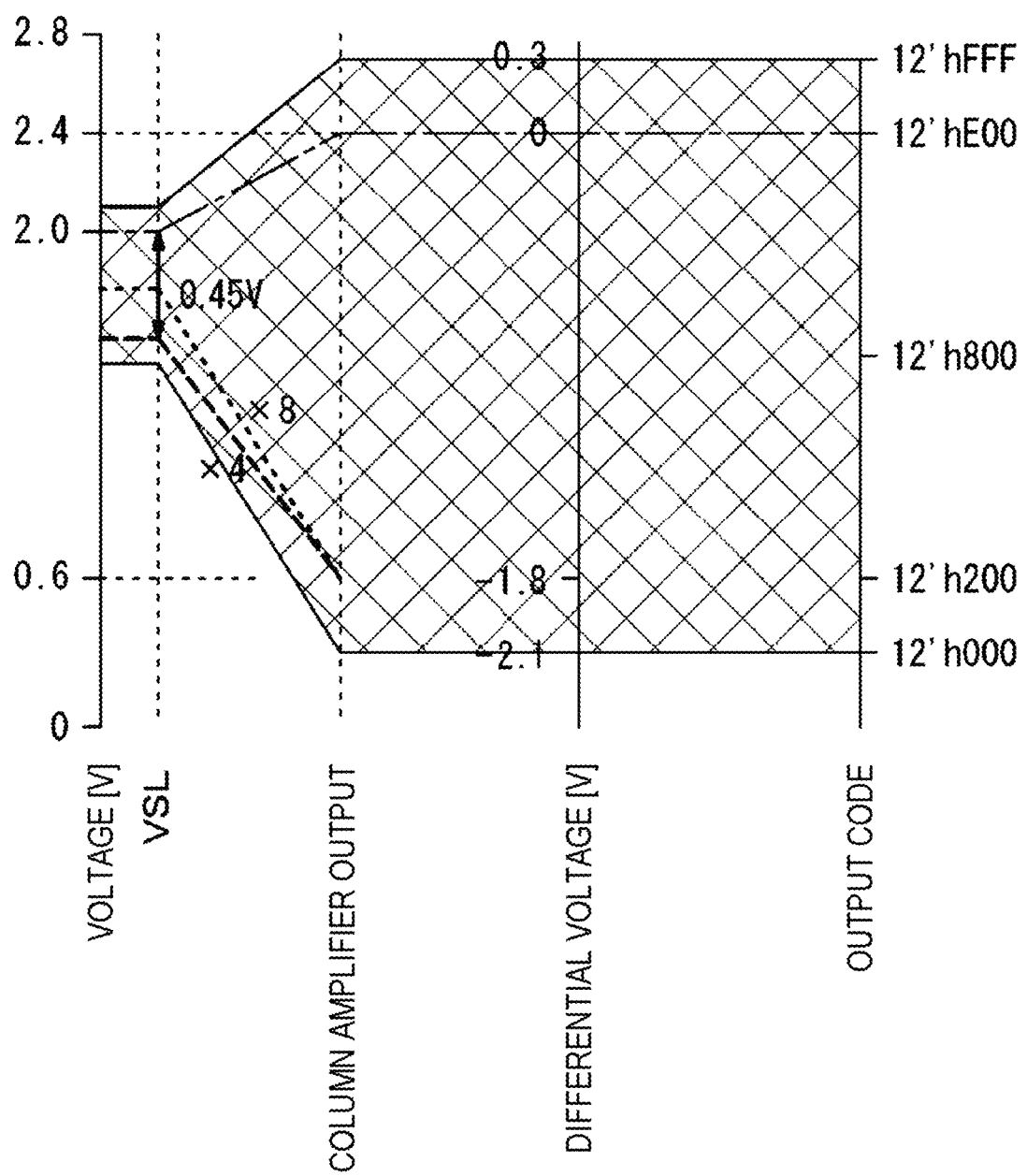
FIG. 9 is a diagram for explaining a level diagram.

FIG. 9 illustrates a level diagram. A voltage range of the potential VSL of the signal line 32 varies depending on a sensor specification, but here, it is assumed that the voltage drops according to brightness with 2 V as a reference and drops by 450 mV at the maximum. The potential VSL of the signal line 32 is amplified by the column amplifier 140; as a gain is higher, noise of the subsequent successive approximation register analog-to-digital converter 150 is suppressed, and noise of the column amplifier 140 itself is also reduced, so that it is desirable to take as large gain as possible. However, since the power supply voltage is 2.8 V, it is necessary to suppress the output of the column amplifier 140 within a range obtained by adding an operation range of the circuit and a margin to this.

Here, the gain is set to four times, and the range is 1.8 V with respect to 2.8 V. An input of the successive approximation register analog-to-digital converter 150 is a differential voltage, and a negative-side input is fixed to the reference voltage. When the pixel 20 has brightness of zero, the differential of 0 V is the input of the successive approximation register analog-to-digital converter 150, and a negative differential voltage is applied as the pixel becomes brighter (that is, the potential VSL of the signal line 32 decreases). A relationship with an output code of the successive approximation register analog-to-digital converter 150 is such that the differential of 1.8 V corresponds to ¾ full scale, and ⅞ full scale is output when 0 V is input.

For a small input signal, input conversion noise may be reduced by increasing the gain. As illustrated in FIG. 9, when the gain is set to eight times (×8), the input range is halved. Moreover, the gain may be increased; however, a contribution of the column amplifier 140 is dominant in the input conversion noise, so that an advantage of setting the gain larger than eight times is small.

(Regarding Timing)

All dynamic signals that drive the column signal processing system need to be implemented as differential signals. In a case where the column amplifier 140 side is a switch, a dummy for canceling injection using a differential signal is prepared. If this is not observed, a return of the control signal passes through a common power supply and the like, which might cause unexpected interference. Furthermore, regarding a gate signal of the switch (switch control signal), it is necessary to prevent the switches of different phases from being turned on at the same time (non-overlap).

Moreover, a switch control signal $S_D$ of a switch 143 of the column amplifier 140, a switch control signal $S_{IN0X}$ of a switch 191$_{-0x}$ (X=A, B, C) of the capacitance multiplexer 190, a switch control signal $S_{IN1X}$ of a switch 191$_{-1X}$, and a switch control signal $S_{VMIX}$ of a switch 1931$_{-X}$ are desirably delayed from other switch control signals while maintaining non-overlap.

Hereinafter, a specific configuration example of the column amplifier 140 and the successive approximation register analog-to-digital converter 150 is described.

(Configuration Example of Column Amplifier)

Figure 10:
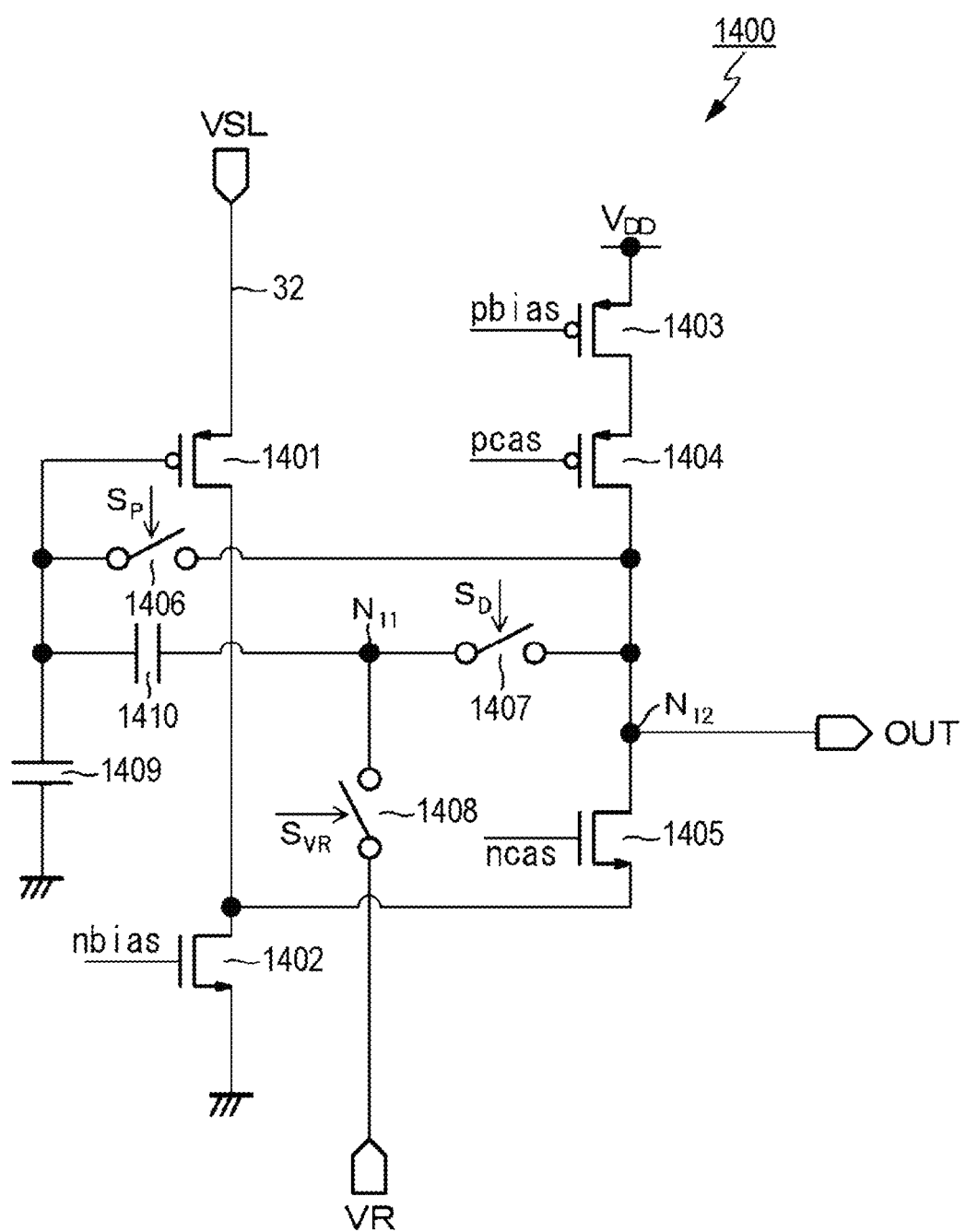
FIG. 10 is a circuit diagram illustrating an example of a configuration of a current reuse column amplifier.

Here, as an example of a specific configuration of the column amplifier 140, a current reuse column amplifier (CRCA) is illustrated. Since the current reuse column amplifier performs voltage amplification using a bias current of the signal line 32, a non-inverting column amplifier of low power consumption may be implemented. A circuit diagram of an example of a configuration of the current reuse column amplifier is illustrated in FIG. 10.

A current reuse column amplifier 1400 includes a current amplification transistor 1401, current source transistors 1402 and 1403, cascode transistors 1404 and 1405, switches 1406, 1407, and 1408, a reference side capacitance element 1409, and a feedback capacitance element 1410.

Here, a P-channel MOS field effect transistor is used, for example, as the current amplification transistor 1401, the current source transistor 1403, and the cascode transistor 1404. Furthermore, an N-channel MOS field effect transistor is used, for example, as the current source transistor 1402 and the cascode transistor 1405.

The current amplification transistor 1401 and the current source transistor 1402 are connected in series between the signal line 32 and a node of a reference potential (for example, ground) in this order. That is, a source electrode of the current amplification transistor 1401 is connected to the signal line 32. A predetermined bias voltage nbias is applied to a gate electrode of the current source transistor 1402. Therefore, the current source transistor 1402 applies a constant bias current corresponding to a predetermined bias voltage nbias to the signal line 32.

The current source transistor 1403, the cascode transistor 1404, and the cascode transistor 1405 are connected in series between a node of the power supply voltage $V_{DD}$ and a drain electrode of the current source transistor 1402 in this order. A predetermined bias voltage pbias is applied to a gate electrode of the current source transistor 1403, a predetermined bias voltage pcas is applied to a gate electrode of the cascode transistor 1404, and a predetermined bias voltage ncas is applied to a gate electrode of the cascode transistor 1405.

The switch 1406 is connected between a gate electrode of the current amplification transistor 1401 and a drain electrode of the cascode transistor 1404 (drain electrode of the cascode transistor 1405), and performs an on (closed)/off (open) operation according to a polarity of a switch control signal $S_P$.

The reference side capacitance element 1409 is connected between the gate electrode of the current amplification transistor 1401 and the node of the reference potential (for example, ground). One end of the feedback capacitance element 1410 is connected to the gate electrode of the current amplification transistor 1401.

A switch 1047 is connected between the other end of the feedback capacitance element 1410 and the drain electrode of the cascode transistor 1404 (the drain electrode of the cascode transistor 1405), and performs an on/off operation according to a polarity of a switch control signal $S_D$.

A switch 1408, one end of which is connected to a common connection node $N_{11}$ of the feedback capacitance element 1410 and the switch 1047, performs an on/off operation according to a polarity of a switch control signal $S_{VR}$. The reference voltage VR is applied to the other end of the switch 1408. Therefore, the switch 1408 selectively applies the reference voltage VR to the common connection node $N_{11}$ under the control of the switch control signal $S_{VR}$.

With the configuration described above, the current reuse column amplifier 1400 in which the source electrode of the current amplification transistor 1401 serves as a (+) input end, the gate electrode serves as a (−) input end, and a common connection node $N_{12}$ between the cascode transistor 1404 and the cascode transistor 1405 serves as an output end is configured. Since the current amplification transistor 1401 uses the bias current of the signal line 32, it is possible to efficiently perform voltage amplification.

In the current reuse column amplifier 1400 having the configuration described above, in a correspondence relationship with the column amplifier 140 illustrated in FIG. 6, the switch 1406 corresponds to the switch 142 in FIG. 6, the switch 1407 corresponds to the switch 143 in FIG. 6, and the switch 1408 corresponds to the switch 144 in FIG. 6. Furthermore, the reference side capacitance element 1409 corresponds to the capacitance element 146 having the capacitance value $C_S$, and the feedback capacitance element 1410 corresponds to the capacitance element 145 having the capacitance value $C_F$.

(Configuration Example of Successive Approximation Register Analog-to-Digital Converter)

The successive approximation register analog-to-digital converter 150 is excellent in power efficiency. A detailed circuit diagram of the successive approximation register analog-to-digital converter 150 is illustrated in FIG. 11.

The circuit of the successive approximation register analog-to-digital converter 150 is configured by complete differential. In a general successive approximation register analog-to-digital converter, an input capacitance for sampling an input voltage and a DAC capacitance ($C_{DAC}$) are often integrated, but here, they are separated for multiplexing.

Figure 11:
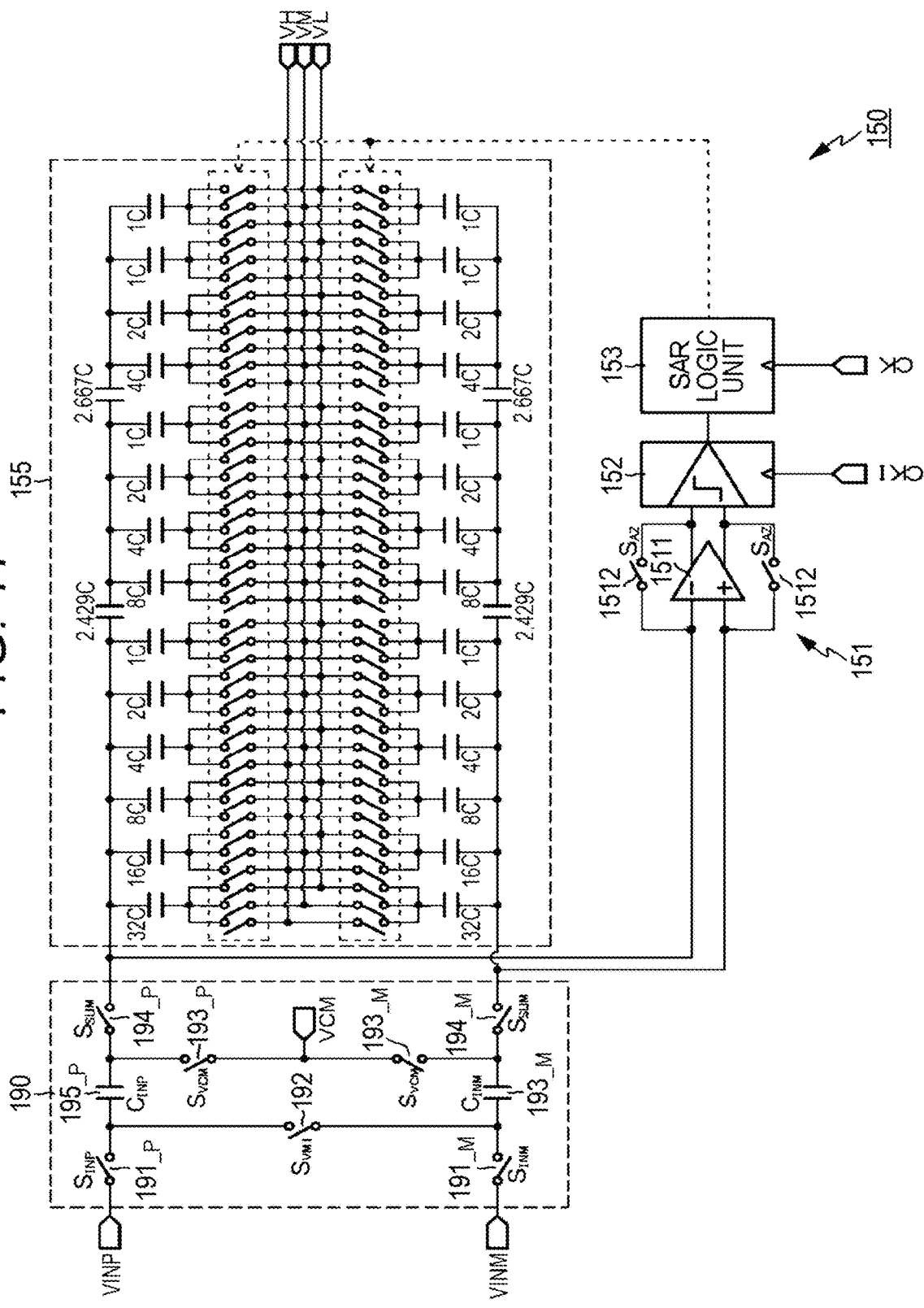
FIG. 11 is a detailed circuit diagram of a successive approximation register analog-to-digital converter.

FIG. 11 also illustrates an input capacitance unit (hereinafter, for convenience, referred to as a "capacitance multiplexer 190") that also serves as the capacitance multiplexer 190. Here, for the sake of simplicity, only one of a plurality of input capacitance units (190) is illustrated.

In the capacitance multiplexer 190, at the time of sampling, the switches 191$_{\_P}$ and 191$_{\_M}$ and the switches 193$_{\_P}$ and 193$_{\_M}$ are turned on (closed) to charge the capacitance elements 195$_{\_P}$ and 195$_{\_M}$ with charges. At the time of analog-to-digital conversion, the switch 192 and the switches 194$_{\_P}$ and 194$_{\_M}$ are turned on (closed), so that the capacitance multiplexer 190 is connected to the successive approximation register analog-to-digital converter 150.

The switch 192 is not connected to a specific reference potential, and only short-circuits differentials. This is to prevent fluctuation of an in-phase potential on the preamplifier 151 side due to an input in-phase potential. When an output in-phase potential of the preamplifier 151 and the output common mode reference voltage $V_{CM}$ are made the same, the input in-phase potential of the preamplifier 151 is always the same as the output common mode reference voltage $V_{CM}$.

Since the output of the column amplifier 140 is single-ended, the input in-phase potential fluctuates depending on the signal, but the input in-phase potential of the preamplifier 151 does not change, so that linearity is improved. The input side is the output (2.4 V to 0.6 V) of the column amplifier 140 and the reference voltage VR (2.4 V), but since the output common mode reference voltage $V_{CM}$ is fixed at about 0.5 V, the preamplifier 151 of a low voltage ($V_{DD}\_L$) may be used.

Although the input voltage is as high as 1.8 V, this is connected in series with the DAC capacitance ($C_{DAC}$) at the time of charge transfer, so that the input voltage of the preamplifier 151 is sufficiently attenuated. In this manner, by managing the in-phase/differential voltage, those other than the capacitance multiplexer 190 may be formed using a thin-film low-voltage transistor having a relatively thin film. Incidentally, all the switches of the capacitance multiplexer 190 are formed using thick-film high-voltage transistors having a relatively thick film.

All the switches of the preamplifier 151, the comparator 152, the SAR logic unit 153, and the DAC capacitance ($C_{DAC}$) in a comparison loop of the successive approximation register analog-to-digital converter 150 use the transistors of the same power supply voltage and the same film thickness, so that a high-speed operation becomes possible.

Furthermore, it is also important that, at the time of the operation of the SAR logic unit 153, this is completely separated from the column amplifier 140 and reference nodes other than the high voltage VH/low voltage VL. Since these nodes are not of so fast and low impedance, it is necessary not to affect the settling of the DAC capacitance ($C_{DAC}$).

As illustrated in FIG. 11, the capacitance array of the DAC capacitance ($C_{DAC}$) includes 14 capacitances grouped into six, four, and four. The first six-bit group is set as MSB, the middle four-bit group is set as LSB1, and the last four-bit group is set as LSB0. Each group is separated by a bridge capacitance element, and a weight per capacitance element changes. When the weight of MSB is set to 1, that of LSB1 is ⅛ and that of LSB0 is 1/32.

The weights of the most significant bit in LSB1 and the least significant bit in MSB have the same value to have redundancy. LSB0 similarly overlaps the most significant bit. Since the redundancy is of two bits in total, bit accuracy of the successive approximation register analog-to-digital converter 150 is finally of 12 bits. The redundancy is for compensating for insufficient settling of higher-order bits and for correcting nonlinearity due to variation in bridge capacitance elements.

In order to widen a range of redundancy, redundant bits should be inserted in a high-order as possible, but there is a trade-off of increasing the number of capacitance elements, and noise increases. Furthermore, in order to correct variation in bridge capacitance elements, the redundant bits need to be inserted into each group.

A capacitance value CB of the bridge capacitance element may be expressed by the following equation, where a ratio of weight to a lower-order group is set to α (<1), and the total capacitance value of the lower-order group (including further lower-order substantial capacitance value) is set to $C_{TL}$.

$$C_B = C_{TL}/\{(1/\alpha)-1\}$$

Determining the weight of the entire lower-order bits, when a ratio of the bridge capacitance element to a unit capacitance element is deviated, this causes nonlinearity. Therefore, it is necessary to implement so as not to deviate as much as possible, but it is difficult to make the ratio of the bridge capacitance element to the unit capacitance element the same because this is not integral multiple and there is no continuity in layout. Therefore, it is considered necessary to perform digital correction to multiply a non-integer correction coefficient for each group.

Second Embodiment of Present Disclosure

The two capacitance elements $195_{\_P}$ and $195_{\_M}$ in the capacitance unit 190 in FIG. 6 hold different charges, and when a subsequent side of the column amplifier 140 is seen from the signal line VSL, the capacitance elements $195_{\_P}$ and $195_{\_M}$ act as loads obtained by multiplying by the gain of the column amplifier 140, and settling time of VSL becomes long. Therefore, a capacitance unit 190 according to a second embodiment to be described below is subjected to a measure for shortening settling time.

Figure 12:
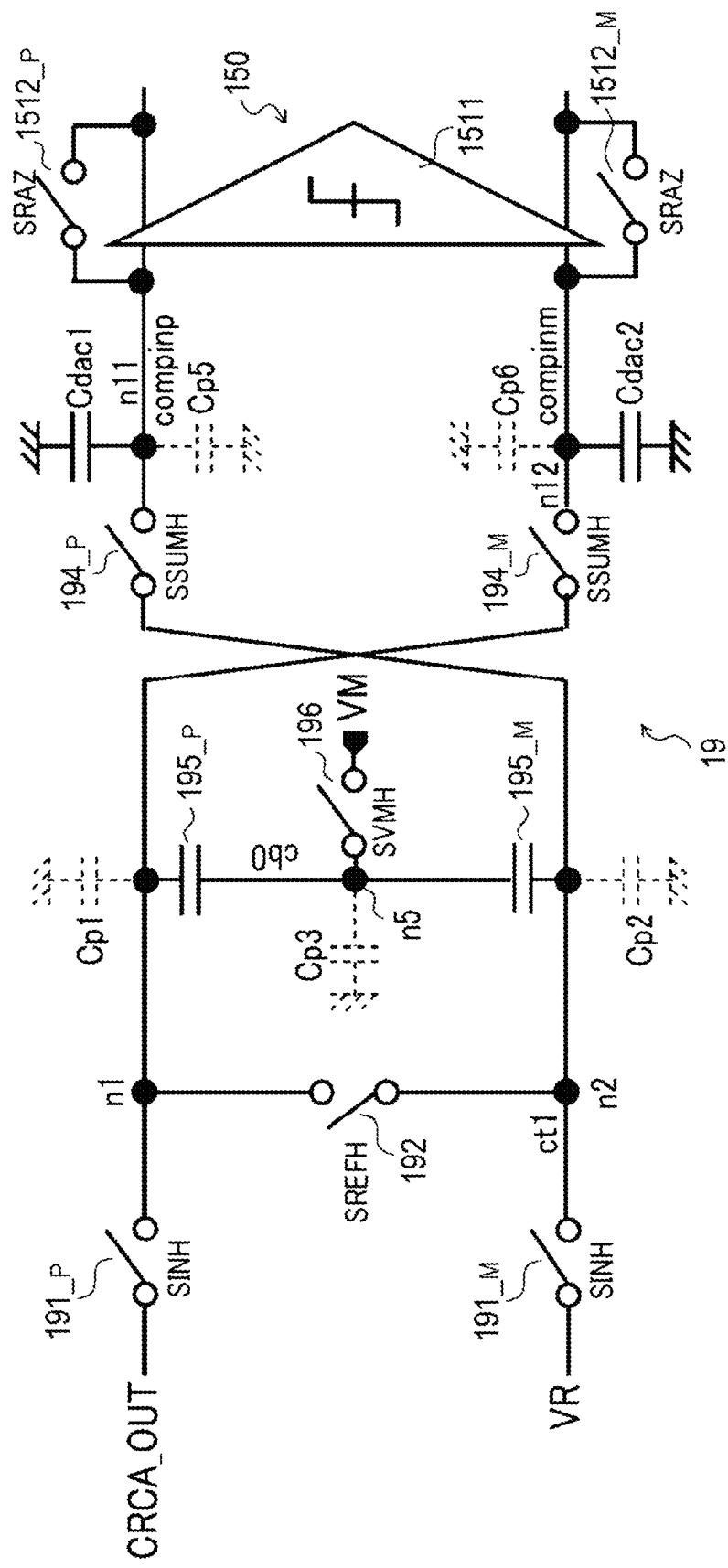
FIG. 12 is a circuit diagram illustrating an internal configuration of a capacitance unit according to a second embodiment.

FIG. 12 is a circuit diagram illustrating an internal configuration of the capacitance unit 19 according to the second embodiment. Although a column amplifier 140 connected to a preceding side of the capacitance unit 19 and a successive approximation register analog-to-digital converter 150 connected to a subsequent side of the capacitance unit 19 are not illustrated in FIG. 12, the column amplifier 140 and the successive approximation register analog-to-digital converter 150 similar to those in FIG. 6 may be connected to the capacitance unit 19 in FIG. 12.

The capacitance unit 19 in FIG. 12 includes a first node n1, a second node n2, a positive-side capacitance element $195_{\_P}$, a negative-side capacitance element $195_{\_M}$, a fourth switch 192, a fifth switch 196, a sixth switch $194_{\_P}$, a seventh switch $194_{\_M}$, a switch $191_{\_P}$, and a switch $191_{\_M}$.

A pixel signal from the column amplifier 140 is supplied to the first node n1. A reference voltage VR is supplied to the second node n2. More specifically, the pixel signal input from the column amplifier 140 is supplied to the first node n1 via the switch $191_{\_P}$. Furthermore, the reference voltage VR is supplied to the second node n2 via the switch $191_{\_M}$.

The positive-side capacitance element $195_{\_P}$ and the negative-side capacitance element $195_{\_M}$ are connected in series between the first node n1 and the second node n2. In this manner, by connecting the positive-side capacitance element 195p and the negative-side capacitance element $195_{\_M}$ in series between the first node n1 and the second node n2, it is possible to reduce an effective capacitance when a subsequent side of the column amplifier 140 is seen from a signal line VSL.

The fourth switch 192 selectively short-circuits the first node n1 and the second node n2. The fourth switch 192 performs an on/off operation according to a polarity of a switch control signal SREFH. When the fourth switch 192 is put into a closed state, the first node n1 and the second node n2 are short-circuited.

The fifth switch 196 selectively applies a common mode reference voltage VM of the successive approximation register analog-to-digital converter 150 to a common connection node n5 of the positive-side capacitance element $195_{\_P}$ and the negative-side capacitance element $195_{\_M}$. When the fifth switch 196 is put into a closed state, the common mode reference voltage VM is applied to the common connection node n5.

The sixth switch $194_{\_P}$ selectively connects the second node n2 to a first input end n11 of the successive approximation register analog-to-digital converter 150. The seventh switch $194_{\_M}$ selectively connects the first node n1 to a second input end n12 of the successive approximation register analog-to-digital converter 150.

Figure 13:
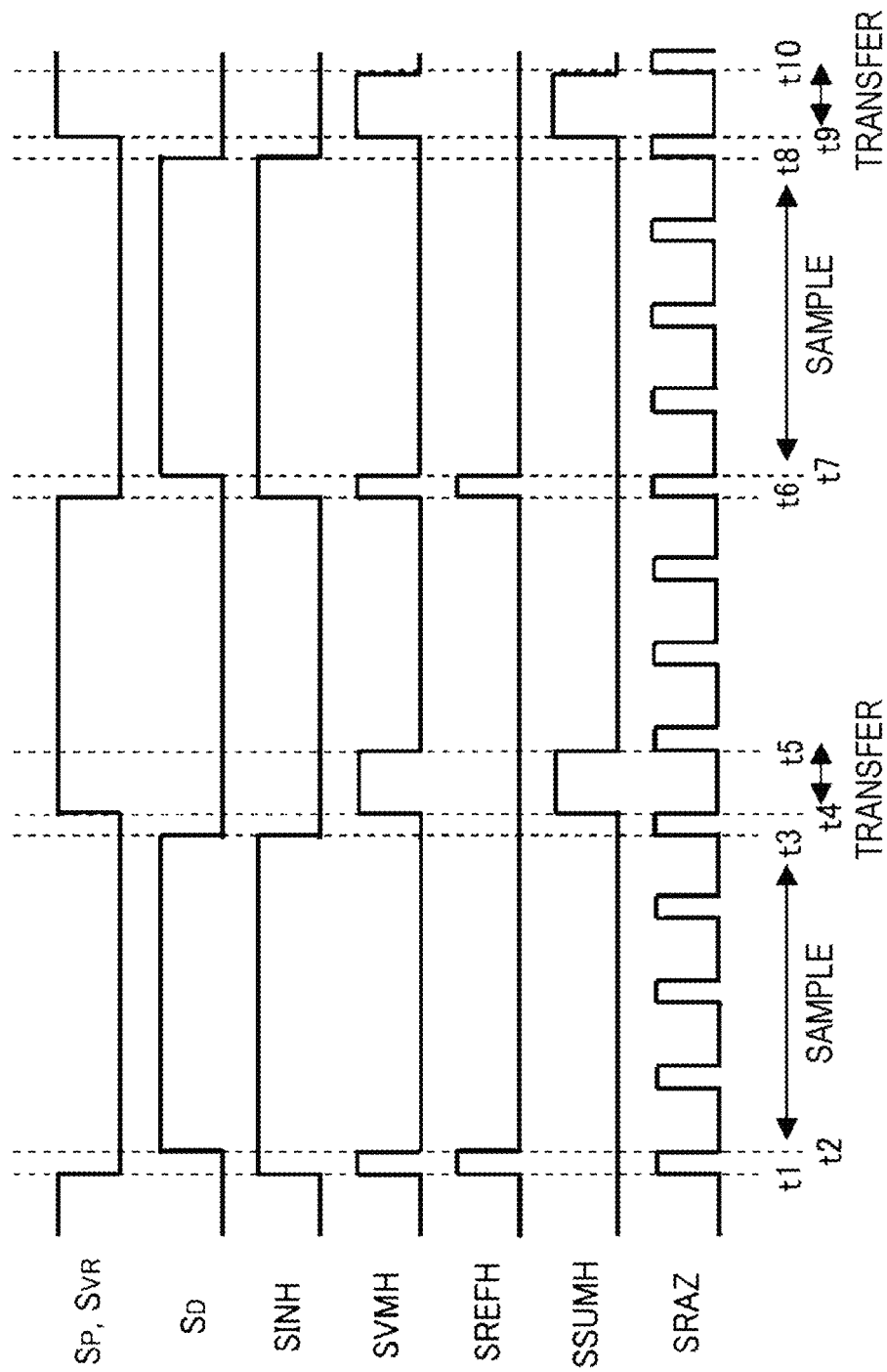
FIG. 13 is a timing chart of the capacitance unit in FIG. 12.

FIG. 13 is a timing chart of the capacitance unit 19 in FIG. 12. FIG. 13 illustrates timings of switch control signals $S_P$ and $S_{VR}$ of switches 142 and 144, respectively, and a switch control signal $S_D$ of a switch 143 in the column amplifier 140, a switch control signal SINH of the switches $191_{\_P}$ and $191_{\_M}$, a switch control signal SVMH of the fifth switch 196, the switch control signal SREFH of the fourth switch 192, a switch control signal SSUMH of the switches $194_{\_P}$ and $194_{\_M}$, and a switch control signal SRAZ of switches $1512_{\_P}$ and $1512_{\_M}$ in the successive approximation register analog-to-digital converter 150.

Time t1 to t2 in FIG. 13 is immediately before a period in which the capacitance unit 19 samples a voltage of the signal line VSL. Time t2 to t3 is the period in which the capacitance unit 19 samples the voltage of the signal line VSL. Time t3 to time t4 is immediately before a period in which the pixel signal held by the capacitance unit 19 is transferred to the successive approximation register analog-to-digital converter 150, and is an auto-zero (offset cancellation due to input/output short-circuit) period of a preamplifier 151. Time t4 to t5 is a period in which the pixel signal held by the capacitance unit 19 is transferred to the successive approximation register analog-to-digital converter 150. Time t5 to t6 is a period in which the successive approximation register analog-to-digital converter 150 performs AD conversion. A series of processing from time t1 to time t6 is repeated after time t6.

The switches $191_{\_P}$ and $191_{\_M}$ are put into a closed state in the period from time t1 to time t3. Therefore, the pixel signal output from the column amplifier 140 and the reference voltage VR are supplied to the capacitance unit 19 from immediately before the capacitance unit 19 samples the voltage of the signal line VSL to the end of a sampling period.

The fifth switch 196 is put into a closed state in the period from time t1 to time t2 and the period from time t4 to time t5. Therefore, the common mode reference voltage VM is applied to the common connection node n5 of the positive-side capacitance element $195_{\_P}$ and the negative-side capacitance element $195_{\_M}$ immediately before the period in which the capacitance unit 19 samples the voltage of the signal line VSL, and in the period in which the pixel signal held by the capacitance unit 19 is transferred to the successive approximation register analog-to-digital converter 150.

The fourth switch 192 is put into a closed state in the period from time t1 to time t2. Therefore, the first node n1 and the second node n2 are temporarily short-circuited immediately before the period in which the capacitance unit 19 samples the voltage of the signal line VSL.

The switches $194_{\_P}$ and $194_{\_M}$ are put into a closed state in the period from time t4 to time t5, and the pixel signal held by the capacitance unit 19 is transferred to the successive approximation register analog-to-digital converter 150.

As indicated by a broken line in FIG. 12, a parasitic capacitance Cp3 exists at the common connection node n5. Since the fifth switch 196 is turned on and applies the common mode reference voltage VM to the common connection node n5 at times t1 to t2 immediately before the capacitance unit 19 samples the voltage of the signal line VSL, a potential of the common connection node n5 may be determined without an influence of the parasitic capacitance Cp3 of the common connection node n5.

However, as indicated by broken lines in FIG. 12, parasitic capacitances Cp1 and Cp2 also exist at the first node n1 and the second node n2, respectively. Due to the parasitic capacitances Cp1 and Cp2, a common voltage of a differential signal transferred to the successive approximation register analog-to-digital converter 150 has input signal dependency.

Figure 14:
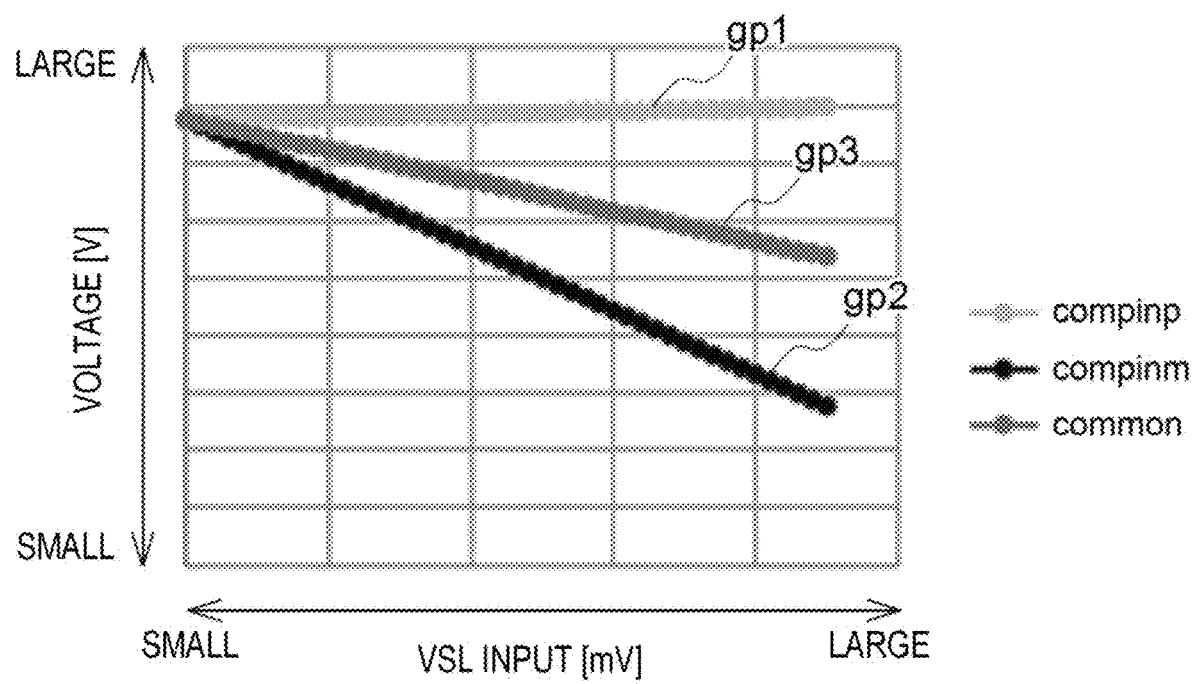
FIG. 14 is a diagram illustrating input signal dependency of a differential signal transferred from the capacitance unit to a successive approximation register analog-to-digital converter in FIG. 12.

FIG. 14 is a diagram illustrating the input signal dependency of the differential signal transferred from the capacitance unit 19 to the successive approximation register analog-to-digital converter 150 in FIG. 12. In FIG. 14, a voltage level of the signal line VSL is plotted along the abscissa, and a voltage level of the differential signal is plotted along the ordinate. FIG. 14 illustrates graphs gp1, gp2, and gp3 illustrating the input signal dependency of differential signals compinp and compinn of the nodes n11 and n12, and a common voltage of the differential signals, respectively. As illustrated, the larger the voltage level of the signal line VSL, the larger a fluctuation amount of the differential signals compinp and compinn and the common voltage common of the differential signal.

In this manner, in the capacitance unit 19 in FIG. 12, since the positive-side capacitance element $195_{\_P}$ and the negative-side capacitance element $195_{\_M}$ are connected in series between the first node n1 to which the pixel signal from the column amplifier 140 is input and the second node n2 to which the reference voltage VR is supplied, the effective capacitance when the subsequent side of the column amplifier 140 is seen from the signal line VSL may be reduced. However, since the parasitic capacitances Cp1 and Cp2 exist at the first node n1 and the second node n2, respectively, the common voltage of the differential signal transferred from the capacitance unit 19 to the successive approximation register analog-to-digital converter 150 might fluctuate due to the influence, and a measure therefor is described below.

(First Variation of Capacitance Unit 19)

Figure 15:
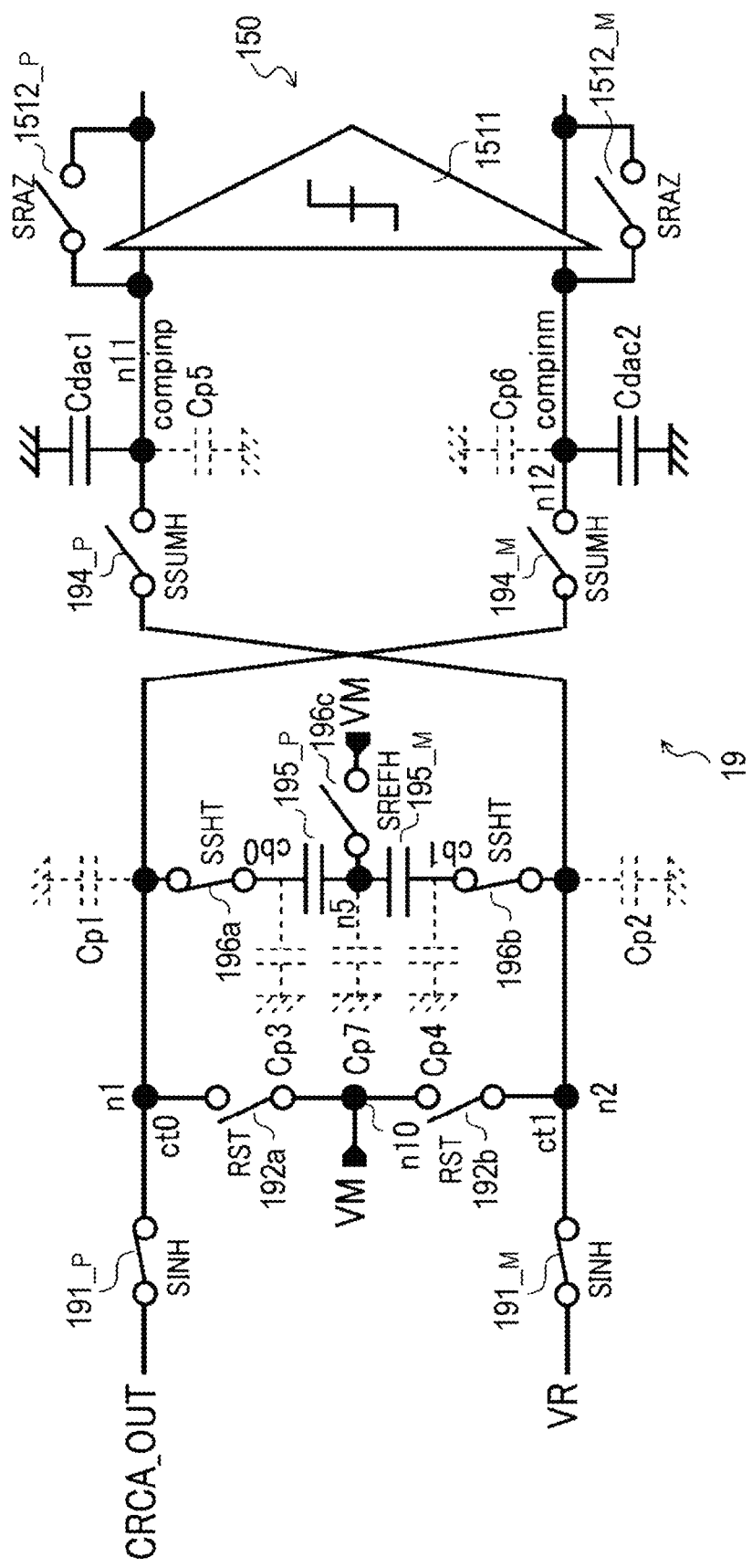
FIG. 15 is a circuit diagram illustrating an internal configuration of a capacitance unit according to a first variation of FIG. 12.

FIG. 15 is a circuit diagram illustrating an internal configuration of a capacitance unit 19 according to a first variation of FIG. 12. The capacitance unit 19 in FIG. 15 includes a positive-side capacitance element $195_{\_P}$, a negative-side capacitance element $195_{\_M}$, a 4a switch 192a, a 4b switch 192b, a 5a switch 196a, a 5b switch 196b, a 5c switch 196c, a sixth switch $194_{\_P}$, a seventh switch $194_{\_M}$, a switch $191_{\_P}$, and a switch $191_{\_M}$. Hereinafter, a difference from the capacitance unit 19 in FIG. 12 is mainly described.

The 4a switch 192a and the 4b switch 192b are connected in series between a first node n1 and a second node n2. When the 4a switch 192a and the 4b switch 192b are put into a closed state, the first node n1 and the second node n2 are short-circuited. A common mode reference voltage VM of a successive approximation register analog-to-digital converter 150 is applied to a common connection node n10 of the 4a switch 192a and the 4b switch 192b.

The 5a switch 196a, the positive-side capacitance element $195_{\_P}$, the negative-side capacitance element $195_{\_M}$, and the 5b switch 196b are connected in series in this order between the first node n1 and the second node n2. When the 5a switch 196a and the 5b switch 196b are put into a closed state, the positive-side capacitance element $195_{\_P}$ and the negative-side capacitance element $195_{\_M}$ are connected in series between the first node n1 and the second node n2.

The 5c switch 196c selectively applies the common mode reference voltage VM to a common connection node n5 of the positive-side capacitance element $195_{\_P}$ and the negative-side capacitance element $195_{\_M}$. When the 5c switch 196c is put into a closed state, the common mode reference voltage VM is applied to the common connection node n5.

Figure 16:
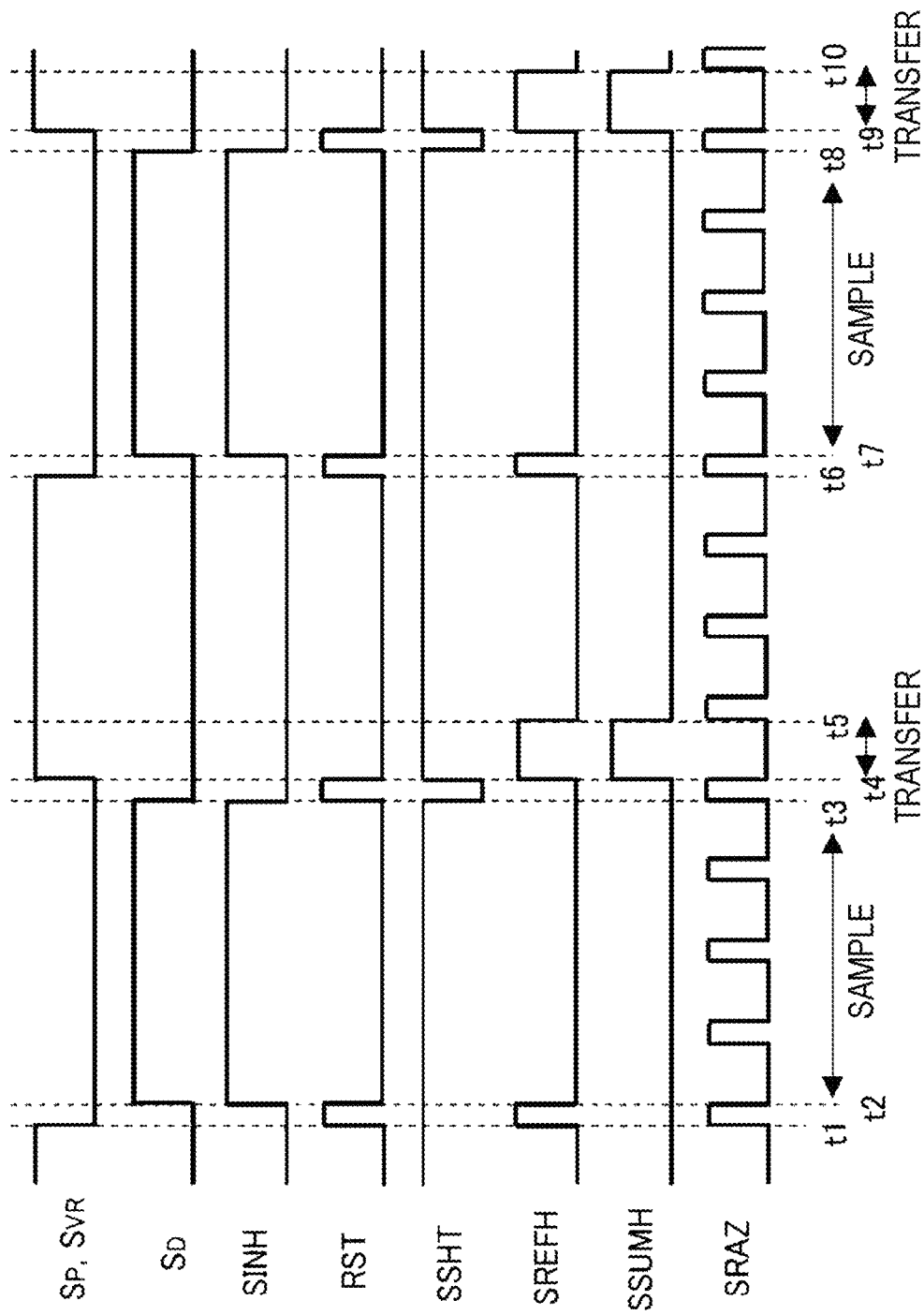
FIG. 16 is a timing chart of the capacitance unit in FIG. 15.

FIG. 16 is a timing chart of the capacitance unit 19 in FIG. 15. FIG. 16 includes switch control signals RST and SSHT in place of the switch control signal SVMH in FIG. 13. The switch control signal RST controls on/off of the 4a switch 192a and the 4b switch 192b. The switch control signal SSHT controls on/off of the 5a switch 196a and the 5b switch 196b. A switch control signal SREFH controls on/off of the 5c switch 196c.

The 4a switch 192a and the 4b switch 192b are put into a closed state in a period from time t1 to time t2 and a period from time t3 to time t4. Therefore, the first node n1 and the second node n2 are short-circuited and the common mode reference voltage VM is applied to these nodes immediately before a period in which the capacitance unit 19 samples a voltage of a signal line VSL and immediately before a period in which a pixel signal held by the capacitance unit 19 is transferred to the successive approximation register analog-to-digital converter 150.

The 5a switch 196a and the 5b switch 196b are put into an opened state in the period from time t3 to time t4. Therefore, immediately before the period in which the pixel signal held by the capacitance unit 19 is transferred to the successive approximation register analog-to-digital converter 150, the connection between the first node n1 and the positive-side capacitance element $195_{\_P}$ is temporarily interrupted, and the connection between the second node n2 and the negative-side capacitance element $195_{\_M}$ is temporarily interrupted. At that time, the 4a switch 192a and the 4b switch 192b are put into a closed state, so that parasitic capacitances Cp1 and Cp2 of the first node n1 and the second node n2 are reset by the common mode reference voltage VM.

The 5c switch 196c is put into a closed state in the period from time t1 to time t2 and a period from time t4 to time t5. Therefore, the common mode reference voltage VM is applied to the common connection node n5 of the positive-side capacitance element $195_{\_P}$ and the negative-side capacitance element $195_{\_M}$ immediately before the period in which the capacitance unit 19 samples the voltage of the signal line VSL, and in the period in which the pixel signal held by the capacitance unit 19 is transferred to the successive approximation register analog-to-digital converter 150.

Since the capacitance unit 19 in FIG. 15 includes the 4a switch 192a and the 4b switch 192b, it is possible to reset the parasitic capacitances Cp1 and Cp2 of the first node n1 and the second node n2 to set the first node n1 and the second node n2 to the common mode reference voltage VM immediately before the period in which the capacitance unit 19 samples the voltage of the signal line VSL and immediately before the period in which the pixel signal held by the capacitance unit 19 is transferred to the successive approximation register analog-to-digital converter 150. Therefore, it is possible to suppress fluctuation of a common voltage of a differential signal due to an influence of the parasitic capacitances Cp1 and Cp2 of the first node n1 and the second node n2, respectively.

Furthermore, in the capacitance unit 19 in FIG. 15, in a period in which the 4a switch 192a and the 4b switch 192b are put into a closed state and the parasitic capacitances of the first node n1 and the second node n2 are reset, the 5a switch 196a and the 5b switch 196b are put into an opened state so that charges of the positive-side capacitance element $195_P$ and the negative-side capacitance element $195_M$ are not affected by the parasitic capacitances Cp1 and Cp2 of the first node n1 and the second node n2, respectively.

However, due to an influence of a parasitic capacitance Cp3 of the common connection node n5 of the positive-side capacitance element $195_P$ and the 5a switch 196a and a parasitic capacitance Cp4 of the common connection node n5 of the negative-side capacitance element $195_M$ and the 5b switch 196b, the common voltage of the differential signal transferred from the capacitance unit 19 to the successive approximation register analog-to-digital converter 150 has input signal dependency.

Figure 17:
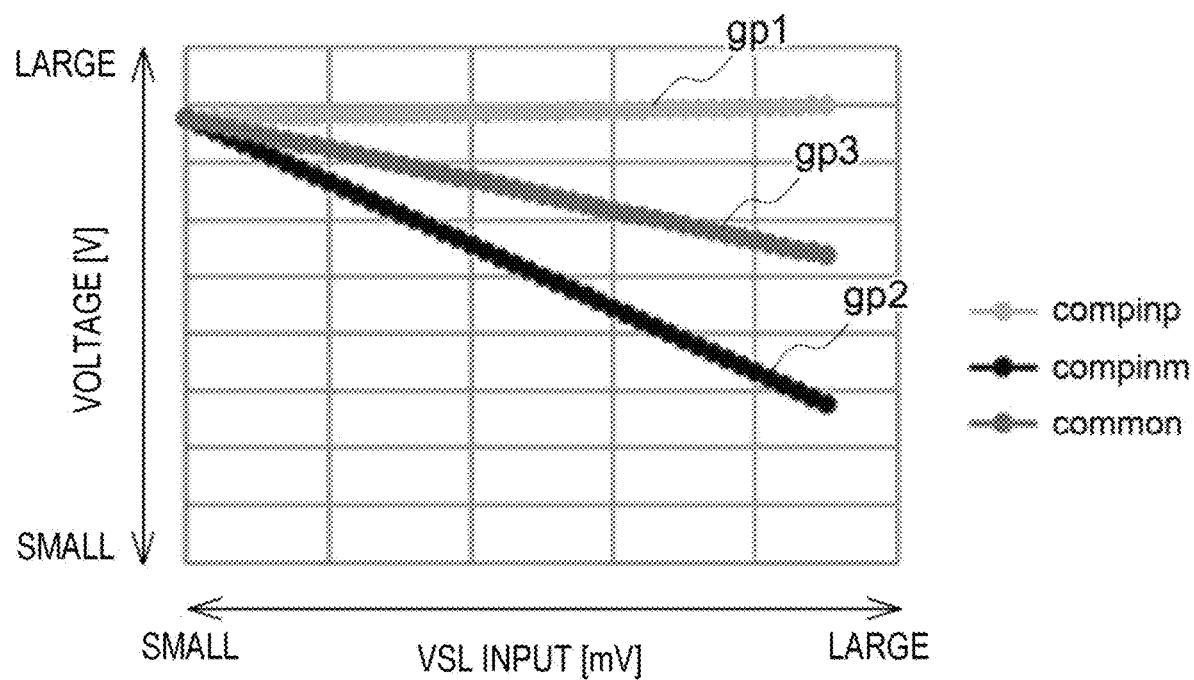
FIG. 17 is a diagram illustrating input signal dependency of a differential signal transferred from the capacitance unit to a successive approximation register analog-to-digital converter in FIG. 15.

FIG. 17 is a diagram illustrating the input signal dependency of the differential signal transferred from the capacitance unit 19 to the successive approximation register analog-to-digital converter 150 in FIG. 15. FIG. 17 illustrates graphs gp1, gp2, and gp3 illustrating the input signal dependency of differential signals compinp and compinn of the nodes n11 and n12, and a common voltage of the differential signals, respectively. As illustrated, in the capacitance unit 19 in FIG. 15, the common voltage of the differential signal has the input signal dependency similarly to the capacitance unit 19 in FIG. 12. Note that, magnitude of the parasitic capacitance may be adjusted by devising each circuit element forming the capacitance unit 19, a wiring pattern and the like. Therefore, even with the capacitance unit 19 having the circuit configuration in FIG. 15, the parasitic capacitances Cp3 and Cp4 may be reduced.

In this manner, in the capacitance unit 19 in FIG. 15, by providing the 4a switch 192a, the 4b switch 192b, the 5a switch 196a, and the 5b switch 196b, the parasitic capacitances Cp1 and Cp2 of the first node n1 and the second node n2 may be reset, and it is possible to prevent the charges in the positive-side capacitance element $195_P$ and the negative-side capacitance element $195_M$ from being affected by the parasitic capacitances Cp1 and Cp2. However, the common voltage of the differential signal transferred from the capacitance unit 19 to the successive approximation register analog-to-digital converter 150 might fluctuate by the parasitic capacitance Cp3 of the common connection node n5 of the positive-side capacitance element $195_P$ and the 5a switch 196a and the parasitic capacitance Cp4 of the common connection node n5 of the negative-side capacitance element $195_M$ and the 5b switch 196b, and a measure for this is hereinafter described.

(Second Variation of Capacitance Unit 19)

Figure 18:
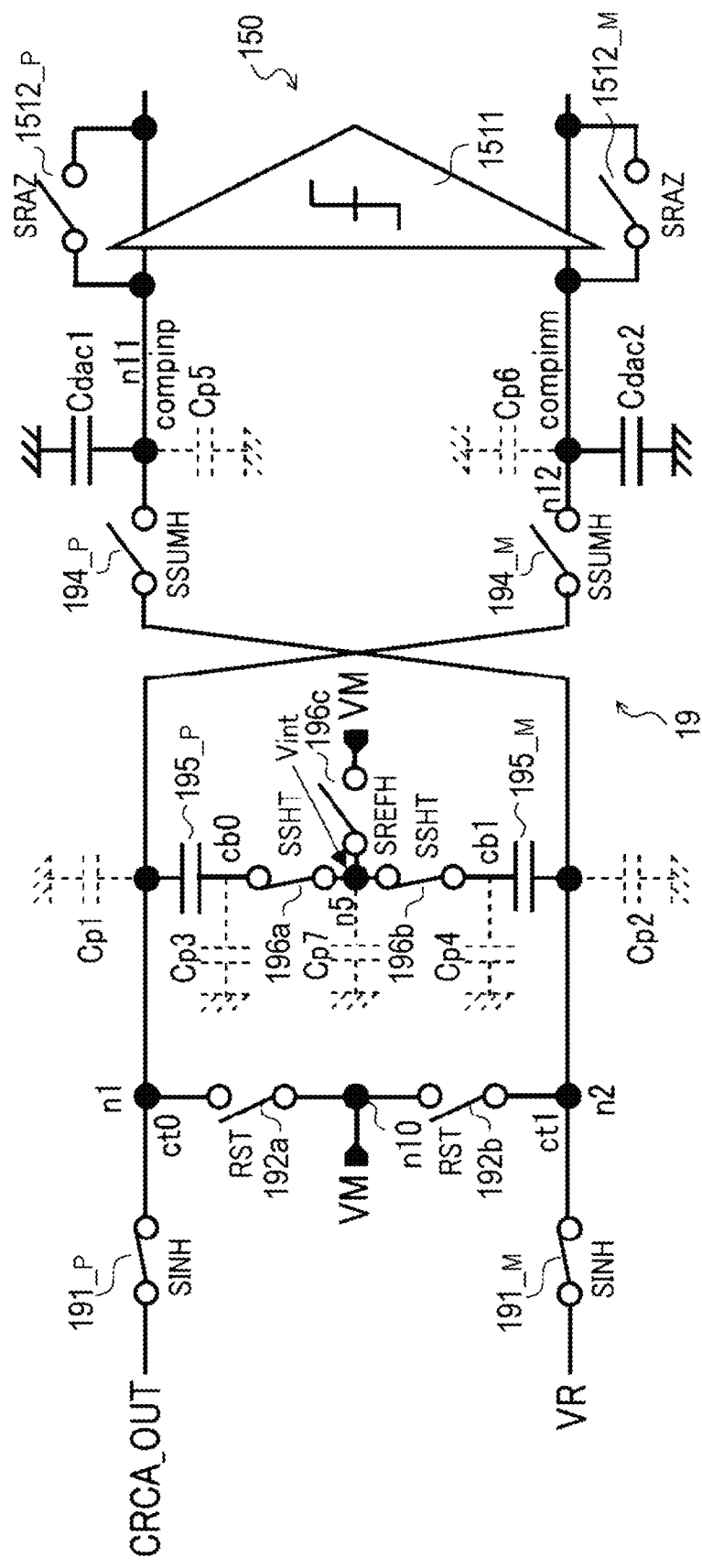
FIG. 18 is a circuit diagram illustrating an internal configuration of a capacitance unit according to a second variation of FIG. 12.

FIG. 18 is a circuit diagram illustrating an internal configuration of a capacitance unit 19 according to a second variation of FIG. 12. The capacitance unit 19 in FIG. 18 includes a positive-side capacitance element $195_P$, a negative-side capacitance element $195_M$, a 4a switch 192a, a 4b switch 192b, a 5a switch 196a, a 5b switch 196b, a 5c switch 196c, a sixth switch $194_P$, a seventh switch $194_M$, a switch $191_P$, and a switch $191_M$. Hereinafter, a difference from the capacitance unit 19 in FIG. 15 is mainly described.

The positive-side capacitance element $195_P$, the 5a switch 196a, the 5b switch 196b, and the negative-side capacitance element $195_M$ are connected in series in this order between a first node n1 and a second node n2. In this manner, in the capacitance unit 19 in FIG. 18, the connection order of the positive-side capacitance element $195_P$ and the 5a switch 196a is reversed, and the connection order of the negative-side capacitance element $195_M$ and the 5b switch 196b is reversed from those of the capacitance unit 19 in FIG. 15.

Figure 19:
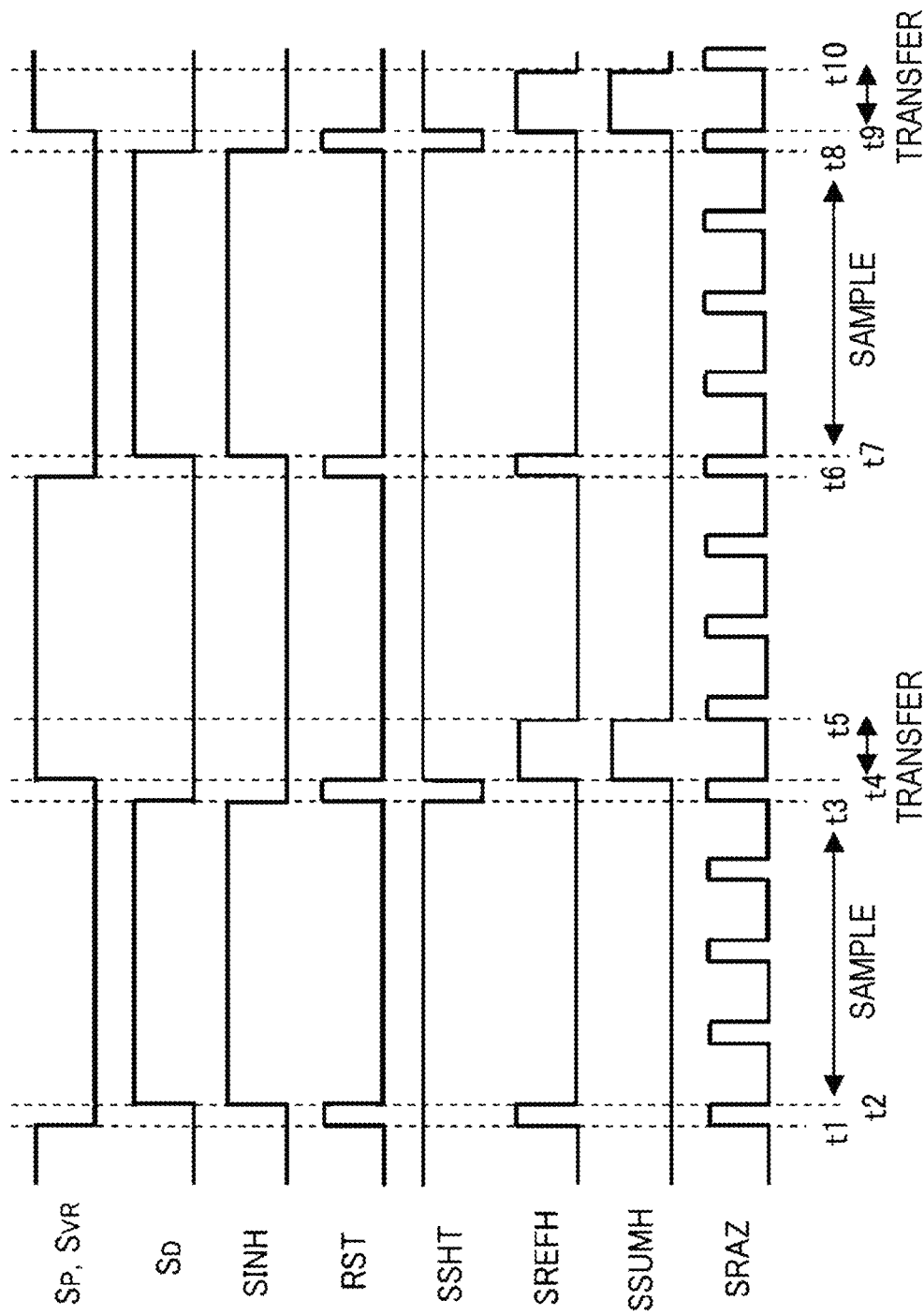
FIG. 19 is a timing chart of the capacitance unit in FIG. 18.

FIG. 19 is a timing chart of the capacitance unit 19 in FIG. 18. As may be seen by comparing FIG. 19 with FIG. 16, the capacitance unit 19 in FIG. 18 operates at the same timing as that of the capacitance unit 19 in FIG. 15, but performs a different circuit operation by reversing the connection order of the positive-side capacitance element $195_P$ and the 5a switch 196a and reversing the connection order of the negative-side capacitance element $195_M$ and the 5b switch 196b.

In a period (time t3 to time t4) in which the 4a switch 192a and the 4b switch 192b are put into a closed state and parasitic capacitances Cp1 and Cp2 of the first node n1 and the second node n2 are reset, the 5a switch 196a and the 5b switch 196b are put into an opened state. Therefore, pixel signals held by the positive-side capacitance element $195_P$ and the negative-side capacitance element $195_M$ are not affected by the parasitic capacitances Cp1 and Cp2 of the first node n1 and the second node n2.

Furthermore, since the 5a switch 196a, the 5b switch 196b, and the 5c switch 196c are put into a closed state in the period from time t1 to time t2, parasitic capacitances Cp3, Cp4, and Cp7 of a common connection node n3 of the positive-side capacitance element $195_P$ and the 5a switch 196a, a common connection node n4 of the negative-side capacitance element $195_M$ and the 5b switch 196b, and a common connection node n5 of the 5a switch 196a and the 5b switch 196b may be reset, and these nodes n3 to n5 may be set to a common mode reference voltage VM.

Figure 20:
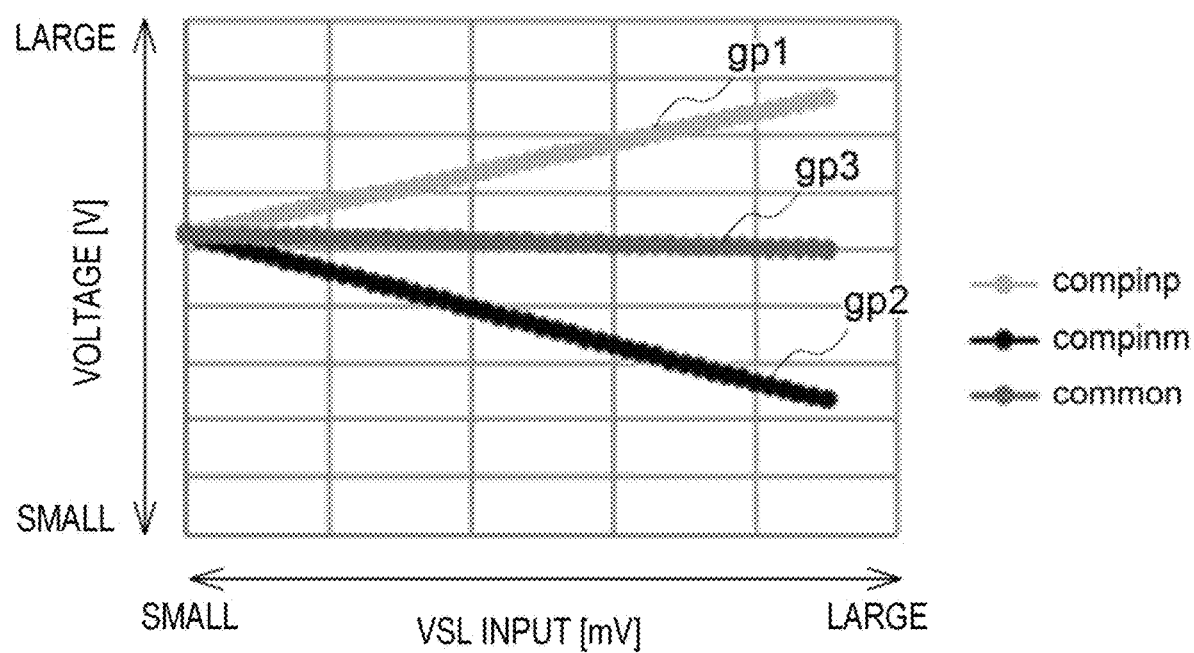
FIG. 20 is a diagram illustrating input signal dependency of a differential signal transferred from the capacitance unit to a successive approximation register analog-to-digital converter in FIG. 18.

FIG. 20 is a diagram illustrating the input signal dependency of the differential signal transferred from the capacitance unit 19 to the successive approximation register analog-to-digital converter 150 in FIG. 18. FIG. 20 illustrates graphs gp1, gp2, and gp3 illustrating the input signal dependency of differential signals compinp and compinn of the nodes n11 and n12, and a common voltage of the differential signals, respectively.

The capacitance unit 19 in FIG. 18 resets the parasitic capacitances Cp3, Cp4, and Cp7 by putting the 5a switch 196a, the 5b switch 196b, and the 5c switch 196c into a closed state, so that the input signal dependency of the common voltage common of the differential signal may be made smaller than that of the capacitance unit 19 in FIG. 15.

(Third Variation of Capacitance Unit 19)

In the capacitance unit 19 in FIGS. 15 and 18 described above, the reset of the positive-side capacitance element 195P and the negative-side capacitance element $195_M$ and the reset of the parasitic capacitance are performed at different timings, but these operations may be collectively performed.

Figure 21:
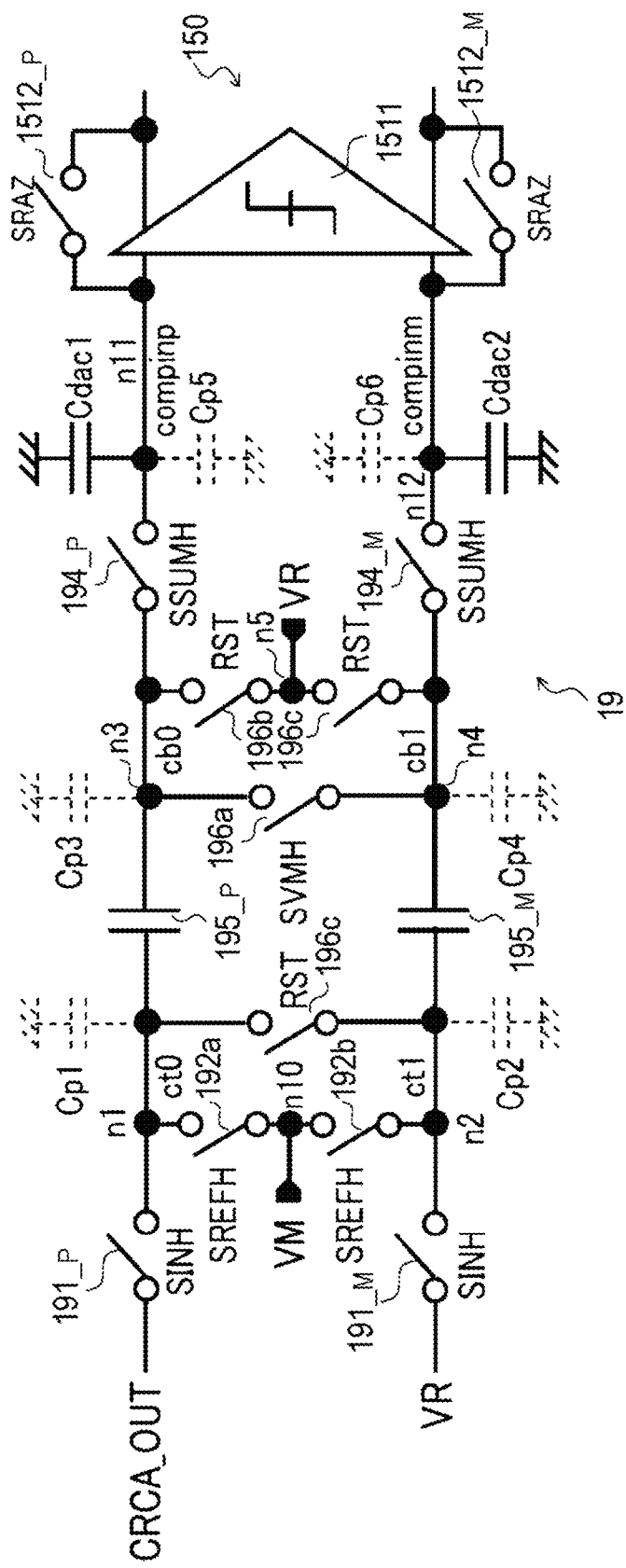
FIG. 21 is a circuit diagram illustrating an internal configuration of a capacitance unit according to a third variation of FIG. 12.

FIG. 21 is a circuit diagram illustrating an internal configuration of a capacitance unit 19 according to a third variation of FIG. 12. The capacitance unit 19 in FIG. 21 includes a positive-side capacitance element $195_{\_P}$, a negative-side capacitance element $195_{\_M}$, a 4a switch 192a, a 4b switch 192b, a 4c switch 192c, a 5a switch 196a, a 5b switch 196b, a 5c switch 196c, a sixth switch $194_{\_P}$, a seventh switch $194_{\_M}$, a switch $191_{\_P}$, and a switch $191_{\_M}$. Hereinafter, a difference from the capacitance unit 19 in FIG. 18 is mainly described.

The positive-side capacitance element $195_{\_P}$ in FIG. 21 is connected between a first node n1 and a third node n3. The negative-side capacitance element $195_{\_M}$ is connected between a second node n2 and a fourth node n4. A pixel signal from the column amplifier 140 is supplied to the first node n1. A reference voltage VR is supplied to the second node n2.

The 4a switch 192a and the 4b switch 192b are connected in series between the first node n1 and the second node n2. When the 4a switch 192a and the 4b switch 192b are put into a closed state, the first node n1 and the second node n2 are short-circuited, and a common mode reference voltage VM is applied to the nodes.

The 4c switch 192c is connected between the first node n1 and the second node n2. When the 4c switch 192c is put into a closed state, the first node n1 and the second node n2 are short-circuited.

The 5a switch 196a is connected between the third node n3 and the fourth node n4. When the 5a switch 196a is put into a closed state, the third node n3 and the fourth node n4 are short-circuited.

The 5b switch 196b and the 5c switch 196c are connected in series between the third node n3 and the fourth node n4. When the 5b switch 196b and the 5c switch 196c are put into a closed state, the 5b switch 196b and the 5c switch 196c are short-circuited, and the common mode reference voltage VM is applied to these nodes.

Figure 22:
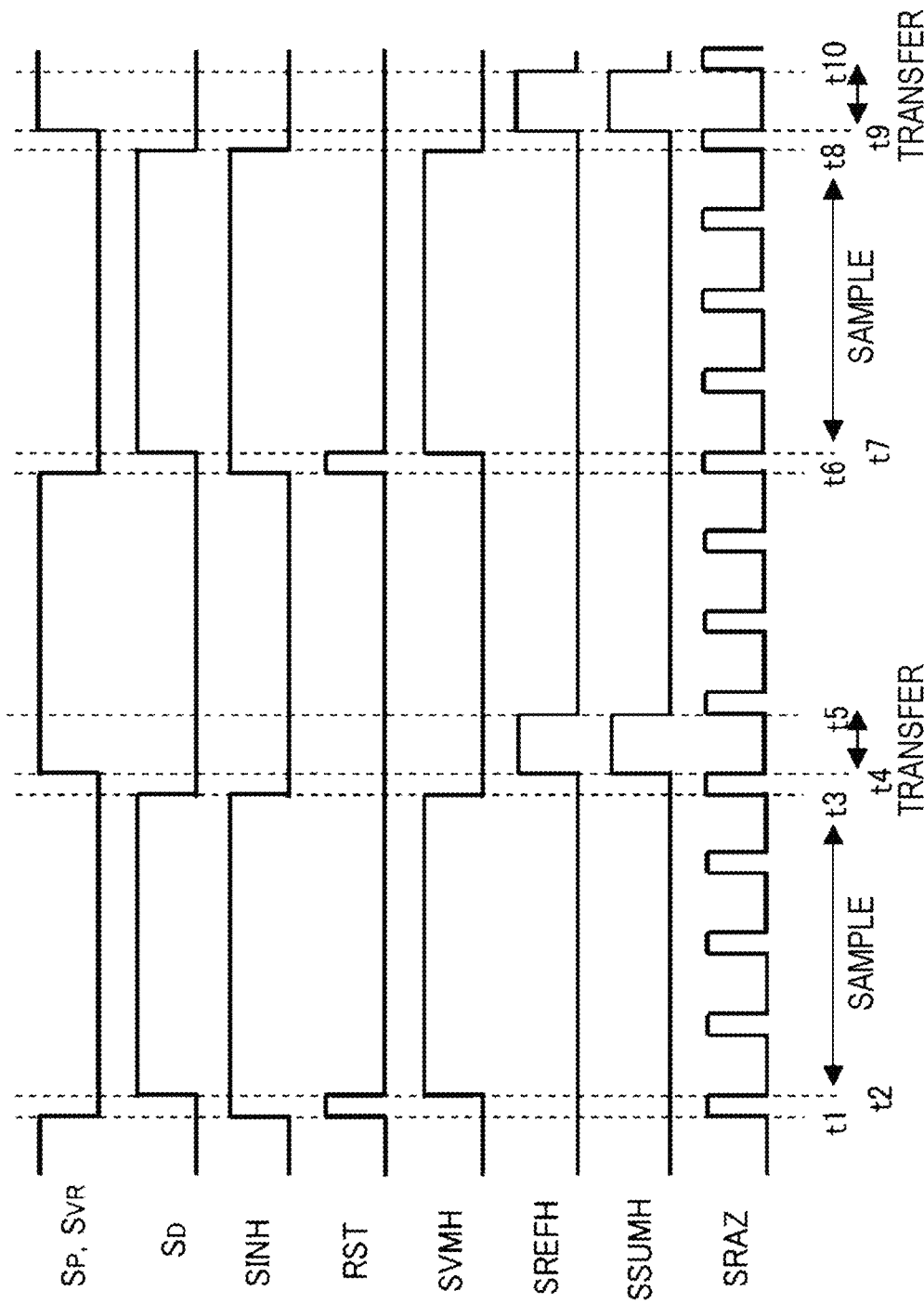
FIG. 22 is a timing chart of the capacitance unit in FIG. 21.

FIG. 22 is a timing chart of the capacitance unit 19 in FIG. 21. A switch control signal RST controls on/off of the 4c switch 192c, the 5b switch 196b, and the 5c switch 196c. A switch control signal SVMH controls on/off of the 5a switch 196a. A switch control signal SREFH controls on/off of the 4a switch 192a and the 4b switch 192b.

The 4c switch 192c, the 5b switch 196b, and the 5c switch 196c are put into a closed state in a period from time t1 to time t2. When the 4c switch 192c is put into a closed state, the first node n1 and the second node n2 are short-circuited. When the 5b switch 196b and the 5c switch 196c are put into a closed state, the third node n3 and the fourth node n4 are short-circuited, and the common mode reference voltage VM is applied. Therefore, a parasitic capacitance Cp3 of the third node n3 and a parasitic capacitance Cp4 of the fourth node n4 are reset.

The 5a switch 196a is put into a closed state in a period from time t2 to time t3, and when the 5a switch 196a is put into a closed state, the third node n3 and the fourth node n4 are short-circuited.

The 4a switch 192a and the 4b switch 192b are put into a closed state in a period from time t4 to time t5, and when the 4a switch 192a and the 4b switch 192b are put into a closed state, the first node n1 and the second node n2 are short-circuited and the common mode reference voltage VM is applied.

In the capacitance unit 19 in FIG. 21, the input and output of the positive-side capacitance element $195_{\_P}$ are set to the first node n1 and the third node n3, the input and output of the negative-side capacitance element $195_{\_M}$ are set to the second node n2 and the fourth node n4, and the positive-side capacitance element $195_{\_P}$ and the negative-side capacitance element $195_{\_M}$ are separately provided with input and output nodes. Since the reference voltage VR is supplied to the first node n1 and the second node n2 immediately before a period in which the capacitance unit 19 samples a voltage of a signal line VSL, parasitic capacitances Cp1 and Cp2 of the first node n1 and the second node n2 are automatically reset. Therefore, an operation of resetting the parasitic capacitances Cp1 and Cp2 becomes unnecessary.

Figure 23:
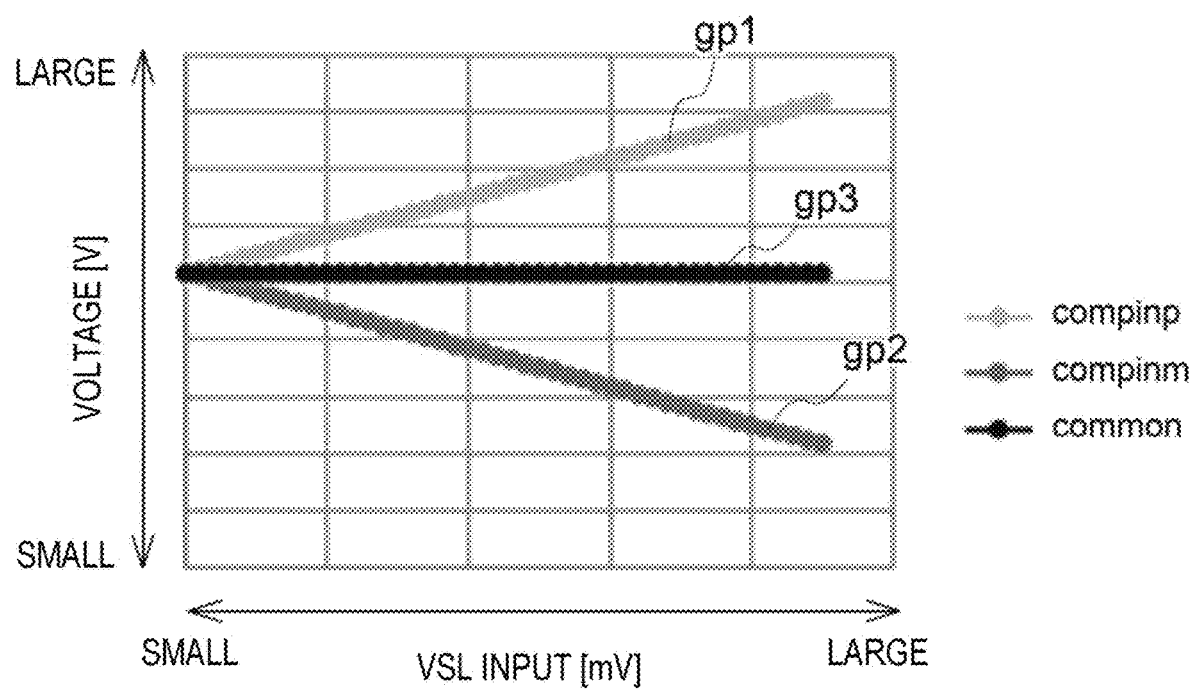
FIG. 23 is a diagram illustrating input signal dependency of a differential signal transferred from the capacitance unit to a successive approximation register analog-to-digital converter in FIG. 21.

FIG. 23 is a diagram illustrating the input signal dependency of the differential signal transferred from the capacitance unit 19 to the successive approximation register analog-to-digital converter 150 in FIG. 21. FIG. 23 illustrates graphs gp1, gp2, and gp3 illustrating the input signal dependency of differential signals compinp and compinn of the nodes n11 and n12, and a common voltage of the differential signals, respectively.

Since the capacitance unit 19 in FIG. 21 sets the input and output of the positive-side capacitance element $195_{\_P}$ and the negative-side capacitance element $195_{\_M}$ to separate nodes, it is possible to reset the parasitic capacitances Cp1 and Cp2 of the first node n1 and the second node n2 immediately before the period in which the capacitance unit 19 samples the voltage of the signal line VSL, and it is possible that the parasitic capacitances Cp3 and Cp4 of the third node n3 and the fourth node n4 are not reset immediately before a period in which the pixel signal held by the capacitance unit 19 is transferred to the successive approximation register analog-to-digital converter 150. Furthermore, input signal dependency of the common voltage of the differential signal may also be reduced.

(Fourth Variation of Capacitance Unit 19)

Each of the capacitance units 19 described above uses the common mode reference voltage VM when transferring the pixel signal from the capacitance unit 19 to the successive approximation register analog-to-digital converter 150. Since the common mode reference voltage VM is commonly used in all the columns, when the common mode reference voltage VM fluctuates at the time of AD conversion in another column, there might be an influence. Therefore, it is also conceivable not to use the common mode reference voltage VM at the time of transfer of the pixel signal.

Figure 24:
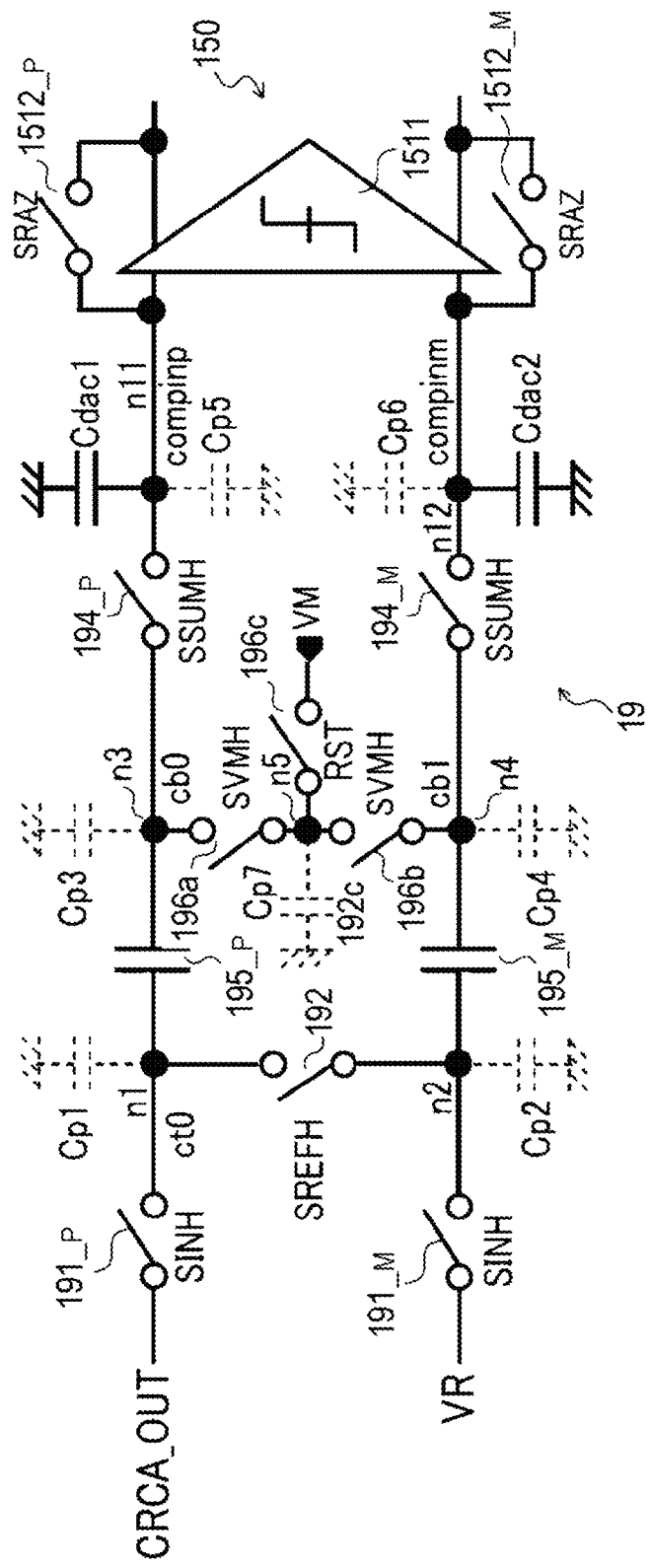
FIG. 24 is a circuit diagram illustrating an internal configuration of a capacitance unit according to a fourth variation of FIG. 12.

FIG. 24 is a circuit diagram illustrating an internal configuration of a capacitance unit 19 according to a fourth variation of FIG. 12. The capacitance unit 19 in FIG. 24 includes a positive-side capacitance element $195_{\_P}$, a negative-side capacitance element $195_{\_M}$, a fourth switch 192, a 5a switch 196a, a 5b switch 196b, a 5c switch 196c, a sixth switch $194_{\_P}$, a seventh switch $194_{\_M}$, a switch $191_{\_P}$, and a switch $191_{\_M}$. Hereinafter, a difference from the capacitance unit 19 in FIG. 21 is mainly described.

The fourth switch 192 is connected between a first node n1 and a second node n2. When the fourth switch 192 is put into a closed state, the first node n1 and the second node n2 are short-circuited.

The 5a switch 196a and the 5b switch 196b are connected in series between a third node n3 and a fourth node n4. When the 5a switch 196a and the 5b switch 196b are put into a closed state, the third node n3 and the fourth node n4 are short-circuited.

The 5c switch 196c selectively applies the common mode reference voltage VM of the successive approximation register analog-to-digital converter 150 to a common connection node n5 of the 5a switch 196a and the 5b switch 196b. When the 5c switch 196c is put into a closed state, the common mode reference voltage VM is applied to the common connection node n5.

Figure 25:
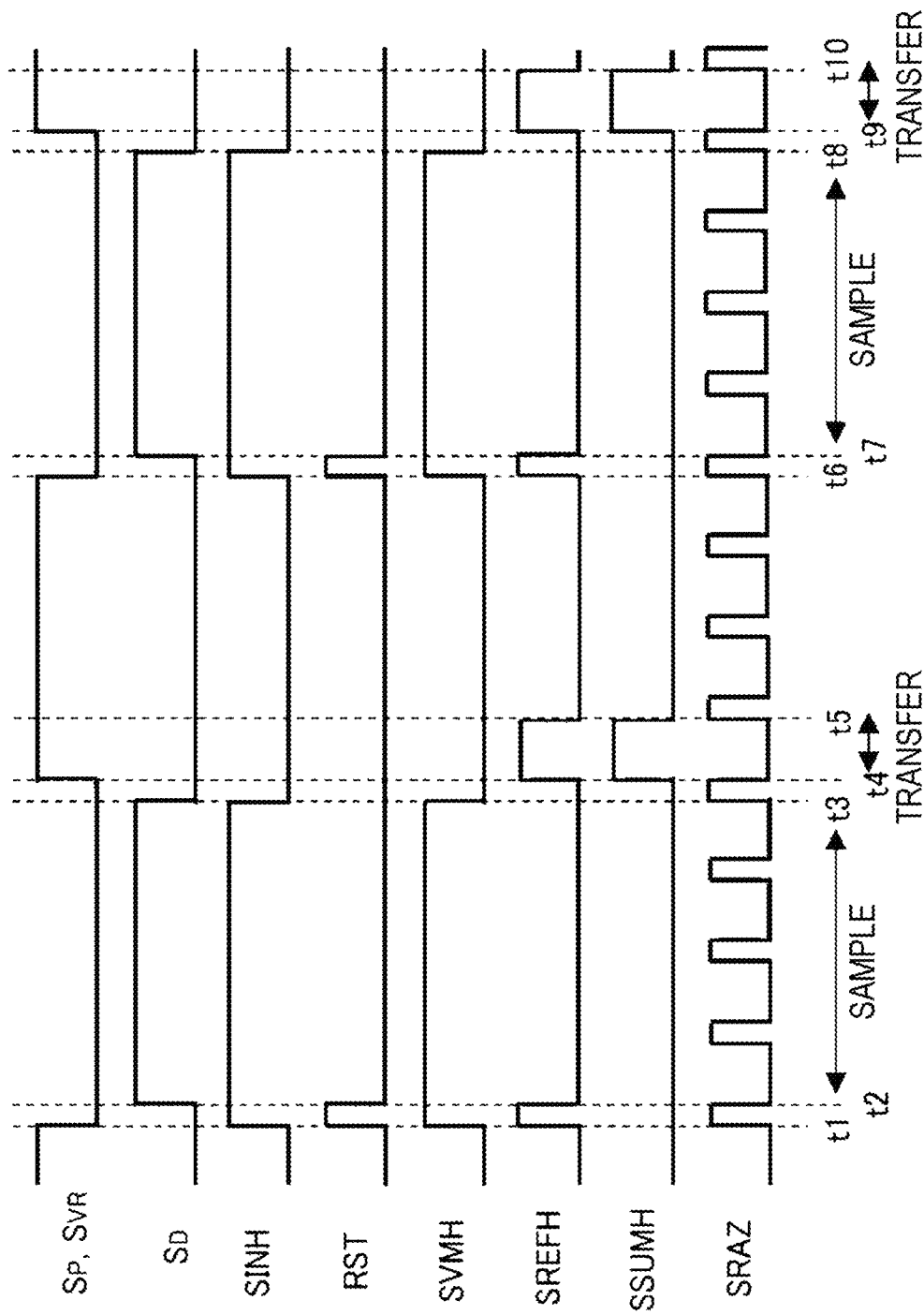
FIG. 25 is a timing chart of the capacitance unit in FIG. 24.

FIG. 25 is a timing chart of the capacitance unit 19 in FIG. 24. A switch control signal SVMH controls on/off of the 5a switch 196a and the 5b switch 196b. A switch control signal SREFH controls on/off of the fourth switch 192.

The fourth switch 192 is put into a closed state in the period from time t1 to time t2. Therefore, the first node n1 and the second node n2 are short-circuited immediately before a period in which the capacitance unit 19 samples a voltage of a signal line VSL.

Furthermore, the 5a switch 196a and the 5b switch 196b are put into a closed state in a period from time t1 to time t3, and the 5c switch 196c is put into a closed state in a period from time t1 to time t2. Therefore, the third node n3 and the fourth node n4 are short-circuited immediately before the period in which the capacitance unit 19 samples the voltage of the signal line VSL, and the common mode reference voltage VM is applied. Therefore, parasitic capacitances Cp3, Cp4, and Cp1 of the third node n3, the fourth node n4, and the common connection node n5, respectively, are reset.

In contrast, the common mode reference voltage VM is not applied to the third node n3 and the fourth node n4 immediately before (t3 to t4) a period in which the pixel signal held by the capacitance unit 19 is transferred to the successive approximation register analog-to-digital converter 150. Therefore, even if the common mode reference voltage VM fluctuates due to AD conversion of another column, there is no influence. However, by the influence of the parasitic capacitances Cp1 and Cp2 of the first node n1 and the second node n2, the common voltage of the differential signal transferred to the successive approximation register analog-to-digital converter might fluctuate.

Figure 26:
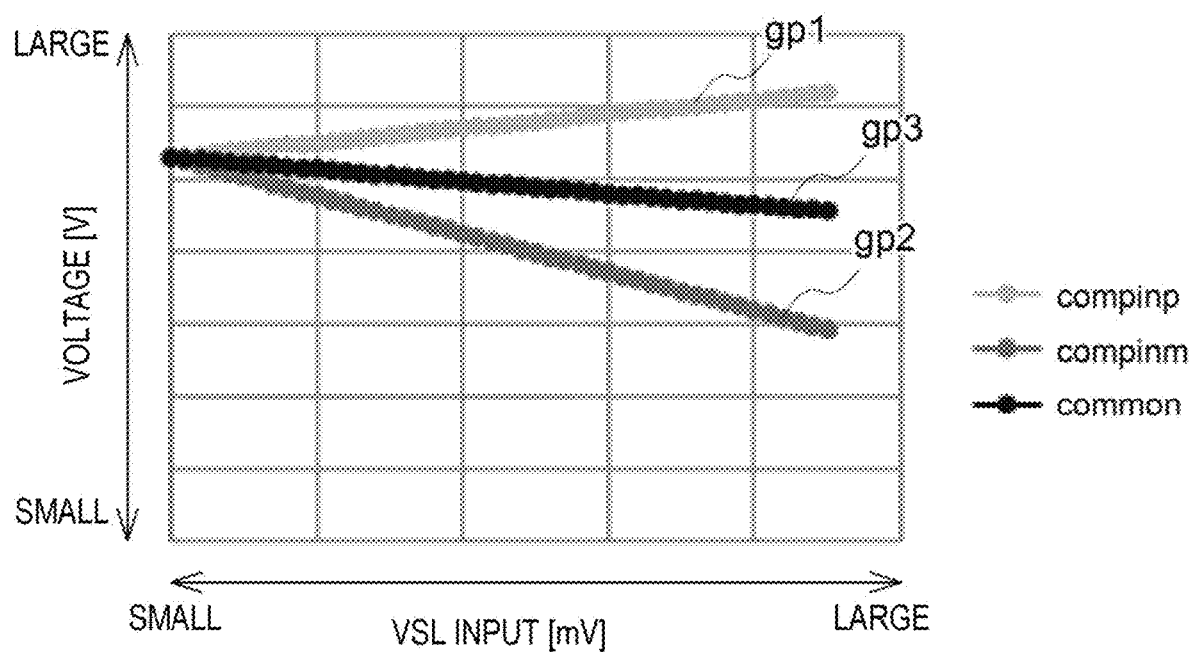
FIG. 26 is a diagram illustrating input signal dependency of a differential signal transferred from the capacitance unit to a successive approximation register analog-to-digital converter in FIG. 24.

FIG. 26 is a diagram illustrating the input signal dependency of the differential signal transferred from the capacitance unit 19 to the successive approximation register analog-to-digital converter 150 in FIG. 24. FIG. 26 illustrates graphs gp1, gp2, and gp3 illustrating the input signal dependency of differential signals compinp and compinn of the nodes n11 and n12, and a common voltage of the differential signals, respectively.

In the capacitance unit 19 in FIG. 24, when transferring the pixel signal to the successive approximation register analog-to-digital converter 150, the common voltage of the differential signal transferred to the successive approximation register analog-to-digital converter 150 might fluctuate by the influence of the parasitic capacitances Cp1 and Cp2 of the first node n1 and the second node n2. A measure for this is hereinafter described.

(Fifth Variation of Capacitance Unit 19)

Figure 27:
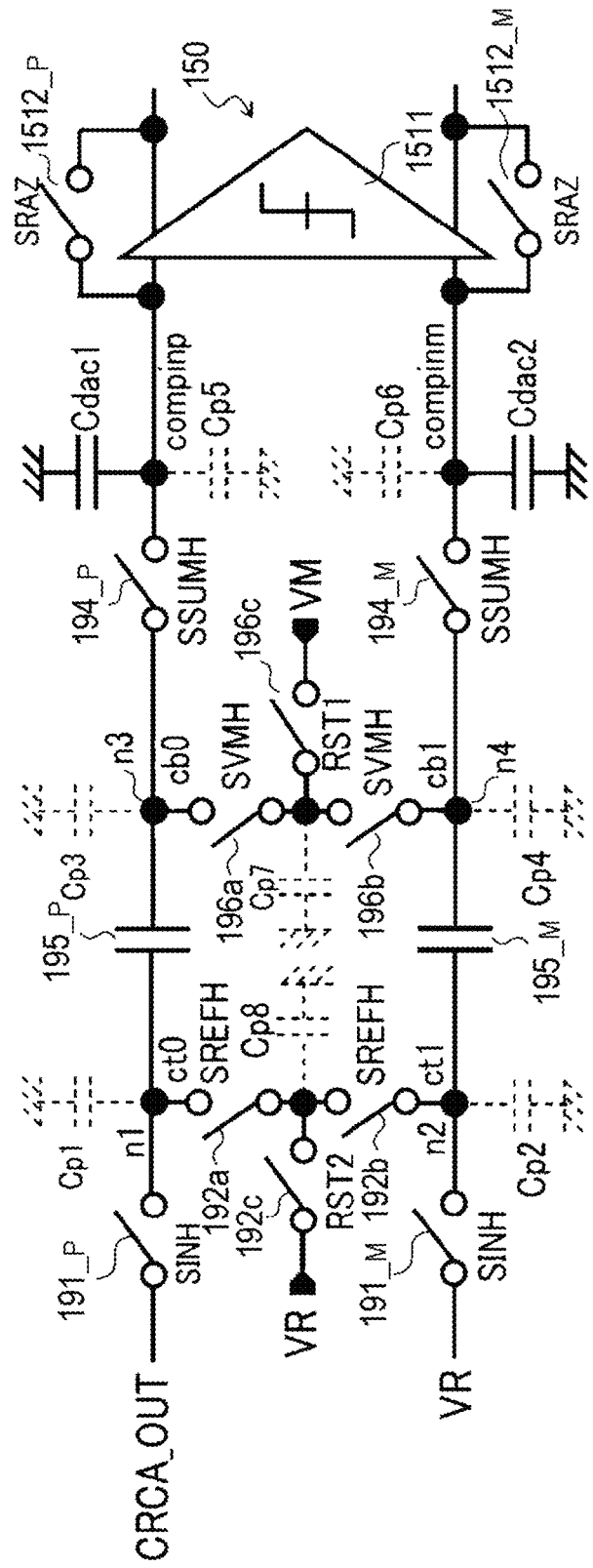
FIG. 27 is a circuit diagram illustrating an internal configuration of a capacitance unit according to a fifth variation of FIG. 12.

FIG. 27 is a circuit diagram illustrating an internal configuration of a capacitance unit 19 according to a fifth variation of FIG. 12. The capacitance unit 19 in FIG. 27 includes a positive-side capacitance element $195_P$, a negative-side capacitance element $195_M$, a 4a switch 192a, a 4b switch 192b, a 4c switch 192c, a 5a switch 196a, a 5b switch 196b, a 5c switch 196c, a sixth switch $194_P$, a seventh switch $194_M$, a switch $191_P$, and a switch $191_M$.

The 4a switch 192a and the 4b switch 192b are connected in series between a first node n1 and a second node n2. When the 4a switch 192a and the 4b switch 192b are put into a closed state, the first node n1 and the second node n2 are short-circuited.

The 4c switch 192c selectively applies a reference voltage VR to a common connection node n10 of the 4a switch 192a and the 4b switch 192b. When the 4c switch 192c is put into a closed state, the reference voltage VR is applied to the common connection node n10.

The 5a switch 196a and the 5b switch 196b are connected in series between a third node n3 and a fourth node n4. When the 5a switch 196a and the 5b switch 196b are put into a closed state, the third node n3 and the fourth node n4 are short-circuited.

The 5c switch 196c selectively applies the common mode reference voltage VM of the successive approximation register analog-to-digital converter 150 to a common connection node n5 of the 5a switch 196a and the 5b switch 196b. When the 5c switch 196c is put into a closed state, the common mode reference voltage VM is applied to the common connection node n5.

Figure 28:
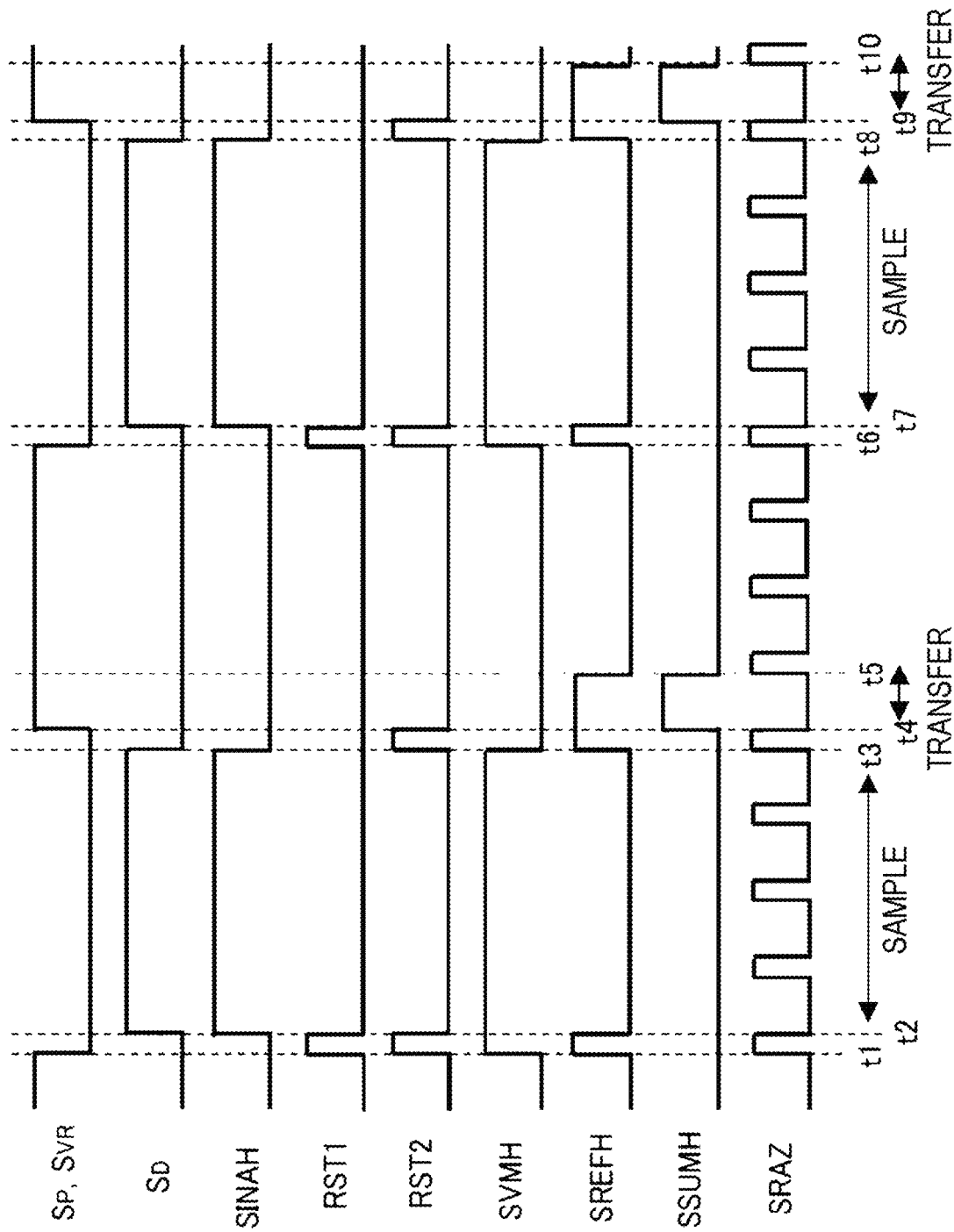
FIG. 28 is a timing chart of the capacitance unit in FIG. 27.

FIG. 28 is a timing chart of the capacitance unit 19 in FIG. 27. A switch control signal RST1 controls on/off of the 5c switch 196c. A switch control signal RST2 controls on/off of the 4c switch 192c. A switch control signal SVHM controls on/off of the 5a switch 196a and the 5b switch 196b. A switch control signal SREFH controls on/off of the 4a switch 192a and the 4b switch 192b.

The 4a switch 192a, the 4b switch 192b, and the 4c switch 192c are put into a closed state in a period from time t1 to time t2. Therefore, the first node n1 and the second node n2 are short-circuited immediately before a period in which the capacitance unit 19 samples a voltage of a signal line VSL, and the reference voltage VR is applied to these nodes.

Furthermore, the 5a switch 196a, the 5b switch 196b, and the 5c switch 196c are put into a closed state in a period from time t1 to time t2. Therefore, the third node n3 and the fourth node n4 are short-circuited immediately before the period in which the capacitance unit 19 samples the voltage of the signal line VSL, and the common mode reference voltage VM is applied to these nodes.

Therefore, immediately before the period in which the capacitance unit 19 samples the voltage of the signal line VSL, a parasitic capacitance Cp1 of the first node n1, a parasitic capacitance Cp2 of the second node n2, a parasitic capacitance Cp8 of the common connection node n10 of the 4a switch 192a and the 4b switch 192b, a parasitic capacitance Cp3 of the third node n3, a parasitic capacitance Cp4 of the fourth node n4, and a parasitic capacitance Cp1 of the common connection node n5 of the 5a switch 196a and the 5b switch 196b are reset.

Furthermore, the 4a switch 192a, the 4b switch 192b, and the 4c switch 192c are put into a closed state in a period from time t3 to time t4. Therefore, immediately before a period in which a pixel signal held by the capacitance unit 19 is transferred to the successive approximation register analog-to-digital converter 150, the first node n1 and the second node n2 are short-circuited, the reference voltage VR is applied to these nodes, and the parasitic capacitances Cp1, Cp2, and Cp8 described above are reset.

In contrast, in the period from time t3 to time t4, the 5c switch 196c is in an opened state, and the common mode reference voltage VM is not applied to the third node n3 and the fourth node n4; however, the 5a switch 196a and the 5b switch are put into a closed state, so that the third node n3 and the fourth node n4 are short-circuited, and the parasitic capacitances Cp3 and Cp4 are reset. Therefore, fluctuation of the common voltage in the period in which the pixel signal held by the capacitance unit 19 is transferred to the successive approximation register analog-to-digital converter 150 may be suppressed.

Figure 29:
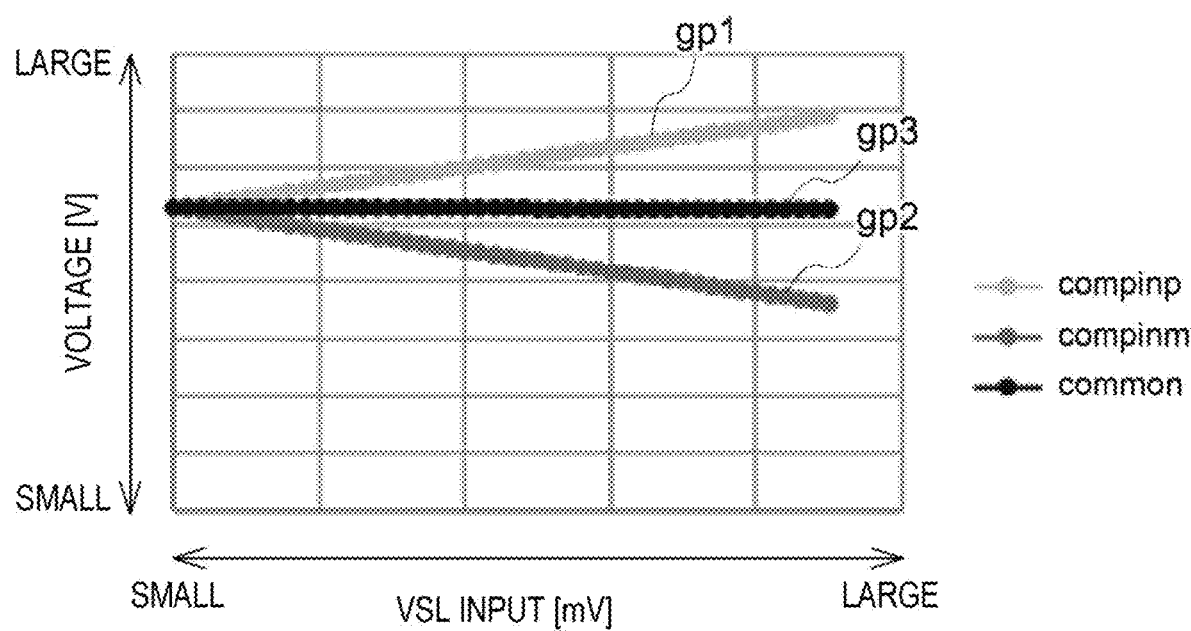
FIG. 29 is a diagram illustrating input signal dependency of a differential signal transferred from the capacitance unit to a successive approximation register analog-to-digital converter in FIG. 27.

FIG. 29 is a diagram illustrating the input signal dependency of the differential signal transferred from the capacitance unit 19 to the successive approximation register analog-to-digital converter 150 in FIG. 27. FIG. 26 illustrates graphs gp1, gp2, and gp3 illustrating the input signal dependency of differential signals compinp and compinn of the nodes n11 and n12, and a common voltage of the differential signals, respectively.

Since the capacitance unit 19 in FIG. 27 does not use the common mode reference voltage VM when transferring the pixel signal to the successive approximation register analog-to-digital converter 150, this is not affected by AD conversion of other columns, and since the parasitic capacitances Cp1 and Cp2 of the first node n1 and the second node n2 are reset before the pixel signal is transferred to the successive approximation register analog-to-digital converter 150, the input signal dependency of the common voltage of the differential signal may be reduced.

Second Embodiment of Present Disclosure

A second embodiment of the present disclosure is an example in which the technology according to the present disclosure is applied to an indirect time-of-flight (TOF) distance image sensor. The indirect TOF distance image sensor is a sensor that measures a distance to a measurement target by measuring a light flight time on the basis of detection of an arrival phase difference of reflected light, the light emitted from a light source and reflected by the measurement target (subject).

[System Configuration Example]

Figure 30:
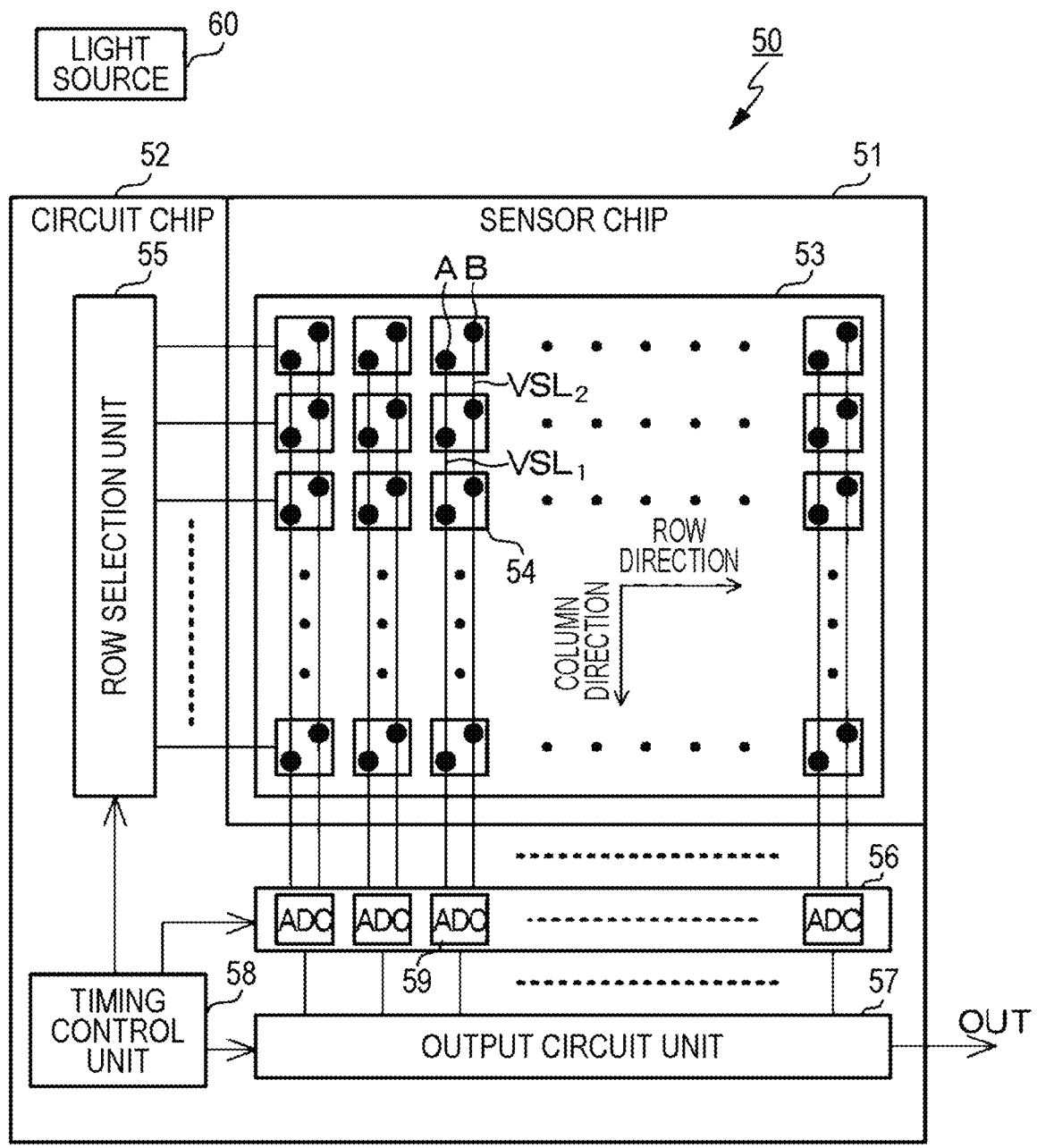
FIG. 30 is a block diagram illustrating an example of a system configuration of an indirect TOF distance image sensor according to a second embodiment of the present disclosure.

FIG. 30 is a block diagram illustrating an example of a system configuration of the indirect TOF distance image sensor according to the second embodiment of the present disclosure.

On an indirect TOF distance image sensor 50, reflected light, the light emitted from a light source 60 and reflected by a measurement target (subject) is incident. The indirect TOF distance image sensor 50 has a stacked structure including a sensor chip 51 and a circuit chip 52 stacked on the sensor chip 51. In this stacked structure, the sensor chip 51 and the circuit chip 52 are electrically connected to each other via a connection (not illustrated) such as a via (VIA) or Cu—Cu connection. Note that, FIG. 30 illustrates a state in which wiring of the sensor chip 51 and wiring of the circuit chip 52 are electrically connected to each other via the connection described above.

A pixel array unit 53 is formed on the sensor chip 51. The pixel array unit 53 includes a plurality of pixels 54 arranged in a matrix (array) in a two-dimensional grid pattern on the sensor chip 51. In the pixel array unit 53, each of the plurality of pixels 54 receives incident light (for example, near infrared light), performs photoelectric conversion, and outputs an analog pixel signal. In the pixel array unit 53, two signal lines $VSL_1$ and $VSL_2$ are wired for each pixel column. When the number of pixel columns of the pixel array unit 53 is set to M (M is an integer), a total of (2×M) signal lines VSL are wired in the pixel array unit 53.

Each of the plurality of pixels 54 includes first and second taps A and B (details thereof are to be described later). An analog pixel signal $AIN_{P1}$ based on a charge of the first tap A of the pixel 54 in the corresponding pixel column is output to the signal line $VSL_1$ out of the two signal lines $VSL_1$ and $VSL_2$. Furthermore, an analog pixel signal $AIN_{P2}$ based on a charge of the second tap B of the pixel 54 in the corresponding pixel column is output to the signal line $VSL_2$. The analog pixel signals $AIN_{P1}$ and $AIN_{P2}$ are to be described later.

On the circuit chip 52, a row selection unit 55, a column signal processing unit 56, an output circuit unit 57, and a timing control unit 58 are arranged. The row selection unit 55 drives the respective pixels 54 of the pixel array unit 53 in units of pixel row to output the pixel signals $AIN_{P1}$ and $AIN_{P2}$, respectively. Under the drive by the row selection unit 55, the analog pixel signals $AIN_{P1}$ and $AIN_{P2}$ output from the pixels 54 in the selected row are supplied to the column signal processing unit 56 via the two signal lines $VSL_1$ and $VSL_2$.

The column signal processing unit 56 includes a plurality of analog-to-digital converters (ADC) 59 provided corresponding to the pixel columns of the pixel array unit 53 (for example, for each pixel column). The analog-to-digital converter 59 performs analog-to-digital conversion processing on the analog pixel signals $AIN_{P1}$ and $AIN_{P2}$ supplied via the signal lines $VSL_1$ and $VSL_2$, respectively, to output to the output circuit unit 57. The output circuit unit 57 performs predetermined signal processing on the digitized pixel signals $AIN_{P1}$ and $AIN_{P2}$ output from the column signal processing unit 56 to output out of the circuit chip 52.

The timing control unit 58 generates various timing signals, clock signals, control signals and the like, and performs drive control of the row selection unit 55, the column signal processing unit 56, the output circuit unit 57 and the like on the basis of the signals.

[Circuit Configuration Example of Pixel]

Figure 31:
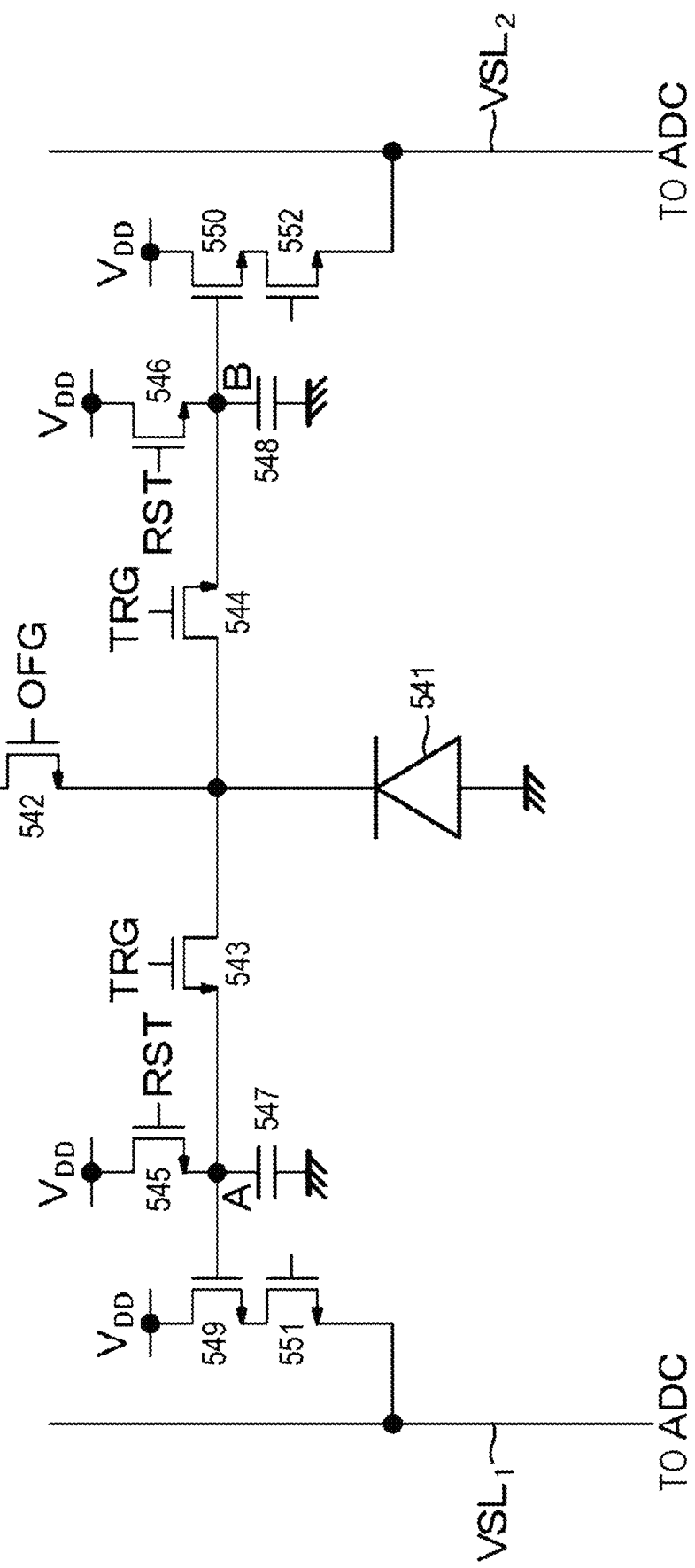
FIG. 31 is a circuit diagram illustrating an example of a circuit configuration of a pixel in the indirect TOF distance image sensor according to the second embodiment.

FIG. 31 is a circuit diagram illustrating an example of a circuit configuration of the pixel 54 in the indirect TOF distance image sensor 50 according to the second embodiment.

The pixel 54 according to this example includes, for example, a photodiode 541 as a photoelectric conversion element. The pixel 54 includes, in addition to the photodiode 541, an overflow transistor 542, two transfer transistors 543 and 544, two reset transistors 545 and 546, two floating diffusion layers 547 and 548, two amplification transistors 549 and 550, and two selection transistors 551 and 552. The two floating diffusion layers 547 and 548 correspond to the first and second taps A and B (hereinafter, sometimes simply referred to as "taps A and B") illustrated in FIG. 30.

The photodiode 541 generates a charge by photoelectrically converting the received light. The photodiode 541 may have, for example, a back-illuminated pixel structure. However, the structure is not limited to the back-illuminated structure, and may be a front-illuminated structure that captures light applied from a substrate front surface side.

The overflow transistor 542 is connected between a cathode electrode of the photodiode 541 and a power supply line of a power supply voltage $V_{DD}$, and has a function of resetting the photodiode 541. Specifically, the overflow transistor 542 becomes conductive in response to an overflow gate signal TRG supplied from the row selection unit 55, thereby sequentially transferring the charge generated by the photodiode 541 to the floating diffusion layers 547 and 548.

The floating diffusion layers 547 and 548 corresponding to the first and second taps A and B, accumulate the charge transferred from the photodiode 541, convert the same into a voltage signal having a voltage value corresponding to a charge amount, and generate the pixel signals $AIN_{P1}$ and $AIN_{P2}$, respectively.

Each of the two reset transistors 545 and 546 is connected between each of the two floating diffusion layers 547 and 548 and the power supply line of the power supply voltage $V_{DD}$. Then, each of the reset transistor 545 and 546 becomes conductive in response to a reset signal RST supplied from the row selection unit 55, thereby extracting the charge from each of the floating diffusion layers 347 and 348 and initializing the charge amount.

Each of the two amplification transistors 549 and 550 is connected between each of the power supply line of the power supply voltage $V_{DD}$ and each of the two selection transistors 551 and 552, and amplifies a voltage signal converted from the charge to a voltage in each of the floating diffusion layers 547 and 548.

The two selection transistors 551 and 552 are connected between each of the two amplification transistors 549 and 550 and each of the signal lines $VSL_1$ and $VSL_2$, respectively. Then, the selection transistors 551 and 552 become conductive in response to a selection signal SEL supplied from the row selection unit 55, thereby outputting the voltage signals amplified by the amplification transistors 549 and 550 to the two signal lines $VSL_1$ and $VSL_2$ as analog pixel signals $AIN_{P1}$ and $AIN_{P2}$, respectively.

The two signal lines $VSL_1$ and $VSL_2$ are connected to an input end of one analog-to-digital converter 59 in the column signal processing unit 56 for each pixel column, and transmit the analog pixel signals $AIN_{P1}$ and $AIN_{P2}$ output from the pixels 54 for each pixel column to the analog-to-digital converter 59.

Note that, the circuit configuration of the pixel 54 is not limited to the circuit configuration illustrated in FIG. 31 as long as the circuit configuration may generate the analog pixel signals $AIN_{P1}$ and $AIN_{P2}$ by the photoelectric conversion.

In the indirect TOF distance image sensor 50 having the configuration described above, the technology according to the present disclosure may be applied to the column signal processing unit 56 including the analog-to-digital converter 59. More specifically, as the column signal processing unit 56 including the analog-to-digital converter 59, similarly to a case of the first embodiment, the column signal processing system according to the first embodiment or Example 4 including the column amplifier unit 14, the capacitance unit 19, and the successive approximation register analog-to-digital conversion unit 15A may be used.

Variation

Although the technology according to the present disclosure is described above on the basis of the preferred embodiments, the technology according to the present disclosure is not limited to the embodiments. The configurations and structures of the CMOS image sensor and the indirect TOF distance image sensor described in the embodiments described above are examples, and may be changed as appropriate.

Application Example

Figure 32:
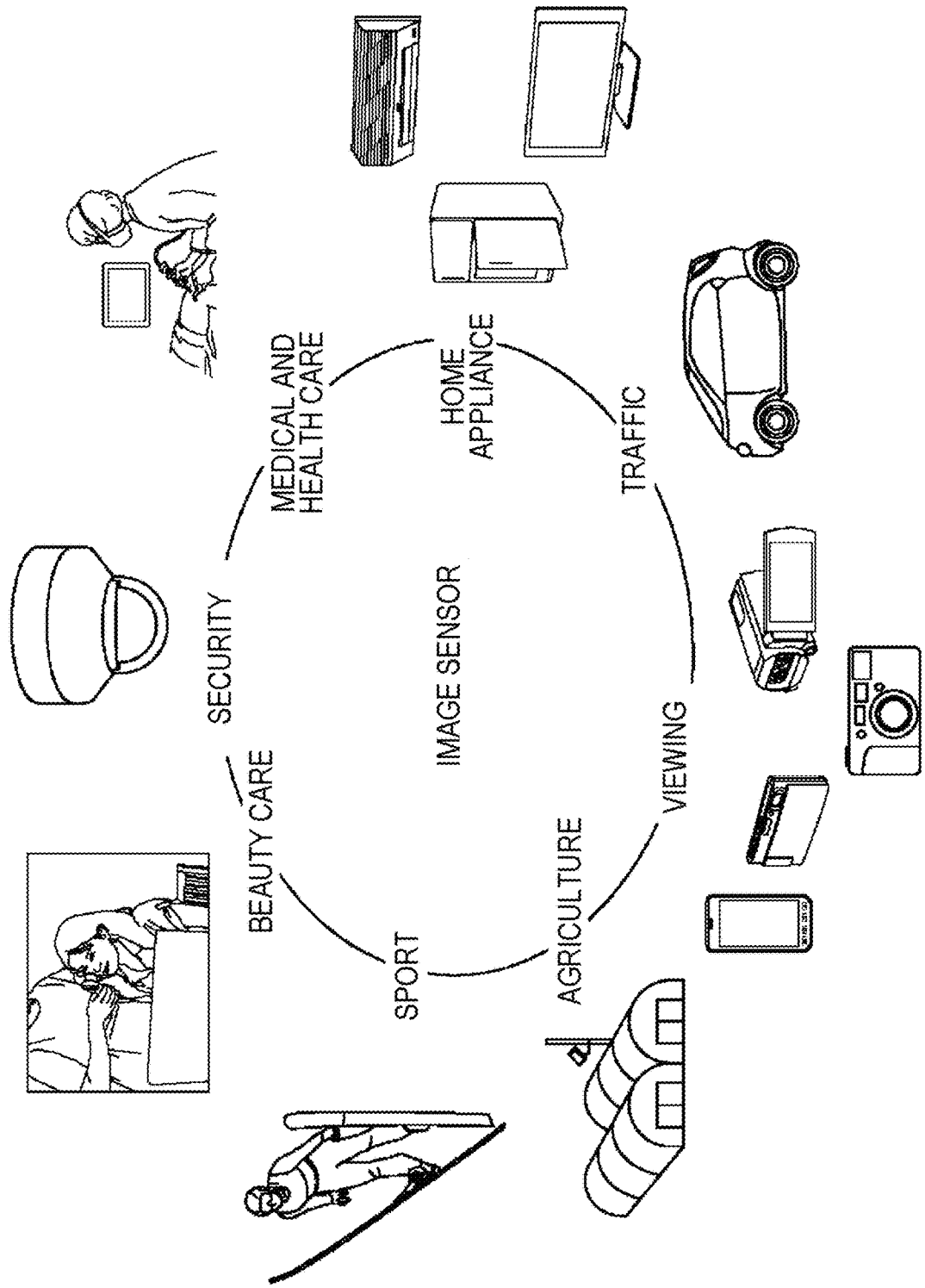
FIG. 32 is a diagram illustrating an application example of the technology according to the present disclosure.

The imaging device (CMOS image sensor) according to the first embodiment may be used in various devices in which light such as visible light, infrared light, ultraviolet light, and X-ray is sensed as illustrated in FIG. 32, for example. Specific examples of the various devices are listed below.

A device that takes an image to be used for viewing such as a digital camera and a mobile device with a camera function A device for traffic purpose such as a vehicle-mounted sensor that takes images of the front, rear, surroundings, interior and the like of an automobile, a monitoring camera that monitors traveling vehicles and roads, and a ranging sensor that measures a distance between vehicles and the like for safe driving such as automatic stop, recognition of a driver's condition and the like A device for home appliance such as a television, a refrigerator, and an air conditioner that takes an image of a user's gesture and performs a device operation according to the gesture A device for medical and health care use such as an endoscope and a device that performs angiography by receiving infrared light A device for security use such as a security monitoring camera and an individual certification camera A device for beauty care such as a skin condition measuring device that takes an image of skin and a microscope that takes an image of scalp A device for sporting use such as an action camera and a wearable camera for sporting use and the like A device for agricultural use such as a camera for monitoring land and crop states Application Example of Technology according to Present Disclosure The technology according to the present disclosure may be applied to various products. A more specific application example is described below.

Electronic Device of Present Disclosure

Here, a case of applying to an imaging system such as a digital still camera or a video camera, a mobile terminal device having an imaging function such as a mobile phone, or an electronic device such as a copier using an imaging device as an image read unit is described.

Example of Imaging System

Figure 33:
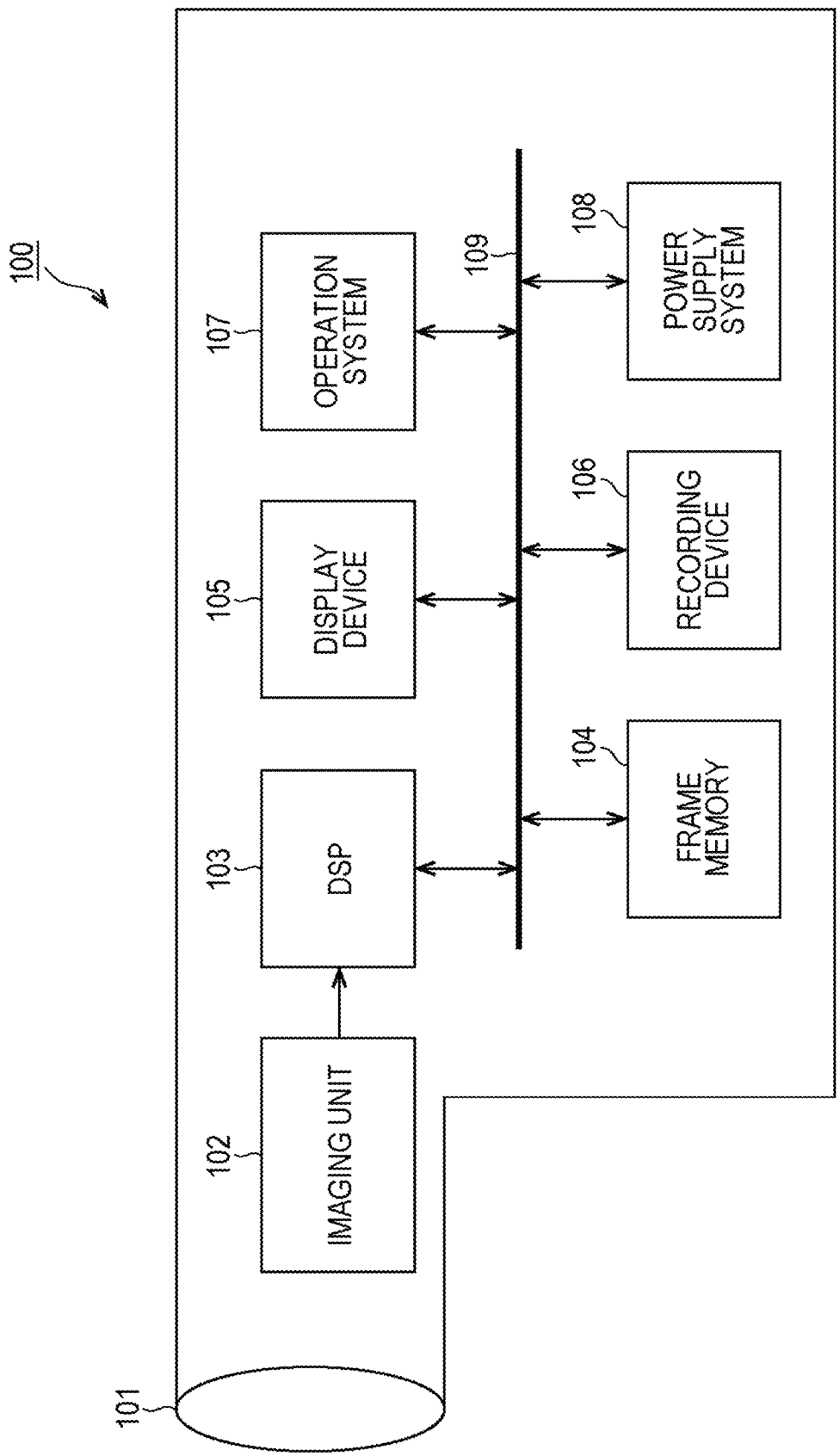
FIG. 33 is a block diagram illustrating an outline of a configuration example of an imaging system as an example of an electronic device of the present disclosure.

FIG. 33 is a block diagram illustrating a configuration example of an imaging system as an example of an electronic device of the present disclosure.

As illustrated in FIG. 33, an imaging system 100 according to this example includes an imaging optical system 101 including a lens group and the like, an imaging unit 102, a digital signal processor (DSP) circuit 103, a frame memory 104, a display device 105, a recording device 106, an operation system 107, a power supply system 108 and the like. Then, the DSP circuit 103, the frame memory 104, the display device 105, the recording device 106, the operation system 107, and the power supply system 108 are connected to one another via a bus line 109.

The imaging optical system 101 captures incident light (image light) from a subject to form an image on an imaging surface of the imaging unit 102. The imaging unit 102 converts a light amount of the incident light the image of which is formed on the imaging surface thereof by the optical system 101 to an electric signal in units of pixel to output as a pixel signal. The DSP circuit 103 performs general camera signal processing, for example, white balance processing, demosaic processing, gamma correction processing and the like.

The frame memory 104 is appropriately used for storing data in the process of signal processing in the DSP circuit 103. The display device 105 including a panel display device such as a liquid crystal display device and an organic electro luminescence (EL) display device displays a moving image or a still image taken by the imaging unit 102. The recording device 106 records the moving image or the still image taken by the imaging unit 102 on a recording medium such as a portable semiconductor memory, an optical disk, or a hard disk drive (HDD).

The operation system 107 issues an operation command regarding various functions of the imaging system 100 under an operation by a user. The power supply system 108 appropriately supplies various power supplies serving as operation power supplies of the DSP circuit 103, the frame memory 104, the display device 105, the recording device 106, and the operation system 107 to supply targets.

In the imaging system 100 having the configuration described above, the imaging device according to the first embodiment described above may be used as the imaging unit 102. In the imaging device according to the first embodiment, in particular, the successive approximation register analog-to-digital converter 150 is excellent in power efficiency, so that it is possible to contribute to low power consumption of the imaging system 100 by using the imaging device as the imaging unit 102.

Application Example to Mobile Body

The technology according to the present disclosure (present technology) may be applied to various products. For example, the technology according to the present disclosure may also be implemented as an imaging device mounted on any type of mobile body such as an automobile, an electric automobile, a hybrid electric automobile, a motorcycle, a bicycle, a personal mobility, an airplane, a drone, a ship, a robot, a building machine, or an agricultural machine (tractor).

Figure 34:
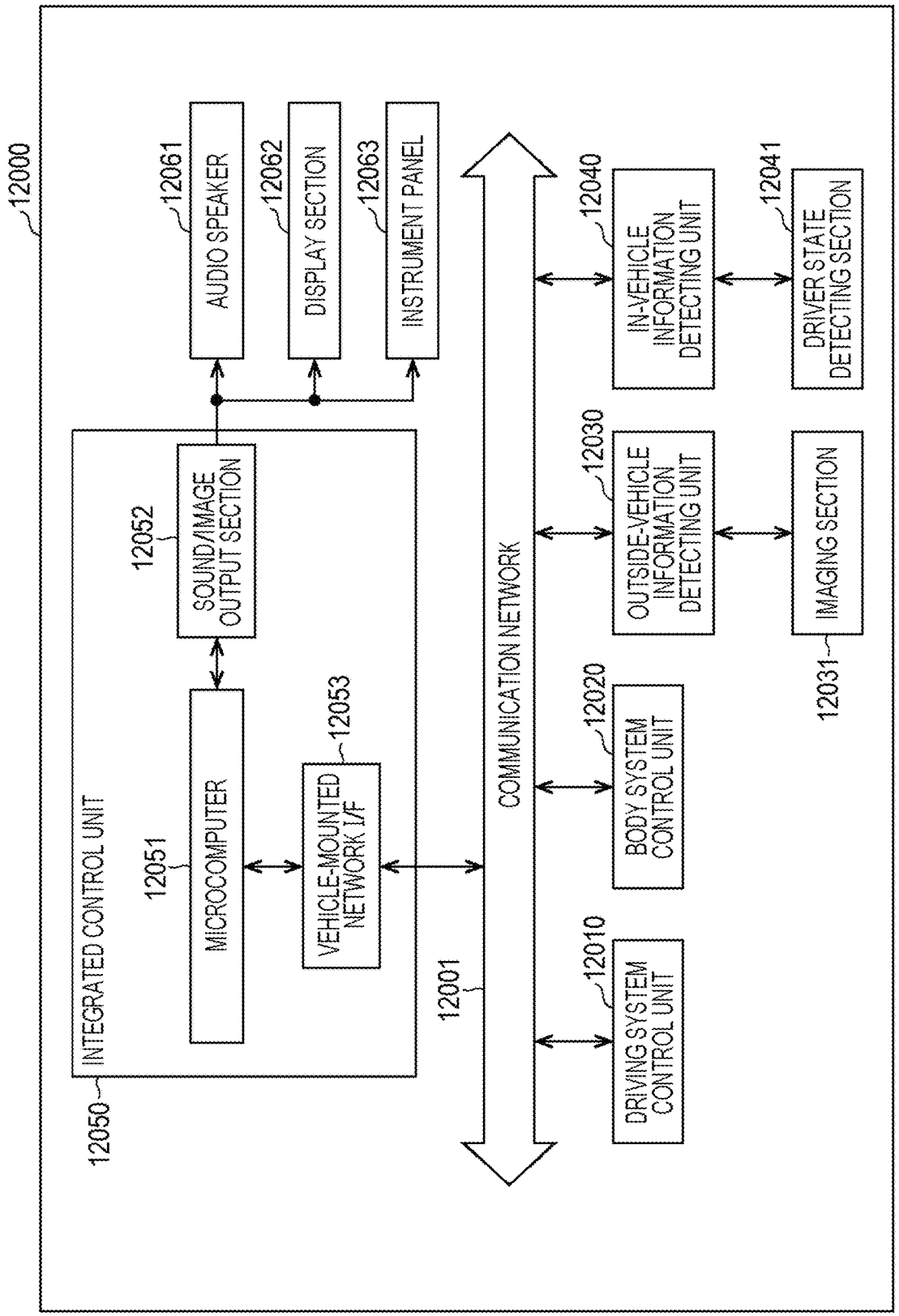
FIG. 34 is a block diagram depicting an example of schematic configuration of a vehicle control system as an example of a mobile body control system to which the technology according to an embodiment of the present disclosure can be applied.

FIG. 34 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 34, the vehicle control system 12000 includes a driving system control unit 12010, a body system control unit 12020, an outside-vehicle information detecting unit 12030, an in-vehicle information detecting unit 12040, and an integrated control unit 12050. Furthermore, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

Furthermore, the microcomputer 12051 can output a control command to the body system control unit 12020 on the basis of the information about the outside of the vehicle obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 34, an audio speaker 12061, a display section 12062, and an instrument panel 12063 are illustrated as the output device. The display section 12062 may, for example, include at least one of an on-board display and a head-up display.

Figure 35:
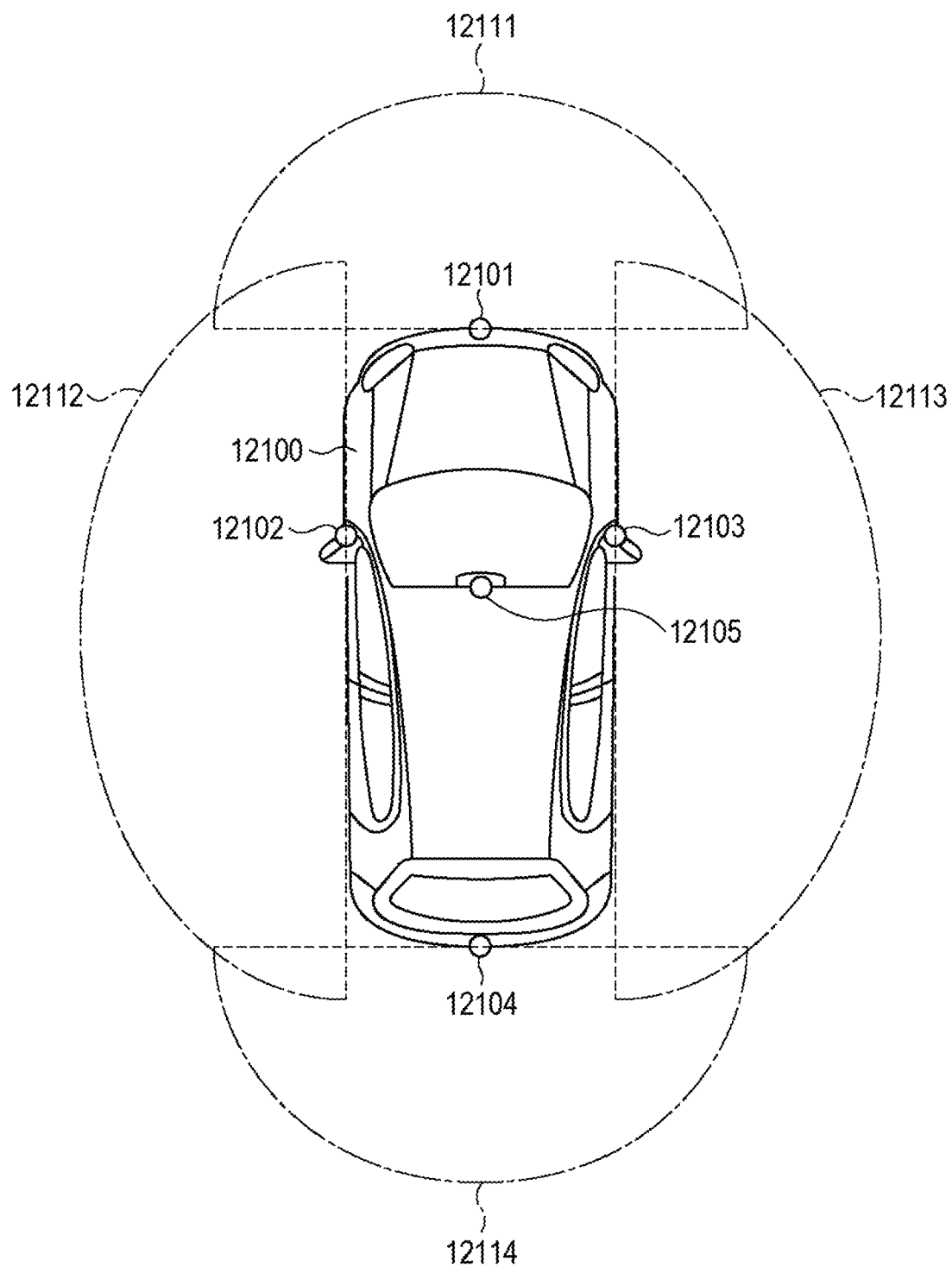
FIG. 35 is a diagram depicting an example of an installation position of an imaging section in the mobile body control system.

FIG. 35 is a diagram depicting an example of an installation position of the imaging section 12031.

In FIG. 35, a vehicle 12100 includes imaging sections 12101, 12102, 12103, 12104, and 12105 as the imaging section 12031.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The images of the front obtained by the imaging sections 12101 and 12105 are used mainly to detect a preceding vehicle, a pedestrian, an obstacle, a signal, a traffic sign, a lane, or the like.

Note that, FIG. 35 depicts an example of imaging ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging devices, or may be an imaging device having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure is applicable is described above. The technology according to the present disclosure is applicable to, for example, imaging sections 7910, 7912, 7914, 7916, and 7918 and outside-vehicle information detecting sections 7920, 7922, 7924, 7926, 7928, and 7930 out of the configurations described above. Then, in particular, the successive approximation register analog-to-digital converter 150 is excellent in power efficiency, so that it is possible to contribute to low power consumption of the vehicle control system by applying the technology according to the present disclosure.

Configuration that Present Disclosure May Take

Note that, the present disclosure may also take a following configuration.

<<A. Imaging Device>>

[A-01] An imaging device provided with:
a pixel array unit including a plurality of pixels each including a photoelectric conversion element;
a column amplifier unit that obtains a difference between a reset component and a signal component input from each pixel of the pixel array unit via a signal line, and outputs the difference as a pixel signal;
a capacitance unit that holds the pixel signal input from the column amplifier unit; and
a successive approximation register analog-to-digital conversion unit that converts an analog pixel signal input from the capacitance unit into a digital signal, in which
the capacitance unit differentiates a single-phase pixel signal input from the column amplifier unit using a reference voltage that defines a zero voltage of the pixel signal.

[A-02] The imaging device according to [A-01] described above, in which
the column amplifier unit includes:
an amplifier to a non-inverting input terminal of which a potential of the signal line is input;
a first switch one end of which is connected to an output terminal of the amplifier and another end of which is connected to an inverting input terminal of the amplifier;
a second switch one end of which is connected to the output terminal of the amplifier;
a first capacitance element one end of which is connected to another end of the second switch and another end of which is connected to the another end of the first switch and the inverting input terminal of the amplifier;
a second capacitance element connected between the another end of the first capacitance element and the inverting input terminal of the amplifier, and a reference potential node; and
a third switch one end of which is connected to the another end of the second switch and one end of the first capacitance element, the third switch to another end of which the reference voltage is applied.

[A-03] The imaging device according to [A-02] described above, in which
the column amplifier unit
puts the first switch into a closed state and charges the first capacitance element and the second capacitance element with the reset component when the reset component is input, and puts the third switch into a closed state and applies the reference voltage to the another end of the second switch and the one end of the first capacitance element,
then, puts the first switch and the third switch into an opened state and puts the second switch into a closed state, and forms a non-inverting amplification circuit using the first capacitance element, the second capacitance element, and the amplifier, and
feeds back so that a voltage of a common connection node of the first capacitance element and the second capacitance element becomes a same voltage as the signal component when the signal component is input.

[A-04] The imaging device according to [A-02] or [A-03] described above, in which
the capacitance unit
has a configuration of a differential circuit including a positive-side capacitance element charged with the pixel signal input from the column amplifier unit, and a negative-side capacitance element charged with the reference voltage, and
includes a fourth switch that selectively short-circuits input ends of the positive-side capacitance element and the negative-side capacitance element.

[A-05] The imaging device according to [A-04] described above, in which
the fourth switch short-circuits the input ends of the positive-side capacitance element and the negative-side capacitance element when the pixel signal with which the positive-side capacitance element is charged and the reference voltage with which the negative-side capacitance element is charged are transmitted to the successive approximation register analog-to-digital conversion unit.

[A-06] The imaging device according to [A-05] described above, in which
the capacitance unit holds the pixel signal input from the column amplifier unit by sampling by a switched capacitor.

[A-07] The imaging device according to any one of [A-01] to [A-06] described above, that
multiplexes and processes each potential of a plurality of signal lines via a plurality of the column amplifier units and the capacitance units corresponding to the plurality of signal lines for one successive approximation register analog-to-digital converter of the successive approximation register analog-to-digital conversion unit.

[A-08] The imaging device according to [A-02] described above, in which
the capacitance unit is provided with:
a first node to which the pixel signal input from the column amplifier unit is supplied;
a second node to which the reference voltage is supplied;
a positive-side capacitance element and a negative-side capacitance element connected in series between the first node and the second node;
a fourth switch that selectively short-circuits the first node and the second node;
a fifth switch that selectively applies a common mode reference voltage of the successive approximation register analog-to-digital conversion unit to a common connection node of the positive-side capacitance element and the negative-side capacitance element;
a sixth switch that selectively connects the second node and a first input end of the successive approximation register analog-to-digital conversion unit; and
a seventh switch that selectively connects the first node and a second input end of the successive approximation register analog-to-digital conversion unit.

[A-09] The imaging device according to [A-08] described above, in which
the fourth switch is temporarily put into a closed state immediately before the capacitance unit starts holding the pixel signal, and short-circuits input ends of the positive-side capacitance element and the negative-side capacitance element, and
the fifth switch is temporarily put into a closed state immediately before the capacitance unit starts holding the pixel signal and in a period in which the pixel signal held by the capacitance unit is transferred to the successive approximation register analog-to-digital conversion unit, and applies the common mode reference voltage of the successive approximation register analog-to-digital conversion unit to the common connection node of the positive-side capacitance element and the negative-side capacitance element.

[A-10] The imaging device according to [A-02] described above, in which
the capacitance unit is provided with:
a first node to which the pixel signal input from the column amplifier unit is supplied;
a second node to which the reference voltage is supplied;
a positive-side capacitance element and a negative-side capacitance element connectable in series between the first node and the second node;
a 4a switch and a 4b switch connected in series between the first node and the second node;
a 5a switch, the positive-side capacitance element, the negative-side capacitance element, and a 5b switch connected in series between the first node and the second node;
a 5c switch that selectively applies a common mode reference voltage of the successive approximation register analog-to-digital conversion unit to a common connection node of the positive-side capacitance element and the negative-side capacitance element;
a sixth switch that selectively connects the second node and a first input end of the successive approximation register analog-to-digital conversion unit; and
a seventh switch that selectively connects the first node and a second input end of the successive approximation register analog-to-digital conversion unit.

[A-11] The imaging device according to [A-10] described above, in which
the 4a switch and the 4b switch are temporarily put into a closed state immediately before the capacitance unit starts holding the pixel signal and immediately before the pixel signal held by the capacitance unit is transferred to the successive approximation register analog-to-digital conversion unit, and apply the common mode reference voltage of the successive approximation register analog-to-digital conversion unit to the first node and the second node,
the 5a switch and the 5b switch are temporarily put into an opened state immediately before the pixel signal held by the capacitance unit is transferred to the successive approximation register analog-to-digital conversion unit, and block the connection between the first node and the positive-side capacitance element and block the connection between the second node and the negative-side capacitance element, and
the 5c switch is temporarily put into a closed state immediately before the capacitance unit starts holding the pixel signal and in a period in which the pixel signal held by the capacitance unit is transferred to the successive approximation register analog-to-digital conversion unit, and applies the common mode reference voltage of the successive approximation register analog-to-digital conversion unit to the common connection node of the positive-side capacitance element and the negative-side capacitance element.

[A-12] The imaging device according to [A-02] described above, in which
the capacitance unit is provided with:
a first node to which the pixel signal input from the column amplifier unit is supplied;
a second node to which the reference voltage is supplied;
a 4a switch and a 4b switch connected in series between the first node and the second node;
a positive-side capacitance element, a 5a switch, a 5b switch, and a negative-side capacitance element connected in series between the first node and the second node;
a 5c switch that selectively applies a common mode reference voltage of the successive approximation register analog-to-digital conversion unit to a common connection node of the 5a switch and the 5b switch;
a sixth switch that selectively connects the second node and a first input end of the successive approximation register analog-to-digital conversion unit; and
a seventh switch that selectively connects the first node and a second input end of the successive approximation register analog-to-digital conversion unit.

[A-13] The imaging device according to [A-12] described above, in which
the 4a switch and the 4b switch are temporarily put into a closed state immediately before the capacitance unit starts holding the pixel signal and immediately before the pixel signal held by the capacitance unit is transferred to the successive approximation register analog-to-digital conversion unit, and apply the common mode reference voltage of the successive approximation register analog-to-digital conversion unit to the first node and the second node,
the 5c switch is temporarily put into a closed state immediately before the capacitance unit starts holding the pixel signal and in a period in which the pixel signal held by the capacitance unit is transferred to the successive approximation register analog-to-digital conversion unit, and applies the common mode reference voltage of the successive approximation register analog-to-digital conversion unit to a common connection node of the positive-side capacitance element and the negative-side capacitance element, and
the 5a switch and the 5b switch are temporarily put into an opened state immediately before the pixel signal held by the capacitance unit is transferred to the successive approximation register analog-to-digital conversion unit, and block the connection between the positive-side capacitance element and the negative-side capacitance element.

[A-14] The imaging device according to [A-02] described above, in which
the capacitance unit is provided with:
a first node to which the pixel signal input from the column amplifier unit is supplied;
a second node to which the reference voltage is supplied;
a positive-side capacitance element one end of which is connected to the first node;
a third node to which another end of the positive-side capacitance element is connected;
a negative-side capacitance element one end of which is connected to the second node;
a fourth node to which another end of the negative-side capacitance element is connected;
a 4a switch and a 4b switch connected in series between the first node and the second node;
a 4c switch connected between the first node and the second node;
a 5a switch connected between the third node and the fourth node;
a 5b switch and a 5c switch connected in series between the third node and the fourth node;
a sixth switch that selectively connects the third node and a first input end of the successive approximation register analog-to-digital conversion unit; and a seventh switch that selectively connects the fourth node and a second input end of the successive approximation register analog-to-digital conversion unit.

[A-15] The imaging device according to [A-14] described above, in which
the 4a switch and the 4b switch are temporarily put into a closed state in a period in which the pixel signal held by the capacitance unit is transferred to the successive approximation register analog-to-digital conversion unit, and apply a common mode reference voltage of the successive approximation register analog-to-digital conversion unit to the first node and the second node,
the 4c switch is put into a closed state immediately before the capacitance unit starts holding the pixel signal, and short-circuits the first node and the second node,
the 5a switch short-circuits the third node and the fourth node in a period in which the capacitance unit holds the pixel signal, and
the 5b switch and the 5c switch are put into a closed state immediately before the capacitance unit starts holding the pixel signal, and apply the reference voltage to the third node and the fourth node.

[A-16] The imaging device according to [A-02] described above, in which
the capacitance unit is provided with:
a first node to which the pixel signal input from the column amplifier unit is supplied;
a second node to which the reference voltage is supplied;
a positive-side capacitance element one end of which is connected to the first node;
a third node to which another end of the positive-side capacitance element is connected;
a negative-side capacitance element one end of which is connected to the second node;
a fourth node to which another end of the negative-side capacitance element is connected;
a fourth switch connected between the first node and the second node;
a 5a switch and a 5b switch connected in series between the third node and the fourth node;
a 5c switch that selectively applies a common mode reference voltage of the successive approximation register analog-to-digital conversion unit to a common connection node of the 5a switch and the 5b switch;
a sixth switch that selectively connects the third node and a first input end of the successive approximation register analog-to-digital conversion unit; and
a seventh switch that selectively connects the fourth node and a second input end of the successive approximation register analog-to-digital conversion unit.

[A-17] The imaging device according to [A-16] described above, in which
the fourth switch is put into a closed state immediately before the capacitance unit starts holding the pixel signal and in a period in which the pixel signal held by the capacitance unit is transferred to the successive approximation register analog-to-digital conversion unit, and short-circuits the first node and the second node,
the 5a switch and the 5b switch are put into a closed state immediately before a period in which the capacitance unit holds the pixel signal until the holding period ends, and short-circuit the third node and the fourth node; and
the 5c switch is put into a closed state immediately before the capacitance unit starts holding the pixel signal, and selectively applies the common mode reference voltage of the successive approximation register analog-to-digital conversion unit to the common connection node of the 5a switch and the 5b switch.

[A-18] The imaging device according to [A-02] described above, in which
the capacitance unit is provided with:
a first node to which the pixel signal input from the column amplifier unit is supplied;
a second node to which the reference voltage is supplied;
a positive-side capacitance element one end of which is connected to the first node;
a third node to which another end of the positive-side capacitance element is connected;
a negative-side capacitance element one end of which is connected to the second node;
a fourth node to which another end of the negative-side capacitance element is connected;
a 4a switch and a 4b switch connected in series between the first node and the second node;
a 4c switch that selectively applies the reference voltage to a common connection node of the 4a switch and the 4b switch;
a 5a switch and a 5b switch connected in series between the third node and the fourth node;
a 5c switch that selectively applies a common mode reference voltage of the successive approximation register analog-to-digital conversion unit to a common connection node of the 5a switch and the 5b switch;
a sixth switch that selectively connects the third node and a first input end of the successive approximation register analog-to-digital conversion unit; and
a seventh switch that selectively connects the fourth node and a second input end of the successive approximation register analog-to-digital conversion unit.

[A-19] The imaging device according to [A-18] described above, in which
the 4a switch and the 4b switch are temporarily put into a closed state immediately before the capacitance unit starts holding the pixel signal, immediately before a period in which the pixel signal held by the capacitance unit is transferred to the successive approximation register analog-to-digital conversion unit, and the transferring period, and short-circuit the first node and the second node,
the 4c switch is temporarily put into a closed state immediately before the capacitance unit starts holding the pixel signal and immediately before a period in which the pixel signal held by the capacitance unit is transferred to the successive approximation register analog-to-digital conversion unit, and applies the reference voltage to the common connection node of the 4a switch and the 4b switch,
the 5a switch and the 5b switch are temporarily put into a closed state immediately before the capacitance unit starts holding the pixel signal and in a period in which the capacitance unit holds the pixel signal, and short-circuit the third node and the fourth node, and
the 5c switch is temporarily put into a closed state immediately before the capacitance unit starts holding the pixel signal, and applies the common mode reference voltage of the successive approximation register analog-to-digital conversion unit to the common connection node of the 5a switch and the 5b switch.

<<B. Electronic Device>>

[B-01] An electronic device provided with:
an imaging device that outputs a photoelectrically converted digital signal; and a signal processing unit that performs signal processing on the basis of the digital signal, in which
the imaging device is provided with:
a pixel array unit including a plurality of pixels each including a photoelectric conversion element;
a column amplifier unit that obtains a difference between a reset component and a signal component input from each pixel of the pixel array unit via a signal line, and outputs the difference as a pixel signal;
a capacitance unit that holds the pixel signal input from the column amplifier unit; and
a successive approximation register analog-to-digital conversion unit that converts an analog signal input from the capacitance unit into a digital signal, and
the capacitance unit differentiates a single-phase pixel signal input from the column amplifier unit using a reference voltage that defines a zero voltage of the pixel signal.

[B-02] The electronic device according to [B-01] described above, in which
the column amplifier unit includes:
an amplifier to a non-inverting input terminal of which a potential of the signal line is input;
a first switch one end of which is connected to an output terminal of the amplifier and another end of which is connected to an inverting input terminal of the amplifier;
a second switch one end of which is connected to the output terminal of the amplifier;
a first capacitance element one end of which is connected to another end of the second switch and another end of which is connected to the another end of the first switch and the inverting input terminal of the amplifier;
a second capacitance element connected between the another end of the first capacitance element and the inverting input terminal of the amplifier, and a reference potential node; and
a third switch one end of which is connected to the another end of the second switch and one end of the first capacitance element, the third switch to another end of which the reference voltage is applied.

[B-03] The electronic device according [B-02] described above, in which
the column amplifier unit
puts the first switch into a closed state and charges the first capacitance element and the second capacitance element with the reset component when the reset component is input, and puts the third switch into a closed state and applies the reference voltage to the another end of the second switch and the one end of the first capacitance element,
then, puts the first switch and the third switch into an opened state and puts the second switch into a closed state, and forms a non-inverting amplification circuit using the first capacitance element, the second capacitance element, and the amplifier, and
feeds back so that a voltage of a common connection node of the first capacitance element and the second capacitance element becomes a same voltage as the signal component when the signal component is input.

[B-04] The electronic device according to [B-02] or [B-03] described above, in which
the capacitance unit
has a configuration of a differential circuit including a positive-side capacitance element charged with the pixel signal input from the column amplifier unit, and a negative-side capacitance element charged with the reference voltage, and
includes a fourth switch that selectively short-circuits input ends of the positive-side capacitance element and the negative-side capacitance element.

[B-05] The electronic device according to [B-04] described above, in which
the fourth switch short-circuits the input ends of the positive-side capacitance element and the negative-side capacitance element when the pixel signal with which the positive-side capacitance element is charged and the reference voltage with which the negative-side capacitance element is charged are transmitted to the successive approximation register analog-to-digital conversion unit.

[B-06] The electronic device according to [B-05] described above, in which
the capacitance unit holds the pixel signal input from the column amplifier unit by sampling by a switched capacitor.

[B-07] The electronic device according to any one of [B-01] to [B-06] described above, that
multiplexes and processes each potential of a plurality of signal lines via a plurality of the column amplifier units and the capacitance units corresponding to the plurality of signal lines for one successive approximation register analog-to-digital converter of the successive approximation register analog-to-digital conversion unit.

REFERENCE SIGNS LIST

10 CMOS image sensor
11 Pixel array unit
12 Row selection unit
13 Constant current source unit
14 Column amplifier unit
15 Analog-to-digital conversion unit
15A Successive approximation register analog-to-digital conversion unit
16 Horizontal transfer scanning unit
17 Signal processing unit
18 Timing control unit
19 Capacitance unit
20 Pixel (pixel circuit)
21 Photodiode (photoelectric conversion element)
22 Transfer transistor
23 Reset transistor
24 Amplification transistor
25 Selection transistor
31 ($31_1$ to $31_m$) Pixel control line
32 ($32_1$ to $32_n$) Signal line
50 Indirect TOF distance image sensor
60 Light source
100 Imaging system
140 Column amplifier
150 Successive approximation register analog-to-digital converter
160 Reference voltage generation unit
190 Capacitance demultiplexer
1400 Current reuse column amplifier (CRCA)
VR Reference voltage
$V_{CM}$ Output common mode reference voltage

The invention claimed is:

1. An imaging device comprising:
   a pixel array unit including a plurality of pixels each including a photoelectric conversion element;
   a column amplifier unit that obtains a difference between a reset component and a signal component input from each pixel of the pixel array unit via a signal line, and outputs the difference as a pixel signal;
   a capacitance unit that holds the pixel signal input from the column amplifier unit; and
   a successive approximation register analog-to-digital conversion unit that converts an analog pixel signal input from the capacitance unit into a digital signal, wherein
   the capacitance unit differentiates a single-phase pixel signal input from the column amplifier unit using a reference voltage that defines a zero voltage of the pixel signal.

2. The imaging device according to claim 1, wherein the column amplifier unit includes:
   an amplifier to a non-inverting input terminal of which a potential of the signal line is input;
   a first switch that includes:
   a first end connected to an output terminal of the amplifier, and
   a second end connected to an inverting input terminal of the amplifier;
   a second switch that includes:
   a first end connected to the output terminal of the amplifier, and
   a second end;
   a first capacitance element that includes:
   a first end connected to the second end of the second switch, and
   a second end connected to the second end of the first switch and the inverting input terminal of the amplifier;
   a second capacitance element connected between the second end of the first capacitance element and the inverting input terminal of the amplifier, and a reference potential node; and
   a third switch that includes:
   a first end connected to the second end of the second switch and the first end of the first capacitance element, and
   a second end connected the reference voltage.

3. The imaging device according to claim 2, wherein the column amplifier unit is further configured to:
   put the first switch in a closed state and charge the first capacitance element and the second capacitance element with the reset component based on determination that the reset component is input,
   put the third switch in the closed state and apply the reference voltage to the second end of the second switch and the first end of the first capacitance element,
   put the first switch and the third switch in an opened state,
   put the second switch in the closed state and form a non-inverting amplification circuit by each of the first capacitance element, the second capacitance element, and the amplifier, and
   feed back, based on determination that the signal component is input, so that a voltage of a common connection node of the first capacitance element and the second capacitance element becomes same as the signal component.

4. The imaging device according to claim 2, wherein the capacitance unit includes:
   a configuration of a differential circuit that includes:
   a positive-side capacitance element charged with the pixel signal input from the column amplifier unit, and
   a negative-side capacitance element charged with the reference voltage, and
   a fourth switch configured to selectively short-circuit input ends of the positive-side capacitance element and the negative-side capacitance element.

5. The imaging device according to claim 4, wherein
   the fourth switch is further configured to short-circuit the input ends of the positive-side capacitance element and the negative-side capacitance element based on transmission of the pixel signal with which the positive-side capacitance element is charged and the reference voltage with which the negative-side capacitance element is charged to the successive approximation register analog-to-digital conversion unit.

6. The imaging device according to claim 5, wherein
   the capacitance unit is further configured to hold, based on sampling by a switched capacitor, the pixel signal input from the column amplifier unit.

7. The imaging device according to claim 1, wherein the imaging device is configured to:
   Multiplex and process each potential of a plurality of signal lines via a plurality of the column amplifier unit and the capacitance unit corresponding to the plurality of signal lines for one successive approximation register analog-to-digital converter of the successive approximation register analog-to-digital conversion unit.

8. The imaging device according to claim 2, wherein the capacitance unit includes:
   a first node to which the pixel signal input from the column amplifier unit is supplied;
   a second node to which the reference voltage is supplied;
   a positive-side capacitance element and a negative-side capacitance element connected in series between the first node and the second node;
   a fourth switch configured to selectively short-circuit the first node and the second node;
   a fifth switch configured to selectively apply a common mode reference voltage of the successive approximation register analog-to-digital conversion unit to a common connection node of the positive-side capacitance element and the negative-side capacitance element;
   a sixth switch configured to selectively connect the second node and a first input end of the successive approximation register analog-to-digital conversion unit; and
   a seventh switch configured to selectively connect the first node and a second input end of the successive approximation register analog-to-digital conversion unit.

9. The imaging device according to claim 8, wherein
   the fourth switch is temporarily put in a closed state immediately before the capacitance unit starts to hold the pixel signal,
   the fourth switch is further configured to short-circuit input ends of the positive-side capacitance element and the negative-side capacitance element, and
   the fifth switch is temporarily put in the closed state immediately before the capacitance unit starts to hold the pixel signal and in a period in which the pixel signal held by the capacitance unit is transferred to the successive approximation register analog-to-digital conversion unit, and the fifth switch is further configured to apply the common mode reference voltage of the successive approximation register analog-to-digital conversion unit to the common connection node of the positive-side capacitance element and the negative-side capacitance element.

10. The imaging device according to claim 2, wherein the capacitance unit includes:
a first node to which the pixel signal input from the column amplifier unit is supplied;
a second node to which the reference voltage is supplied;
a positive-side capacitance element and a negative-side capacitance element connectable in series between the first node and the second node;
a 4a switch and a 4b switch connected in series between the first node and the second node;
a 5a switch, the positive-side capacitance element, the negative-side capacitance element, and a 5b switch connected in series between the first node and the second node;
a 5c switch configured to selectively apply a common mode reference voltage of the successive approximation register analog-to-digital conversion unit to a common connection node of the positive-side capacitance element and the negative-side capacitance element;
a sixth switch configured to selectively connect the second node and a first input end of the successive approximation register analog-to-digital conversion unit; and
a seventh switch configured to selectively connect the first node and a second input end of the successive approximation register analog-to-digital conversion unit.

11. The imaging device according to claim 10, wherein
the 4a switch and the 4b switch are temporarily put in a closed state immediately before the capacitance unit starts to hold the pixel signal and immediately before the pixel signal held by the capacitance unit is transferred to the successive approximation register analog-to-digital conversion unit,
the 4a switch and the 4b switch are configured to apply the common mode reference voltage of the successive approximation register analog-to-digital conversion unit to the first node and the second node,
the 5a switch and the 5b switch are temporarily put in an opened state immediately before the pixel signal held by the capacitance unit is transferred to the successive approximation register analog-to-digital conversion unit,
the 5a switch and the 5b switch are configured to block the connection between the first node and the positive-side capacitance element and block the connection between the second node and the negative-side capacitance element,
the 5c switch is temporarily put in the closed state immediately before the capacitance unit starts to hold the pixel signal and in a period in which the pixel signal held by the capacitance unit is transferred to the successive approximation register analog-to-digital conversion unit, and
the 5c switch is configured to apply the common mode reference voltage of the successive approximation register analog-to-digital conversion unit to the common connection node of the positive-side capacitance element and the negative-side capacitance element.

12. The imaging device according to claim 2, wherein the capacitance unit includes:
a first node to which the pixel signal input from the column amplifier unit is supplied;
a second node to which the reference voltage is supplied;
a 4a switch and a 4b switch connected in series between the first node and the second node;
a positive-side capacitance element, a 5a switch, a 5b switch, and a negative-side capacitance element connected in series between the first node and the second node;
a 5c switch configured to selectively apply a common mode reference voltage of the successive approximation register analog-to-digital conversion unit to a common connection node of the 5a switch and the 5b switch;
a sixth switch configured to selectively connect the second node and a first input end of the successive approximation register analog-to-digital conversion unit; and
a seventh switch configured to selectively connect the first node and a second input end of the successive approximation register analog-to-digital conversion unit.

13. The imaging device according to claim 12, wherein
the 4a switch and the 4b switch are temporarily put in a closed state immediately before the capacitance unit starts to hold the pixel signal and immediately before the pixel signal held by the capacitance unit is transferred to the successive approximation register analog-to-digital conversion unit,
the 4a switch and the 4b switch are configured to apply the common mode reference voltage of the successive approximation register analog-to-digital conversion unit to the first node and the second node,
the 5c switch is temporarily put in the closed state immediately before the capacitance unit starts to hold the pixel signal and in a period in which the pixel signal held by the capacitance unit is transferred to the successive approximation register analog-to-digital conversion unit,
the 5c switch is configured to apply the common mode reference voltage of the successive approximation register analog-to-digital conversion unit to a common connection node of the positive-side capacitance element and the negative-side capacitance element,
the 5a switch and the 5b switch are temporarily put in an opened state immediately before the pixel signal held by the capacitance unit is transferred to the successive approximation register analog-to-digital conversion unit, and
the 5a switch and the 5b switch are configured to block the connection between the positive-side capacitance element and the negative-side capacitance element.

14. The imaging device according to claim 2, wherein the capacitance unit includes:
a first node to which the pixel signal input from the column amplifier unit is supplied;
a second node to which the reference voltage is supplied;
a positive-side capacitance element that includes a first end connected to the first node;
a third node connected to a second end of the positive-side capacitance element;
a negative-side capacitance element that includes a first end connected to the second node;
a fourth node connected to a second end of the negative-side capacitance element;

a 4a switch and a 4b switch connected in series between the first node and the second node;
a 4c switch connected between the first node and the second node;
a 5a switch connected between the third node and the fourth node;
a 5b switch and a 5c switch connected in series between the third node and the fourth node;
a sixth switch configured to selectively connect the third node and a first input end of the successive approximation register analog-to-digital conversion unit; and
a seventh switch configured to selectively connect the fourth node and a second input end of the successive approximation register analog-to-digital conversion unit.

15. The imaging device according to claim 14, wherein
the 4a switch and the 4b switch are temporarily put in a closed state in a period in which the pixel signal held by the capacitance unit is transferred to the successive approximation register analog-to-digital conversion unit,
the 4a switch and the 4b switch are configured to apply a common mode reference voltage of the successive approximation register analog-to-digital conversion unit to the first node and the second node,
the 4c switch is put in the closed state immediately before the capacitance unit starts to hold the pixel signal,
the 4c switch is configured to short-circuit the first node and the second node,
the 5a switch is configured to short-circuit the third node and the fourth node in a period in which the capacitance unit holds the pixel signal, and
the 5b switch and the 5c switch are put in the closed state immediately before the capacitance unit starts to hold the pixel signal, and
the 5b switch and the 5c switch are configured to apply the reference voltage to the third node and the fourth node.

16. The imaging device according to claim 2, wherein
the capacitance unit includes:
a first node to which the pixel signal input from the column amplifier unit is supplied;
a second node to which the reference voltage is supplied;
a positive-side capacitance element that includes a first end connected to the first node;
a third node connected to a second end of the positive-side capacitance element;
a negative-side capacitance element that includes a first end connected to the second node;
a fourth node connected to a second end of the negative-side capacitance element;
a fourth switch connected between the first node and the second node;
a 5a switch and a 5b switch connected in series between the third node and the fourth node;
a 5c switch configured to selectively apply a common mode reference voltage of the successive approximation register analog-to-digital conversion unit to a common connection node of the 5a switch and the 5b switch;
a sixth switch configured to selectively connect the third node and a first input end of the successive approximation register analog-to-digital conversion unit; and
a seventh switch configured to selectively connect the fourth node and a second input end of the successive approximation register analog-to-digital conversion unit.

17. The imaging device according to claim 16, wherein
the fourth switch is put in a closed state immediately before the capacitance unit starts to hold the pixel signal and in a period in which the pixel signal held by the capacitance unit is transferred to the successive approximation register analog-to-digital conversion unit;
the fourth switch is configured to short-circuit the first node and the second node,
the 5a switch and the 5b switch are put in the closed state immediately before a period in which the capacitance unit holds the pixel signal until a holding period ends;
the 5a switch and the 5b switch are configured to short-circuit the third node and the fourth node;
the 5c switch is put in the closed state immediately before the capacitance unit starts to hold the pixel signal; and
the 5c swItch is configured to selectively apply the common mode reference voltage of the successive approximation register analog-to-digital conversion unit to the common connection node of the 5a switch and the 5b switch.

18. The imaging device according to claim 2, wherein
the capacitance unit includes:
a first node to which the pixel signal input from the column amplifier unit is supplied;
a second node to which the reference voltage is supplied;
a positive-side capacitance element that includes a first end connected to the first node;
a third node connected to a second end of the positive-side capacitance element;
a negative-side capacitance element that includes end connected to the second node;
a fourth node connected to a second end of the negative-side capacitance element;
a 4a switch and a 4b switch connected in series between the first node and the second node;
a 4c switch configured to selectively apply the reference voltage to a common connection node of the 4a switch and the 4b switch;
a 5a switch and a 5b switch connected in series between the third node and the fourth node;
a 5c switch configured to selectively apply a common mode reference voltage of the successive approximation register analog-to-digital conversion unit to a common connection node of the 5a switch and the 5b switch;
a sixth switch configured to selectively connect the third node and a first input end of the successive approximation register analog-to-digital conversion unit; and
a seventh switch configured to selectively connect the fourth node and a second input end of the successive approximation register analog-to-digital conversion unit.

19. The imaging device according to claim 18, wherein
the 4a switch and the 4b switch are temporarily put in a closed state immediately before the capacitance unit starts to hold the pixel signal, immediately before a period in which the pixel signal held by the capacitance unit is transferred to the successive approximation register analog-to-digital conversion unit, and a transferring period,
the 4a switch and the 4b switch are configured to short-circuit the first node and the second node,
the 4c switch is temporarily put in the closed state immediately before the capacitance unit starts holding the pixel signal and immediately before a period in which the pixel signal held by the capacitance unit is transferred to the successive approximation register analog-to-digital conversion unit, the 4c switch is configured to apply the reference voltage to the common connection node of the 4a switch and the 4b switch, the 5a switch and the 5b switch are temporarily put in the closed state immediately before the capacitance unit starts to hold the pixel signal and in a period in which the capacitance unit holds the pixel signal, the 5a switch and the 5b switch are configured to short-circuit the third node and the fourth node, the 5c switch is temporarily put in the closed state immediately before the capacitance unit starts to hold the pixel signal, and the 5c switch is configured to apply the common mode reference voltage of the successive approximation register analog-to-digital conversion unit to the common connection node of the 5a switch and the 5b switch.

20. An electronic device comprising:

an imaging device that outputs a photoelectrically converted digital signal; and a signal processing unit that performs signal processing on a basis of the digital signal, wherein the imaging device is provided with:

a pixel array unit including a plurality of pixels each including a photoelectric conversion element;

a column amplifier unit that obtains a difference between a reset component and a signal component input from each pixel of the pixel array unit via a signal line, and outputs the difference as a pixel signal;

a capacitance unit that holds the pixel signal input from the column amplifier unit; and a successive approximation register analog-to-digital conversion unit that converts an analog signal input from the capacitance unit into a digital signal, and the capacitance unit differentiates a single-phase pixel signal input from the column amplifier unit using a reference voltage that defines a zero voltage of the pixel signal.

* * * * *